(12) United States Patent
van Schuppen et al.

(10) Patent No.: US 11,398,830 B2
(45) Date of Patent: Jul. 26, 2022

(54) METHODS FOR COMPRESSION OF MULTIVARIATE CORRELATED DATA FOR MULTI-CHANNEL COMMUNICATION

(71) Applicants: UNIVERSITY OF CYPRUS, Nicosia (CY); Van Schuppen Control Research, Amsterdam (NL)

(72) Inventors: Jan H. van Schuppen, Amsterdam (NL); Charalambos D. Charalambous, Nicosia (CY)

(73) Assignees: UNIVERSITY OF CYPRUS, Nicosia (CY); VAN SCHUPPEN CONTROL RESEARCH, Amsterdam (NL)

( * ) Notice: Subject to any disclaimer, the term of this patent is extended or adjusted under 35 U.S.C. 154(b) by 739 days.

(21) Appl. No.: 16/396,300

(22) Filed: Apr. 26, 2019

(65) Prior Publication Data

US 2019/0334547 A1 Oct. 31, 2019

Related U.S. Application Data

(60) Provisional application No. 62/663,715, filed on Apr. 27, 2018.

(51) Int. Cl.
| | |
|---|---|
| H03M 7/00 | (2006.01) |
| H03M 7/30 | (2006.01) |
| G06F 17/16 | (2006.01) |
| H03M 7/32 | (2006.01) |
| H03M 7/40 | (2006.01) |

(52) U.S. Cl.
CPC .......... *H03M 7/3059* (2013.01); *G06F 17/16* (2013.01); *H03M 7/3011* (2013.01);
(Continued)

(58) Field of Classification Search
CPC ........ H03M 7/30; H03M 7/40; H03M 7/3059; H03M 7/4006; H03M 7/6005;
(Continued)

(56) References Cited

U.S. PATENT DOCUMENTS 4,963,030 A * 10/1990 Makur ................... G06T 9/008
375/240
5,867,602 A * 2/1999 Zandi .................... G06F 17/148
375/E7.064

(Continued)

OTHER PUBLICATIONS

Benammar et al., Secure lossy helper and gray-wyner problems, 2016 IEEE International Symposium on Information Theory, pp. 2454-2458 (Jul. 2016).

(Continued)

*Primary Examiner* — Linh V Nguyen
(74) *Attorney, Agent, or Firm* — Marshall, Gerstein & Borun LLP

(57) ABSTRACT

Methods are provided for efficiently encoding and decoding multivariate correlated data sequences for transmission over multiple channels of a network. The methods include transforming data vectors from correlated sources into vectors that comprise substantially independent and correlated components, and generating a common information vector based on the correlated components, and two private information vectors. The methods also include computing the amount of information, such as Wyner's lossy common information, in the common information vector, computing rates that lie on the Gray-Wyner rate region, and choosing compression rates based on the amount of common information. The methods may be applicable, in general, to a wide range of communications and/or storage systems and, particularly, to sensor networks and multi-user virtual environments for gaming and other applications.

28 Claims, 2 Drawing Sheets

(52) U.S. Cl.
CPC ....... *H03M 7/3082* (2013.01); *H03M 7/4093* (2013.01); *H03M 7/70* (2013.01)

(58) Field of Classification Search
CPC ........... H03M 13/6312; H03M 7/3079; H03M 7/3082; H03M 7/70; H03M 13/1102; H03M 13/1194; H03M 13/23; H03M 13/27; H03M 13/29; H03M 13/2957; H03M 7/3066; H03M 7/3075; H03M 7/3088; H03M 7/4018; H03M 7/4043; H03M 7/4062; H03M 7/4093; H03M 7/46; H03M 7/6011; H03M 7/6017; H03M 7/6023; H03M 7/607; G06F 21/6209; G06F 17/18; G06F 11/10; G06F 11/1012; G06F 11/1048; G06F 12/0638; G06F 21/32; G06F 17/16; G06F 21/335; G06F 21/34
USPC ............................. 341/51, 56, 60, 106, 107
See application file for complete search history.

(56) References Cited

U.S. PATENT DOCUMENTS

| | | | | |
|---|---|---|---|---|
| 6,516,297 B1* | 2/2003 | Servetto | ............. | H03M 7/3082 704/E19.017 |
| 6,829,301 B1* | 12/2004 | Tinker | ................. | H04N 19/103 375/E7.081 |
| 7,206,457 B2* | 4/2007 | Lee | ...................... | H04N 19/126 375/E7.199 |
| 7,230,550 B1* | 6/2007 | Mittal | ................... | H03M 13/27 341/55 |
| 7,414,549 B1 | 8/2008 | Yang et al. | | |
| 8,429,111 B1* | 4/2013 | Kailash | ................... | H03M 7/40 706/46 |
| 9,100,053 B2* | 8/2015 | Klejsa | ..................... | H03M 7/40 |
| 2006/0200724 A1 | 9/2006 | Stankovic et al. | | |
| 2014/0210652 A1* | 7/2014 | Bartnik | ................... | H03M 7/40 341/67 |
| 2016/0094241 A1* | 3/2016 | Rubanovich | ........ | G06F 9/30036 712/7 |
| 2020/0007151 A1* | 1/2020 | Fenney | ................ | H04N 19/119 |
| 2020/0128307 A1* | 4/2020 | Li | ........................ | H04N 19/119 |

OTHER PUBLICATIONS

European Patent Application No. 19171282.7, Extended European Search Report, dated Jul. 30, 2019.
Gray et al., Source coding for a simple network, Bell System Technical Journal AT&T, 53(9):1681-721 (Nov. 1974).
Wang et al., Vector Gaussian Two-Terminal Source Coding, IEEE Trans Information Theory, 59(6):3693-708 (Jun. 2013).

\* cited by examiner

METHODS FOR COMPRESSION OF MULTIVARIATE CORRELATED DATA FOR MULTI-CHANNEL COMMUNICATION

FIELD OF THE DISCLOSURE

The disclosure generally relates to methods of compressively encoding multiple correlated data vectors for efficient transmission over a plurality of network channels, and to general information transmission over networks. The methods are also applicable to information transmission over noisy channels, such as multiple access channels, interference channels, and/or broadcast channels, that use private and common information.

BACKGROUND

The main goal of telecommunication and information systems is to reproduce sent or stored information reliably, either approximately or with required fidelity, and with efficient use of system resources. The information is represented by signals and system resources may include the energy that is put into a signal, as well as the bandwidth or storage space that is used by the signal. Converting information into digital form, or bits, allows flexible application of many computing and signal processing techniques to make the systems as efficient as possible, approaching mathematically derived theoretical limits in some applications. Coding techniques have been developed to allow an efficient transfer of digital information by removing redundancy in a source of information and then, if necessary, adding encoding redundancy (e.g., a checksum) to enable detection or correction of occasional bit errors. A variety of modulation techniques can be used in systems to convert encoded digital information into continuous signals that can be communicated over a variety of physical channels using radio waves, optical techniques, magnetic domains, etc. On the receiving end, demodulation, followed by decoding recovers the information.

Current telecommunication and information technology systems are designed based on Shannon's operational definitions of coding capacity, which define the maximum rate for reliable communication by channel encoders and decoders over noisy channels, and coding compression, which defines the minimum compression rate of source encoders and decoders. Generally, channel encoders and decoders are utilized to combat communication noise, and source encoders and decoders are utilized to remove redundancy in data. In a typical wired or wireless data transmission system, a source encoder is used to efficiently compress the data to be transmitted. Subsequently, a channel encoder receives the compressed data and adds redundancy to protect the data against the noise of the channel. The receiver located at the other end of the channel, upon receiving the encoded data, applies the inverse operations that consist of a channel decoder (inverse of channel encoder) and a source decoder (inverse of source encoder). The original data can be made available to the user with an arbitrarily small probability of error or loss. To use the channel resources efficiently, however, the goal of so-called lossy coding techniques can reconstruct a close approximation of the original data, subject to a distortion or fidelity criterion. Lossy coding techniques have enabled gains in the capacities of point-to-point or broadcasting systems that routinely deliver, for example, high quality digital audio and video to users.

When encoding and reproducing information from correlated sources, there is a need for techniques that enable efficient communication of information from the multiple correlated sources and over multiple channels. Such techniques are applicable in many technical fields, such as, for example, the internet of things (IoT) and/or sensor networks, multiplayer games, and virtual collaborative environments that generate multiple correlated perspectives on computer-generated data. Accordingly, there is a need for efficiently encoding and communicating information from correlated sources over multi-channel networks.

SUMMARY

A computer-implemented method is used to compressively encode two correlated data vectors. In one aspect, the method comprises obtaining a first data vector and a second data vector. The method also comprises transforming the first data vector into a first canonical vector, wherein the first canonical vector includes a first component indicative of information in the first data vector and information in the second data vector, and a second component indicative of information in the first data vector and substantially exclusive of information in the second data vector. Similarly, the method comprises transforming the second data vector into a second canonical vector, wherein the second canonical vector includes a first component, indicative of information in the first data vector and information in the second data vector, and a second component, indicative of information in the second data vector and substantially exclusive of information in the first data vector. The method also comprises generating a common information vector based on the first component of the first canonical vector and the first component of the second canonical vector. Similarly, the method comprises generating a first private vector based on the first canonical vector and the common information vector, and a second private vector based on the second canonical vector and the common information vector. The method also comprises compressing the first private vector at a first private rate to generate a first digital message and compressing the second private vector at a second private rate to generate a second digital message. The method comprises computing an amount of common information contained in the common information vector, and, based on the amount of common information, computing a third rate. The method also comprises compressing the common information vector at the third rate to generate a third digital message. The method comprises routing the first digital message via a first channel, the second digital message via a second channel and the third digital message via a third channel.

In another aspect, a non-transitory computer-readable medium stores instructions for compressively encoding two correlated data vectors, wherein the instructions, when executed by one or more processors of a computing system, cause the one or more processors to obtain a first data vector and a second data vector. The instructions also cause the one or more processors to transform the first data vector into a first canonical vector, wherein the first canonical vector includes a first component indicative of information in the first data vector and information in the second data vector, and a second component indicative of information in the first data vector and substantially exclusive of information in the second data vector. Similarly, the instructions cause the one or more processors to transform the second data vector into a second canonical vector, wherein the second canonical vector includes a first component, indicative of information in the first data vector and information in the second data vector, and a second component, indicative of information in the second data vector and substantially exclusive of information in the first data vector. The instructions also cause the one or more processors to generate a common information vector based on the first component of the first canonical vector and the first component of the second canonical vector. Also, the instructions cause the one or more processors to generate a first private vector based on the first canonical vector and the common information vector, and a second private vector based on the second canonical vector and the common information vector. The instructions also cause the one or more processors to compress the first private vector at a first private rate to generate a first digital message and to compress the second private vector at a second private rate to generate a second digital message. The instructions cause the one or more processors to compute an amount of common information contained in the common information vector, and, based on the amount of common information, to compute a third rate. The instructions also cause the one or more processors to compress the common information vector at the third rate to generate a third digital message. The instructions cause the one or more processors to route the first digital message via a first channel, the second digital message via a second channel and the third digital message via a third channel.

DETAILED DESCRIPTION

Figure 1:
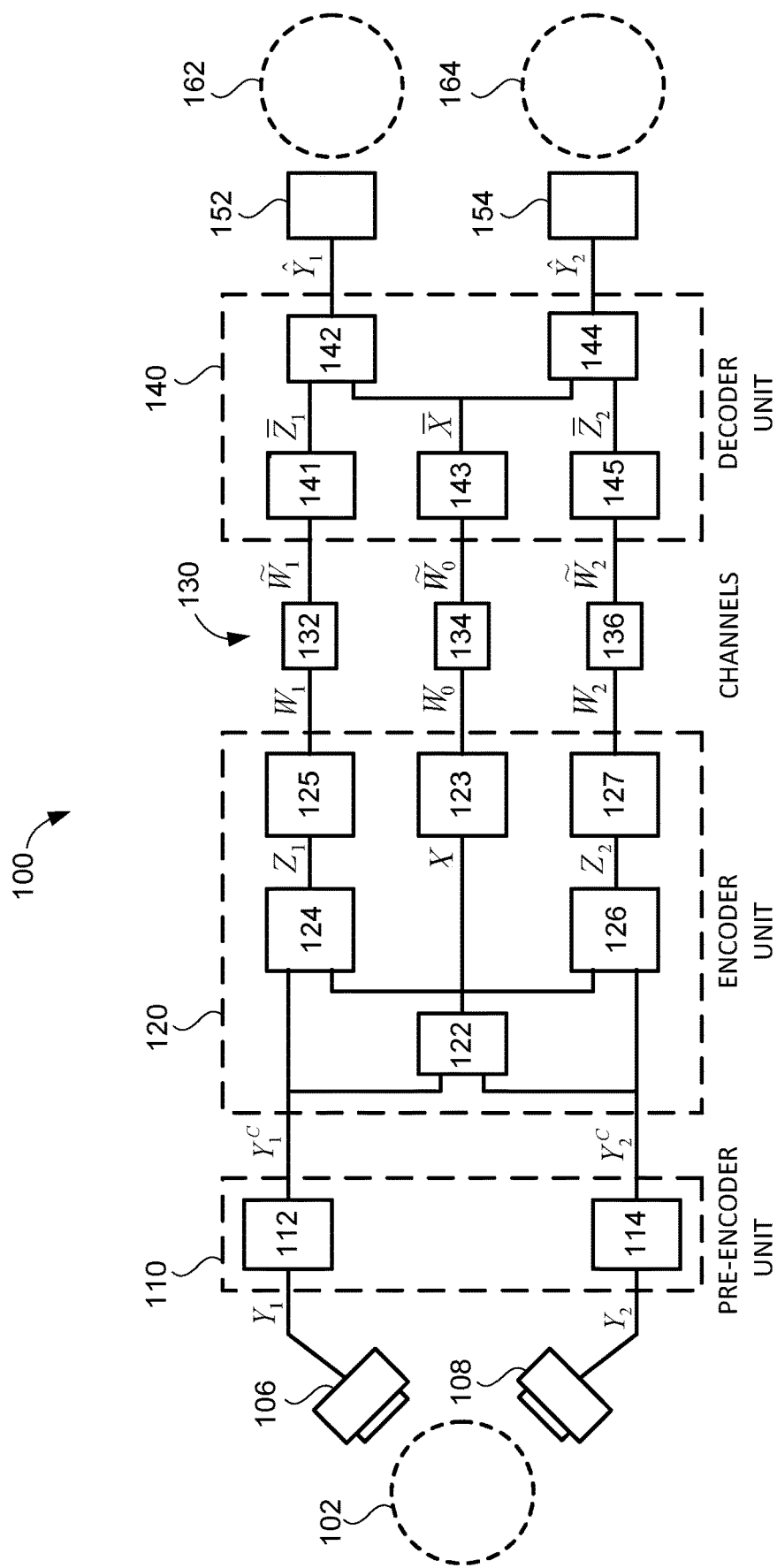
FIG. 1 is a schematic representation of an exemplary communication network for communicating two correlated data vectors.

FIG. 1 is a schematic representation of an exemplary communication network 100 for communicating two correlated data vectors indicative of, for example, an exemplary object 102. The object 102 may represent a scene or other observable phenomenon in a real or virtual environment. A sensor 106 and a sensor 108 may be configured to generate analog or digital signal representations of the object 102 to serve as inputs into the network 100. The sensors 106, 108 may be audio transducers, video cameras, chemical sensors and/or any other suitable sensors capable of observing the real or virtual phenomenon. The sensors 106, 108 may be array sensors configure to simultaneously generate the data vectors including multiple values. Additionally or alternatively, the sensors 106, 108 may be configured to generate the data vectors as data sequences of observed values. The sensors 106 and 108 may be identical sensors, such as, for example, two of the same model of camera, or they may be different from each other, such as cameras with different resolutions or sensing different spectral regions. The sensors 106, 108 may also be referred to herein as "transducers," "input devices," "signal generators," "signal sources," or, simply, "sources."

The sensors 106, 108 may be communicatively connected to a pre-encoder unit 110 comprising two corresponding pre-encoders 112, 114. The pre-encoder 112 may be in communicative connection with the sensor 106 to pre-encode data vectors generated by the sensor 106, and the pre-encoder 114 may be in communicative connection with the second sensor 108 to pre-encode data vectors generated by the sensor 108. While FIG. 1 illustrates the pre-encoders 112, 114 as separate components, in some implementations, a single pre-encoder is in communicative connection with both of the sensors 106, 108 and configured to pre-encode data vectors generated by both of the sensors 106,108. Additional data processing elements (not shown) may intercede between the sensors 106, 108 and the pre-encoders 112, 114, for example, amplifiers, signal conditioners, analog-to-digital (A/D) converters, and/or other suitable signal processing elements that suitably transform signals from the sensors 106, 108 for improved processing by the pre-encoders 112, 114.

The pre-encoder unit 110 may be in communicative connection with an encoder unit 120 that comprises a common information encoder 122 (or, simply, common encoder 122) and two private encoders 124, 126. More particularly, the common encoder 122 may be coupled to receive the output of each of the pre-encoders 112, 114 and configured to determine a set of common information between the data vectors generated by the sensors 106,108. As illustrated, an output of the common encoder 122 (X) is coupled to a common information compressor 123 and the outputs of the private encoders 124, 126 are coupled to respective compressors 125, 127. The output of the common encoder 122 may also be coupled to the two private encoders 124, 126. Each of the private encoders 124, 126 may be configured to combine the common information encoded by the common encoder 122 and the respective outputs of the pre-encoders 112, 114 ($Y_1$ and $Y_2$) to produce a respective private signals $Z_1$ and $Z_2$. Accordingly, as illustrated, the common compressor 123 is configured to compress the common information X to produce a compressed signal $W_0$, the private compressor 125 is configured to compress the private signal $Z_1$ to produce a compressed signal $W_1$, and the private compressor 127 is configured to compress the private signal $Z_2$ to produce a compressed signal $W_2$.

Three channels 132, 134, 136 may form part of a communicative path between the encoder unit 120 and a decoder unit 140. For convenience, the channels 132, 134, 136 may be collectively referred to as the channels 130. The channels 130 may include the physical medium between the encoder unit 120 and the decoder unit 140, a variety of components (e.g., modulators, demodulators, filters, switches, amplifiers, antennas) configured to implement the logic of signal transmission between the encoder unit 120 and the decoder unit 140, as well as any units of the system that implement the logic of transmission. For example, the channels 130 may comprise a variety of cables such as twisted pair, coaxial, fiber-optic or other suitable cables. Additionally or alternatively, the channels 130 may comprise substantially free-space media such as vacuum, air, water, ground, or other suitable media. In some embodiments, the channels 130 may, additionally or alternatively, include storage media that may hold the signals for a certain time duration. The channels 130 may be configured to support any known modulation schemes and protocols, including time-division multiplexing, frequency-division multiplexing, code-division multiplexing, and/or, more specifically, Ethernet, WiFi, Bluetooth, or any other suitable protocol. The channels may include modulation, demodulation, losses, amplification, dispersion, dispersion compensation, interference, cross-talk and other signal transformations.

The encoder unit 120 may be configured to communicate with the decoder unit 140 via the channels 130. More particularly, the decoder unit 140 may include a common decompressor 143 configured to decompress the signal produced by the common compressor 123 as received over the channel 134 (also referred to as "the common channel" or "the public channel") and private decompressors 141, 145 configured to decompress the signals respectively produced by the private compressors 125, 127, as received over the channels 132, 136 (also referred to as "the private channels"). It should be noted that channels 130 may introduce noise or other distortions into the signals produced by the encoder unit 120. For example, the common information signal $W_0$ produced by the common compressor 123 may not match the common information signal $\hat{W}_0$ received at the decoder unit 140 after traversing the channel 134.

As illustrated, the decoder unit 140 includes decoders 142, 144 configured to produce the signals encoded by the encoder unit 120. Accordingly, the decoder 142 is configured to combine the outputs of the common decompressor 143 and the private decompressor 141 to produce a decoded signal $\hat{Y}_1$. Similarly, the decoder 144 is configured to combine the outputs of the common decompressor 143 and the private decompressor 144 to produce a decoded signal $\hat{Y}_2$.

As illustrated, the output of decoder 142 is coupled to a first transducer 152 to produce a representation 162 of the object 102, as sensed by the sensor 106. Similarly an output of the decoder 144 is coupled to a second transducer 154 to produce a representation 164 of the object 102, as sensed by the sensor 108. Additional units (not shown) may intercede between the decoders 142, 144 and transducers 152, 154, including, for example, amplifiers, signal conditioners, digital-to-analog (D/A) converters, and/or other units that suitably transform signals such that the transducers 152, 154 may improve the respective representations 162, 164 of the object 102.

In operation, the sensor 106 generates a measurement of the object 102 to produce a data vector, $Y_1$ that is routed to the pre-encoder 112. Similarly, the sensor 108 generates a measurement of the object 102 to produce a data vector, $Y_2$ that is routed to the pre-encoder 114. The sensors 106, 108 may directly generate the data vectors when, for example, the sensors 106, 108 are digital sensor arrays. In other implementations, the signals generated by the sensors 106, 108 are transformed, for example, into a digital form by an analog-to-digital converter, prior to routing to the pre-encoders 112, 114. While FIG. 1 illustrates the sensors 106, 108 as being separate entities, in some implementations, a single sensor may generate the signals that are transformed into both data vectors $Y_1$ and $Y_2$.

The pre-encoder unit 110 may obtain the data vectors $Y_1$ and $Y_2$ from a computer memory location or from non-transitory computer storage media. While the sensors 106, 108 may generate the data by measuring real-world phenomena, the data may be partially or fully computer generated. For example, the data vectors may be two representations of a virtual object in a multiplayer gaming environment, and/or may comprise computer-generated stereo sound and/or video.

It should be appreciated that arrangement of the sensors 106, 108 observing a common scene that includes the object 102 is only one arrangement in which the sensors 106, 108 generate correlated data. In general, and regardless of their origin, the first data vector $Y_1$ and the second data vector $Y_2$ may be different size from each other (i.e., may have a different number of elements), may be generated in different ways and at different times from each other, and may differ in the type of information represented within the data. The methods described in the following discussion may apply to any two correlated data vectors.

The pre-encoder unit 110 may transform $Y_1$ into the first canonical vector, $Y_1^C$, and transform $Y_2$ into the second canonical vector, $Y_2^C$. The form of the canonical vectors may be referred to as "canonical variable form." The transformation of the data vectors into the canonical variable form may enable the encoding unit 120 (and/or the common encoder 122) to act upon particular components of the resulting canonical vectors $Y_1^C$ and $Y_2^C$, such as components that are correlated to each other, and/or components that are substantially independent from each other. The canonical variable form may define a first component that includes a set of elements of the first or second canonical vectors that is correlated (but not identical) to the other of the first or second canonical vectors. The canonical variable form may also define a second component that includes a set of elements of the first or second canonical vector that are substantially independent of the other of the first or second canonical vectors. That is, for the first canonical vector, the first component includes a set of elements that is correlated to the second canonical vector and the second component includes a set of elements that is substantially independent of the second canonical vector. Similarly, for the second canonical vector, the first component includes a set of elements that is correlated to the first canonical vector and the second component includes a set of elements that is substantially independent of the first canonical vector. Accordingly, the second component of the first canonical vector and the second component of the second canonical vector may be constructed in a such a way that the second components are substantially independent from each other. The first components of the canonical vectors may be indicative of information in the first data vector and information in the second data vector. The second components of the canonical vectors may be indicative of information in the corresponding data vectors and substantially exclusive of information in the non-corresponding data vectors.

The correlation and/or substantial independence of components of the canonical vectors $Y_1^C$ and $Y_2^C$ may be formally described in terms of statistics or probability theory. The vectors $Y_1^C$ and $Y_2^C$ may be described in terms of their probability distributions or probability density functions (PDFs), that define a probability that a value of a vector lies in a region within the possible values. The PDFs may be estimated by observing many instances of the vectors or by computing theoretical distributions from the underlying mathematical and/or physical principals involved in the formation of the signals. The data vectors, or any transformations thereof, may thus be treated as so-called random variables. When knowing a value of a vector element does not substantially alter the PDF for a value of another vector element of the same or of a different vector, the two elements may be referred to as substantially independent. A threshold for substantial independence may be chosen as percent changes in PDFs that are less than 0.01, 0.02, 0.05, 0.1, 0.2, 0.5, 1, 2, 5, 10 or any other suitable threshold. The threshold may be defined in terms of absolute values of probability or relative changes.

When, on the other hand, knowing a value of a vector element alters the PDF for a value of another vector element of the same or of a different vector, the two elements may be referred to as correlated. In practice, the change in PDF of one element due to knowledge of the value of another element may need to exceed a threshold before the elements may be considered correlated. The threshold value for correlation may be the same as the threshold for substantial independence in which changes in PDF greater or equal to the threshold implies a correlation.

With respect to FIG. 1, the sensors 106, 108 may, for example, capture image data representative of the object 102 at two different angles, with some pixels of the sensor 106 representing the same portion of the object 102 as some pixels of the sensor 108. Given that values generated by sensor pixels generally exhibit a certain PDF that may correspond to, for example, surface brightness statistics for a class of imaged objects, pixel values from the sensor 106 may predict a range of pixel values from the sensor 108 more effectively than the original (unconditional) PDF. A conditional PDF for the pixels values from the sensor 108 may be estimated, based on pixel values from the sensor 106. The conditional PDF, additionally or alternatively, may be computed from the estimation of the joint PDF for the two data vectors. For the pixels imaging the same area of the object 102, the conditional PDF may be significantly different from the original PDF; thereby implying that a correlation between the pixel values exists.

In some implementations, covariance matrices (that can also be referred to as variance matrices) are used to indicate correlation and independence among vector elements. The covariance matrix of the two canonical vectors, referred to herein as the canonical covariance (or variance) matrix, $Q_{cvf}$, may be used to determine the first component of the first canonical vector and the correlated first component of the second canonical vector. Additionally or alternatively, the covariance matrix of the two canonical vectors may indicate the second component of the first canonical vector and the independent second component of the second canonical vector. Furthermore, the transformation by the pre-encoder unit 110 may ensure that the first canonical vector elements are substantially independent from each other, and the second canonical vector elements are substantially independent from each other. Additionally or alternatively, the pre-encoder unit 110 may transform the first and second data vectors to ensure that for every element of the first canonical vector that has only one correlated element in the second canonical vector. That is, there may be a one-to-one element correspondence between the first component of the first canonical vector and the first component of the second canonical vector.

As described in more detail below, the canonical covariance matrix may be computed from the covariance matrix of the data vectors $Y_1$ and $Y_2$ when the data vectors are modeled as instances of multivariate Gaussian random variables. Gaussian random variables may effectively model a wide range of practical signals. In some implementations, where the Gaussian random variable models do not model the data vectors sufficiently well, the pre-encoder unit 110 may apply a transformation to the data vectors to improve their conformity to the Gaussian representations. The covariance matrix of the data vectors modeled as instances of Gaussian random variables may be obtained by statistical observations of the data vectors, computation from the physical and mathematical models of the data, and/or by other suitable means.

After obtaining the covariance matrix for the first data vector and the second data vector, the pre-encoder unit 110 may compute the canonical covariance matrix. Using the canonical covariance matrix, the pre-encoder unit 110 may then compute a first transformation matrix, $S_1$, for the first data vector and a second transformation matrix, $S_2$, for the second data vector. Subsequently, the pre-encoder unit 110 may compute the first canonical vector as $Y_1^C = S_1 Y_1$ and the second canonical vector as $Y_2^C = S_2 Y_2$.

The pre-encoder unit 110 may route the canonical vectors, canonical covariance matrix and/or other matrices as inputs to the encoder unit 120. In some implementations, the encoder unit 120 re-calculates the canonical covariance matrix by measuring the statistics of the canonical vectors. The encoder unit 120 may compute three vectors, X, $Z_1$, and $Z_2$ based on the components of the canonical vectors. Vectors X, $Z_1$, and $Z_2$ may be collectively referred to as "message vectors." The common encoder 122 may compute a common information vector, X, (that can also be referred to as "the common vector") based on the first component of the first canonical vector and the first component of the second canonical vector. The first private encoder may compute a first private vector, $Z_1$, (that can also be referred to as "the first private information vector") based on the first canonical vector and the common information vector, X. The second private encoder may compute a second private vector, $Z_2$, (that can also be referred to as "the second private information vector") based on the first canonical vector and the common information vector, X.

In some embodiments, the encoder unit 120 may obtain a required transmission quality for the data vectors and/or canonical vectors. The required transmission quality may be, for example, a distortion level and a distortion function for the first data vector and a distortion level and a distortion function for the second data vector. The distortion levels may refer to upper limits on average distortions computed using distortion functions of reconstructing the two data vectors, one for each data vector, when a suitably large number of data vectors are communicated through the network 100. The distortion level of the required transmission quality also may be referred to herein as "required distortion level," "maximum distortion level," or "maximum distortion." The distortion functions may refer to Euclidean distances or other norms of differences between the original and the estimated data vectors, and/or the corresponding formulas. In some implementations, the distortion levels are specified for the canonical vectors. The values generated by applying distortion functions to data and/or canonical vectors and their reconstructions and/or estimates may be referred to, simply, as "distortions." In some implementations, the encoder unit 120 generates three message bit streams, that include two private message bit streams and a common message bit stream, with the property that the two average distortions are below their corresponding distortion levels for the canonical vectors. Based on the distortion functions and the distortion levels, the encoder unit 120 may compute a rate region, using, for example, rate distortion functions, conditional rate distortion functions, and joint rate distortion functions for joint random variables, for each of the random variable models of the data vectors and/or each of the canonical vectors. Additionally or alternatively, the encoder unit 120 computes the rate region at least in part based on joint rate distortion functions for joint random variable models of the data vectors and/or canonical vectors, on the conditional rate distortion functions for the random variables modeling the canonical vectors conditioned on the common information vector, and/or on the amount of information contained in the common information vector. The amount of common information contained in the two data vectors and/or the amount of information in the common information vector may be computed, for example by the encoder unit 120, as Wyner's lossy common information for the two data vectors and/or the two canonical vectors.

To efficiently compress the three message vectors, the encoder unit 120 may compute three rates, $R_0$, $R_1$, $R_2$, that respectively represent a number of bits in digital messages encoding each of the corresponding message vectors, X, $Z_1$, and $Z_2$. For convenience, rate $R_1$ for the first private message vector may be referred to as the first private rate or, shorter, the first rate, rate $R_2$ for the second private message vector may be referred to as the second private rate or, shorter, the third rate, and rate $R_0$ for the common information vector may be referred to as the common rate or the third rate. The encoder unit 120 may select rates such that they lie in or in sufficiently close proximity to the Pangloss plane of the rate region of the Gray-Wyner network or of another suitable rate region, and given by $R_0+R_1+R_2=R(\Delta_1, \Delta_2)$, where $R(\Delta_1, \Delta_2)$ is the joint rate distortion function of the two data vectors giving the minimal rate for reconstructing the two data vectors at the outputs of the decoder unit, while achieving average distortions no bigger than distortion levels $\Delta_1, \Delta_2$. The encoder unit 120 may obtain the quality requirement including the distortion functions and the distortion levels that may represent maximum average distortions evaluated using the distortion functions. In some implementations, the distortion functions may include the first distortion function for the first data vector and/or for the first canonical vector and the second distortion function for the second data vector and/or the second canonical vector. The encoder unit 120 and decoder unit 140 may operate with average distortion functions not exceeding the distortion levels $\Delta_1, \Delta_2$ that may represent the corresponding transmission quality requirements for the data vectors $Y_1, Y_2$ or the canonical vectors $Y_1^C, Y_2^C$ that may be reproduced or estimated at the decoder unit 140. In some applications, the encoder unit 120, may compute the $\Delta_1, \Delta_2$ based on channel capacity. In any case, the Pangloss plane may represent the optimal rates. An optimal rate region may be defined by rates that are in sufficiently close proximity to the Pangloss where the sum of the rates $R_0+R_1+R_2$, is within a certain percent (0.1, 0.2, 0.5, 1, 2, 5 or any other suitable number) of the optimal value given by the rate distortion function $R(\Delta_1,\Delta_2)$. T In some implementations, the encoder unit 120 may compute a lower bound for the sum of the first private rate, the second private rate, and the third rate (the common rate) by evaluating one or more rate distortion functions using water filling techniques based on the two canonical vectors, the two data vectors, and/or covariance or correlation matrices of canonical vectors and/or data vectors. For example, using water filling techniques may be based on canonical correlation coefficients of the first canonical vector and the second canonical vector, derived from the canonical covariance matrix. The one or more rate distortion functions may include a joint rate distortion function for the first distortion function and the first distortion level in conjunction with the second distortion function and the second distortion level. The first distortion function may be the same as the second distortion function, and may be referred to, simply, as "distortion function." The encoder unit 120 may compute the first private rate, the second private rate, or the third rate at least in part based on the lower bound for the sum of the rates.

Based on the computed rates, the compressors 123, 125, 127 may generate three digital messages, $W_0, W_1, W_2$, by compressing, respectively, the common information vector X with rate $R_0$, the first private vector $Z_1$ with rate $R_1$, and the second private vector $Z_2$ with rate $R_2$. For convenience, the digital messages may be referred to as the first digital message $W_1$, the second digital message $W_2$, and the third digital message $W_0$. The digital messages may be generated from sequences of message vectors. For example, the common compressor 123 may generate the common (third) digital message $W_0$ by compressing a sequence of N independent common information vectors $X_1, X_2, \ldots, X_{N-1}, X_N$ to $NR_0$ bits. The first private compressor 125 may generate the first digital message $W_1$ by compressing N independent first private information vectors $Z_{1,1}, Z_{1,2}, \ldots, Z_{1,N-1}, Z_{1,N}$ to $NR_1$ bits. The second private compressor 127 may generate the second digital message $W_1$ by compressing N independent first private information vectors $Z_{2,1}, Z_{2,2}, \ldots, Z_{2,N-1}, Z_{2,N}$ to $NR_2$ bits.

After computing the rates, the compressors 123, 125, 127 may use lattice coding, transform coding, joint entropy dithered quantization coding (ECDQ), and other known coding techniques to generate the three digital messages.

The compressors 123, 125, 127 of the encoder unit 120 may route the generated digital messages via the channels 130 to the decoder unit 140. Routing via the channels 130 may include converting the digital messages into analog voltage waveforms using modulation and transmitting the analog waveforms as radio waves either wirelessly (in free space) or through cables. Routing may include storing the first digital message in the first memory location, storing the second digital message in the second memory location, and storing the third digital message in the third memory location. Prior to decoding, the decoder unit 140 may receive the waveforms routed by the encoder unit 120 and demodulate the waveforms into digital messages. Additionally or alternatively, the decoder unit 140 may retrieve digital messages from memory locations before decoding.

Generally, the digital messages at the output of the channels 130 may contain distortions caused by the channel and can be referred to as noisy digital messages. In some implementations, lossy compression causes these distortions. The decoder unit 140 may obtain the first noisy digital message $\tilde{W}_1$, the second noisy digital message with $\tilde{W}_2$, and the third noisy digital message $\tilde{W}_0$ via the channels 130. The channels 130 may distort the messages with non-linear effects, spectral filtering, interference, and additive noise. In some applications, a receiver compensates for the preceding channel effects with equalization and other distortion compensation, adding the compensation to the overall channel effect. Furthermore, the channels 130 may implement channel encoding and channel decoding units to mitigate the effects of channel distortions and noise.

The channels 130, including equalization and distortion compensation units, may result in the dominant effect of additive noise. The noise may be additive white Gaussian noise (AWGN). The techniques and algorithms described herein may have particular mathematical significance, such as near-optimal performance, for AWGN channels. Nevertheless, the techniques and algorithms described herein apply to other noise distributions, including, for example, Poisson, Gamma, and/or Ricean distributions.

In some applications, the effects of channel noise are be negligible, and one or more of the noisy messages may equal their original versions at the outputs of the compressors 123, 125, 127 (e.g., $\tilde{W}_0=W_0$, $\tilde{W}_1=W_1$, and/or $\tilde{W}_2=W_2$). The amount of additive noise in a channel may affect its capacity. In some applications, the encoder unit 120 selects the rates to optimize the use of the channel capacities. In other applications, the encoder unit 120 may assign capacities to the channels 132, 134, and 136 based on the computed rates.

At the decoder unit, three decompressors 141, 143, and 145 may apply suitable decoding schemes to reverse the compression applied by the corresponding compressors 125, 123, and 127. The common decompressor 143 may generate an estimated common information vector X based on the third noisy digital message $\tilde{W}_0$. The private decompressor 141 may generate an estimated first private vector $\tilde{Z}_1$ based on the first noisy digital message $\tilde{W}_1$. The private decompressor 145 may generate an estimated second private vector $\tilde{Z}_2$ based on the second noisy digital message $\tilde{W}_2$. In applications where the third digital message $\tilde{W}_0=W_0$ at the output of the common channel 134 is a noiseless reproduction, the estimated common information vector $\bar{X}=X$ may be equal to the output of the common encoder 122. In applications where the digital messages $\tilde{W}_1=W_1$ and $\tilde{W}_2=W_2$ at the outputs of the private channels 132, 136 are noiseless reproductions of the inputs to the channels, the estimated first private vector $\tilde{Z}_1$ and the estimated second private vector $\tilde{Z}_2$ may nevertheless contain distortions. Lossy compression by the private compressors 125 and 127 may result in distortions of the private vectors $Z_1$ and $Z_2$ even when the private channels 132 and 136 are noiseless. The distortions may satisfy the transmission quality requirements. In some applications, the private encoders 124, 126, private compressors 125, 127, and/or common encoder 123 compute rates that satisfy the transmission quality requirement in view of channel capacity of multiple access channels, broadcast channels, interference channels, or other suitable channels.

The decoder unit 140 may route the outputs of the decompressors 141, 143, and 145 to the decoder 142 and the decoder 144. The decoder 142 may combine the estimate of the common information vector $\bar{X}$ and the estimate of the first private vector $\bar{Z}_1$ to compute an estimate of the first data vector $Y_1$. The decoder 144 may combine the estimate of the common information vector $\bar{X}$ and the estimate of the second private vector $\bar{Z}_2$ to compute an estimate of the second data vector $\hat{Y}_2$. The decoders 142, 144 may compute the estimates of the data vectors $\hat{Y}_1$ and $\hat{Y}_2$ in two steps. In the first step, the private decoders 142, 144 may compute estimates of the first canonical vector $\hat{Y}_1^C$ and the second canonical vector $\hat{Y}_2^C$. In the second step, the two decoders 142, 144 may transform the estimates of the canonical vectors $\hat{Y}_1^C$ and $\hat{Y}_2^C$ to the estimates of data vectors $\hat{Y}_1$ and $\hat{Y}_2$ by applying inverses of the transformations for generating the the canonical vectors from the data vectors. In some applications, the decoders 142, 144 compute and apply inverse transformations that are matrix inverses of $S_1$ and $S_2$. In other applications, the decoders 142, 144 compute and apply inverse transformations that are regularized forms of the inverses, thereby improving conditioning of the transformations.

The first transducer 152 and the second transducer 154 may render the estimated data vectors $\hat{Y}_1$ and $\hat{Y}_2$ to produce, correspondingly, the first representation 162 and the second representation 164 of the object 102. In some implementations, the first transducer 152 and the second transducer 154 are of the same type, e.g. displays, sections of a display, speakers, etc., and render similar types of information. In other implementations, the transducers 152, 154 are of different types and/or render different types of information. In some implementations, the two representations 162, 164 serve as complementary information for a user, while in other applications the first representation 162 is rendered for the first user and the second representation 164 is rendered for the second user. The rendering of the first representation 162 may be secret from the second user, and/or the rendering of the second representation 164 may be secret from the second user.

Figure 2:
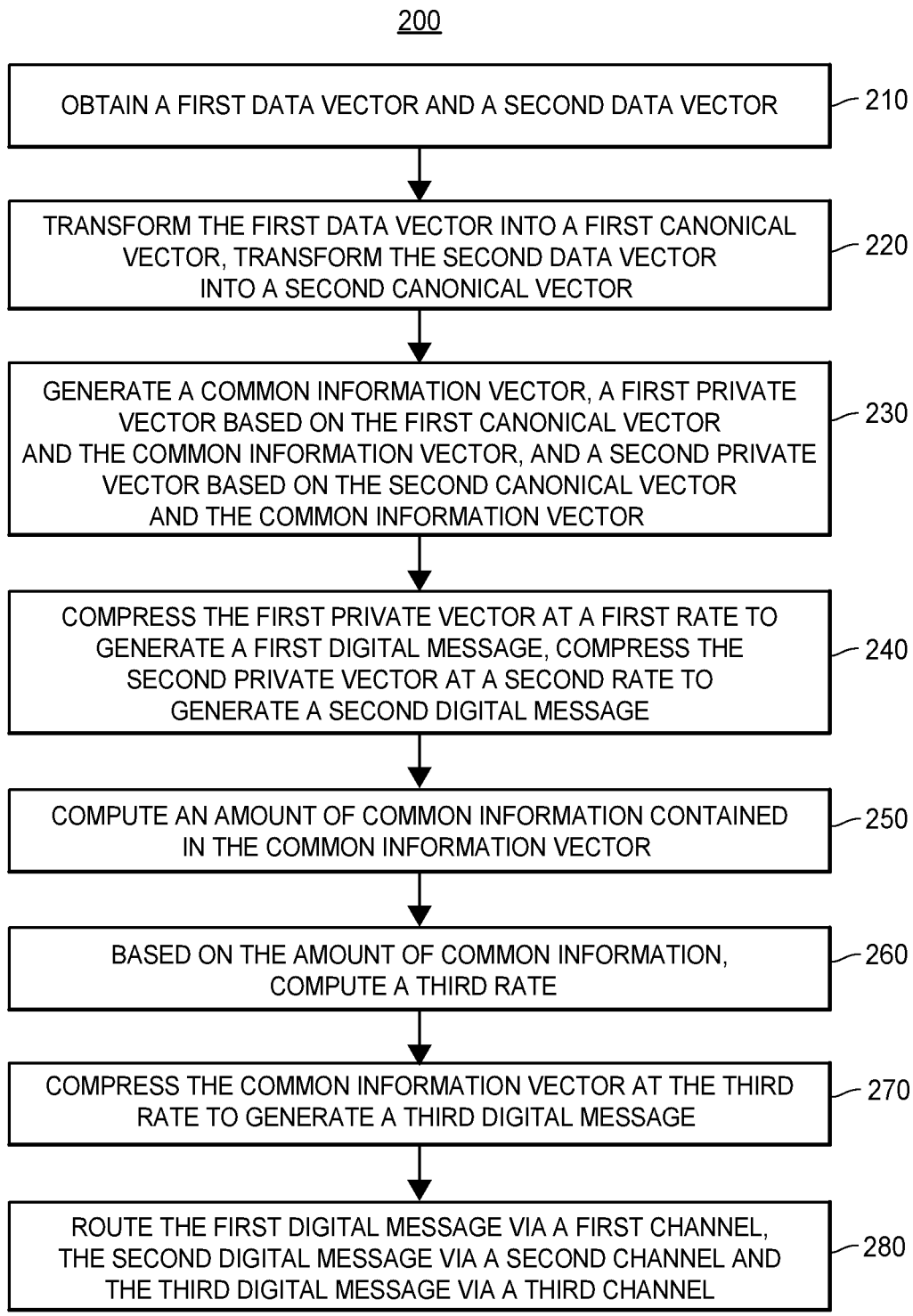
FIG. 2 is a flow chart that represents a computer-implemented method of compressively encoding two correlated data vectors.

FIG. 2 is a flow chart that represents a computer-implemented method 200 of compressively encoding two correlated data vectors. The method applies, for example, to the encoding portion of the communication network 100 illustrated in FIG. 1. The method 200 may be implemented using computer hardware including one or more processors. The one or more processors may include central processing units (CPUs), graphical processing units (GPUs), digital signal processors (DSPs), and/or other suitable processors. Additionally or alternatively, hardware devices such as application specific integrated circuits (ASICs) or field-programmable gate arrays (FPGAs) may implements at least portions of the method 200. The hardware and software configured to implement the method is referred to herein as a computing system. Instructions to implement the method 200 may be executed by the one or more processors of the computing system.

A non-transitory computer-readable medium may store instructions for the method 200 to compressively encode two correlated data vectors. The computer-readable medium may be a hard drive, a flash drive, an optical storage medium, and/or any other suitable medium. One or more processors of the computing system may execute the instructions to perform the actions in the blocks 210-280 of the method 200.

At block 210, the computing system may obtain a first data vector and a second data vector. For example, in the communication network 100, the first and second data vectors may be generated by the sensors 106, 108 and communicated to the pre-encoder unit 110 implemented by the computing system. Without any loss of generality, the first data vector is referred to herein as $Y_1$ and the second data vector is referred to herein as $Y_2$. The computing system may analyze the first data vector and the second data vector at block 210, to determine whether to proceed with and/or adjust the subsequent steps of the method 200. For example, the computing system may determine whether the first data vector and the second data vector are substantially representative of correlated Gaussian random variables. To make the determination, the computing system may analyze statistical distributions and/or covariance of vector elements from multiple pairs of data vectors, including the first data vector and the second data vector. The computing system may determine that a statistical distribution is substantially representative of a Gaussian random variable based on a quality of fit of the distribution to a Gaussian function. The computing system, additionally or alternatively, may compute a probability that a set of data vectors including the first data vector and the second data vector are generated by a joint Gaussian distribution within the neighborhood of the set of data vectors. The computing system may subsequently determine that the first data vector and the second data vector are substantially representative of correlated Gaussian random variables at least in part by comparing the computed probability to a threshold.

At block 220, the computing system may transform the first data vector into a first canonical vector and the second data vector into a second canonical vector. Without any loss of generality, the first canonical vector is referred to as $Y_1^C$ and the second canonical vector is referred to as $Y_2^C$. In the example network 100 of FIG. 1, the canonical vectors are generated by the pre-encoder unit 110. In other implementations, different logical units generate the canonical vectors. For example, in some implementations, an encoder unit, such as the encoder unit 120, transforms the data vectors to the canonical vectors.

The first canonical vector may contain the same information as the first data vector, but in canonical variable form. Likewise, the second canonical vector may contain the same information as the second data vector, but in canonical variable form. In some implementations, the canonical variable form is a form that ensures that the covariance matrix of the two canonical vectors substantially conforms to the canonical variable form for a covariance matrix, as expressed by the equation below:

$$Q_{cvf} = \text{Cov}\begin{pmatrix} Y_1^C \\ Y_2^C \end{pmatrix} = \begin{pmatrix} I_{p_{11}} & 0 & 0 & I_{p_{21}} & 0 & 0 \\ 0 & I_{p_{12}} & 0 & 0 & D & 0 \\ 0 & 0 & I_{p_{13}} & 0 & 0 & 0 \\ I_{p_{21}} & 0 & 0 & I_{p_{21}} & 0 & 0 \\ 0 & D & 0 & 0 & I_{p_{22}} & 0 \\ 0 & 0 & 0 & 0 & 0 & I_{p_{23}} \end{pmatrix},$$ (Eq. A)

where $I_{p11}$, $I_{p12}$, $I_{p13}$, $I_{p21}$, $I_{p22}$, $I_{p23}$ are identity matrices of respective dimensions $p_{11}$, $p_{12}$, $p_{13}$, $p_{21}$, $p_{22}$, $p_{23}$ (where $p_{11}=p_{21}$ and $p_{21}=p_{22}$) and D is a diagonal matrix of dimension $p_{12}$. The dimension $p_{11}+p_{12}+p_{13}=p_1$ is the size of the first canonical vector $Y_1^C$, while the dimension $p_{21}+p_{22}+p_{23}=p_2$ is the size of the second canonical vector $Y_1^C$. The diagonal matrix D may contain the canonical correlation coefficients or canonical singular values of the first and second canonical vectors.

In the following discussion, substantially conforming to the canonical variable form of the covariance matrix may refer to having a covariance matrix where the elements that correspond to the zero elements of $Q_{cvf}$ in Eq. A are within a predetermined threshold of zero, while the elements that correspond to the unity elements of $Q_{cvf}$ in Eq. A are within a predetermined threshold of unity. For example, covariance matrix elements below 0.05, 0.02, 0.01, 0.005, 0.002 or any other suitable number may be considered substantially zero. Analogously, covariance matrix elements above 0.95, 0.98, 0.99, 0.995, 0.998 or any other suitable number may be considered substantially equal to unity. The transformations at block 220 may ensure that there are only non-negative values in the covariance matrix.

According to Eq. A, to substantially conform to the canonical variable form, all of the elements of the first canonical vector may be required to be substantially independent from each other and have substantially unity variance. Likewise, substantially conforming to the canonical variable form may require that all of the elements of the second canonical vector are substantially independent from each other and have substantially unity variance. According to Eq. A, the first and second canonical vectors may contain elements each that form identical pairs with each other. Thus, the first canonical vector may contain a component that is identical or substantially identical to a component of the second canonical vector. In some scenarios, $p_{21}=p_{11}=0$, and there are no identical or substantially identical components in the first and second canonical vectors.

The elements of the diagonal sub-matrix D in Eq. A, with values $1>d_1 \geq d_2 \geq \ldots \geq d_{p_{12}} > 0$, the canonical covariance or correlation coefficients, indicate that there are $p_{12}=p_{22}$ elements in each of the two canonical vectors that are pairwise correlated with each other. The corresponding elements may form a first component of the first canonical vector and a first component of the second canonical vector, wherein each of the two correlated components are indicative of the same and/or common information. Because the first canonical vector contains information from the first data vector and the second canonical vector contains information from the second data vector, the first component of the first canonical vector may contain information indicative of the first data vector and information indicative of the second data vector. Analogously, because the first components of the canonical vectors are correlated, the first component of the second canonical vector may contain information indicative of both, the first data vector and the second data vector.

Furthermore, according to Eq. A, the first canonical vector contains $p_{13}$ elements that are substantially independent from all of the elements in the second canonical vector. These elements form a second component of the first canonical vector. Analogously, the second canonical vector contains $p_{23}$ elements that are substantially independent from all of the elements in the first canonical vector. These elements form a second component of the second canonical vector. Therefore, the second component of the first canonical vector may be indicative of information in the first data vector and substantially exclusive of information in the second data vector. Analogously, the second component of the second canonical vector may be indicative of information in the second data vector and substantially exclusive of information in the first data vector.

At block 220, the computing system may transform the data vectors using matrix multiplication: $Y_1^C=S_1 Y_1$ and $Y_2^C=S_2 Y_2$. In one implementation, the pre-encoder unit 110 computes the nonsingular transformation matrix for the first data vector $S_1$ and the nonsingular transformation matrix for the second data vector $S_2$ based on a covariance matrix of the data vectors according to Algorithm 2 described below. Other logical units, such as, for example, an encoder, configured within the computing system that implements the method 200 may also implement Algorithm 2 and compute the transformation matrices. To compute the transformation matrices, the computing system may estimate the covariance of the data vectors by analyzing multiple observations of the data vectors. In other implementations, the computing system computes the covariance matrix for the data vectors based on the physical and/or mathematical principals underlying the generation of the data vectors. The computing system may obtain the covariance matrix for the first data vector and the second data vector in other ways, that may include, for example, altering, adjusting, or updating a pre-computed covariance matrix based on changes in data acquisition geometry, analysis of observed data vectors, and/or other information. For example, at block 220, the computing system may, for every new pair of data vectors, analyze a difference between the first data vector and the second data vector to modify the covariance matrix. The computing system may perform the analysis on multiple pairs of data vectors, and make adjustments to the covariance matrix in view of confidence and/or uncertainty in the values of the covariance matrix prior to the adjustment.

As discussed above, each of the canonical vectors may contain three components, with covariance matrix of $Q_{cvf}$ in Eq. A, with the three components of each canonical vector designated by $$Y_1^C = \begin{pmatrix} Y_{11} \\ Y_{12} \\ Y_{13} \end{pmatrix}, Y_2^C = \begin{pmatrix} Y_{21} \\ Y_{22} \\ Y_{23} \end{pmatrix},$$ (Eq. B)

where $Y_{12}$, $Y_{22}$ may be the correlated first components with the covariance matrix given by D, that may contain the canonical covariance or correlation coefficients, $Y_{13}$, $Y_{23}$ may be the substantially independent second components with a substantially zero covariance matrix, and the $Y_{11}$, $Y_{21}$ may be substantially identical components with the covariance matrix that may be a substantially identity matrix. Herein, $Y_{11}$ may be referred to as a third component of the first canonical vector, and $Y_{21}$ may be referred to as a third component of the second canonical vector.

At block 230, the computing system may generate a common information vector, a first private vector, and a second private vector. More particularly, the computing system may generate the first private vector, the second private vector, and the common information vector in response to determining that the first data vector and the second data vector are substantially representative of correlated Gaussian random variables. To generate the common information vector X based on the first component of the first canonical vector and the first component of the second canonical vector, the computing system may use Eq. 178 given below. The common information vector generated by the computing system may include the third component of the first canonical vector or the third component of the second canonical vector, as specified, for example, in Eqs. 176 and 177 below. In some scenarios, the computing system may average the substantially identical third components and include the average in the common information vector. In the exemplary communication network of FIG. 1, the common encoder 122 may compute the common information vector using the canonical vector components and equations described above. To generate the two canonical vectors the computing system may use Eqs. 183-185 below or, by example, Eqs. 98-107.

The computing system may compute the first private information vector based on the first canonical vector and the common information vector at block 230 using Eqs. 179, 181, and 182 below. Using the equations, the computing system may compute one component of the first private information vector by subtracting a linear transformation of at least a portion of the common information vector from the first component ($Y_{12}$) of the first canonical vector. The computing system may compute another component of the first private information vector by including the elements of the second component of the first canonical vector. Thus, the first component of the first canonical vector, with the common information removed, may be concatenated with the second component of the first canonical vector to form the first private information vector, $Z_1$ of size $p_{12}+p_{13}$. Similarly, at block 230, the computing system may also compute the second private information vector using, for example, Eqs. 180-182. The first component of the second canonical vector, with the common information removed, may be concatenated with the second component of the second canonical vector to form the second private information vector, $Z_2$ of size $p_{22}+p_{23}$. The first private encoder 124 and the second private encoder 126 of the network 100 may generate, respectively, $Z_1$ and $Z_2$, by implementing, for example, the operations described in Eqs. 179-182. By example, the computer system may compute the first and second private information vector using Eqs. 103, 104.

At block 240, the computing system may compress the first private vector $Z_1$ at a first rate to generate a first digital message and the second private vector $Z_2$ at a second private rate to generate a second digital message. The first rate, $R_1$, may indicate the number of bits used to represent the first private vector, while the second private rate, $R_2$, may indicate the number of bits used to represent the second private vector. In some implementations, the computing system may simultaneously compress information from a sequence of N pairs of data vectors, resulting in N pairs of private information vectors, including the first and the second private information vectors. For example, the first private compressor 125 may simultaneously compress N private information vectors including the first private information vector to generate the first digital message of $NR_1$ bits. Analogously, the second private compressor 127 may simultaneously compress N private information vectors including the second private information vector to generate the second digital message of $NR_2$ bits.

To compute the first rate $R_1$ and the second private rate $R_2$, the computing system may obtain a transmission quality requirement and compute a rate region based at least in part of the obtained transmission quality requirement. The transmission quality requirement may include a first distortion level and a first distortion function and a second distortion level and a second distortion function. The first distortion level may correspond to the highest level of acceptable expected or average distortion in the decoded first data vector and/or in the first canonical vector. For a given data vector, distortion may exceed the maximum distortion. That said, the average distortion for a large collection of data vectors may still be limited to the maximum distortion. The computing system may compute distortion as a square error distortion, given by Eqs. 114, 115, that squares the element-wise differences between the vector before encoding and the vector after decoding. The computing system may compute the rate region by evaluating rate distortion functions in Eqs. 108-111 to determine the minimum private rates and/or the sum rate in Eq. 116 that may be needed to satisfy the required transmission quality. In some applications, the computing system may evaluate the relationship between the rates and the distortion by changing rates, measuring distortion, and storing an observed rate-distortion function for reference. In some implementations, a first rate distortion function and a second rate distortion function may correspond to a rate distortion function for the first distortion function and a rate distortion function for the second distortion function. The first distortion function may be the same as the second distortion function.

The computed rate region may be a Gray-Wyner lossy rate region for a Gray-Wyner network such as, for example, the communication network 100 of FIG. 1. The Gray-Wyner lossy rate region may include the collection of all rate triples ($R_0$, $R_1$, $R_2$), correspondingly, of the third rate, the first rate, and the second private rate, at which the corresponding independent vectors (X, $Z_1$, $Z_2$) may be transmitted over a Gray-Wyner network with noiseless channels and decoded into two estimates of the data vectors, satisfying the transmission quality requirement. The first rate may be referred to as the first private rate, the second rate may be referred to as the second private rate, and the third rate may be referred to as the common rate or the common information rate. The sum of the rates, $R_0+R_1+R_2$, equal to the joint rate distortion function of the first maximum distortion and the second maximum distortion, may define a Pangloss plane for the Gray-Wyner lossy rate region, according to Eq. 94. The computing system may compute the rates on the Pangloss plane of the Gray-Wyner lossy rate region using Eq. 95.

The first rate on the Pangloss plane may correspond to a lower bound for the first rate in the Gray-Wyner lossy rate region according to Eqs. 43-48 or Eqs. 49 and 50. The computing system may compute the lower bound for the first private rate by evaluating the rate distortion function for the first distortion that is no greater than the first distortion level, using Eqs. 108-109, and the classical water filling algorithm, for example, based on the canonical correlation coefficients. The second rate on the Pangloss plane may correspond to a lower bound for the second private rate in the Gray-Wyner lossy rate region. The computing system may compute the lower bound for the second private rate by evaluating the rate distortion function for the second distortion, that is no greater than the second distortion level, using Eqs. 110-111, and, for example, the classical water filing algorithm, for example, based on the canonical correlation coefficients.

At block 250, the computing system may compute the amount of common information in the common information vector by computing, for example, an amount of Wyner's common information using Eq. 88, and based on Eq. 50. In some applications, the computing system removes the substantially identical components of the canonical vectors from the common information vector to ensure a finite value of the Wyner's common information finite. The amount of Wyner's lossy common information based on Eq. 49 and Eq. 50 in the common information vector may correspond to the third rate on the Pangloss plane. At block 260, the computing system, using, for example, the common encoder 122, may assign the computed amount of Wyner's lossy common information to the third rate $R_0$, to place the third rate in the Pangloss plane. Thus, the computing system may prioritize the third rate and reduce the third rate as much as possible while still satisfying transmission requirements. The substantially prioritized minimum third rate may offer the advantage of efficiency because the decoder unit 140 may, in some implementations, be replaced with two decoder units, one for each data vector, each one decompressing the common digital message at the third rate. In some implementations, the computing system may compute the amount of common information by estimating the entropy of the collection of vectors including the common information vector, generated, for example, by the common encoder 122. At block 260, the computing system may compute and/or update the third rate $R_0$ based on the amount of common information computed at block 250. The computing system may set the third rate to the amount of the common information, or may choose the rate to be 5%, 10%, 20% or any other suitable margin above the amount of the common information. In some implementations, the computing system may compute an acceptable maximum distortion in the common information vector and compute the third rate based on the acceptable maximum distortion.

In some implementations, the computing system may implement one or more test channels that may be realized or computationally implemented with additive Gaussian noise, for example. The computing system may use the test channels to implement encoders for compressing the first private vector, the second private vector and the common vector at the first private rate, the second private rate, and the third rate. For example, the system may evaluate distortion in the first and second data vectors or in the first and second canonical vectors reconstructed from information transmitted through at least one of the one or more test channels. Additionally or alternatively, the test channels may be used in conjunction with water filling solutions for implementing encoders. The test channels may be used to model the rate distortion function of the first private rate, the rate distortion of the second private rate, and/or the joint rate distortion function of the sum of the first rate, the second rate, and the common rate, In some implementations, the computing system may obtain a channel capacity for the first channel, the second channel, and/or the third channel. The channel capacity may be limited by available frequency bandwidth, speed of available hardware, noise, power limitations and/or other constraints. Furthermore, the channel capacity may vary dynamically. The computing system may compute the first rate, the second rate, and/or the third rate based at least in part on the obtained channel capacity. For example, when the channel capacity of the first and/or second channel decreases, the system may compute the rates that maintain the distortion at the lowest expected level for the new channel capacities. The system may additionally or alternatively, assign available channels to be the first channel, the second channel, and/or the third channel based on the obtained channel capacities.

At block 270, the computing system may compress the common information vector at the third rate $R_0$ to generate a third digital message. In some implementations, the computing system may simultaneously compress information from a sequence of N pairs of distinct data vectors, resulting in N distinct common information vectors, including the common information vector. For example, the common compressor 123 may simultaneously compress N common information vectors, to generate the third digital message of $NR_0$ bits.

At block 280, the computing system may route the first digital message via a first channel, the second digital message via a second channel and the third digital message via a third channel. The first channel and the second channel may be private channels and the third channel may be a public channel. The public channel may transmit information that is available and/or accessible to multiple receivers and/or decoders. In other implementations, the information in the public channel is unavailable and/or inaccessible to the receivers and/or decoders other than the receivers and/or decoders in the network. The network may keep information from certain receivers and/or detectors by physically isolating signals in wired channels and/or by encrypting information and controlling the distribution of encryption keys. In some implementations, the computing system encrypts information in the digital messages for routing via the private channels and via the public channel at block 280. In such applications, multiple receivers and/or decoders may obtain the encryption key for the third digital message, while the encryption keys for the first and second digital message may only be available to the corresponding receivers and/or decoders.

In some implementations, the computing system routes the digital messages at block 280 by storing the digital messages in one or more storage media. The computing system may route the first digital message by storing the first digital message at a first memory location of the one or more storage media. The system may route the second digital message by storing the second digital messages at a second memory location of the one or more storage media. The system may route the third digital message by storing the third digital message at a third memory location of the one or more storage media. The storage media may include magnetic hard drives, magnetic tapes, optical storage media, flash drives, and/or any other suitable storage media.

The first memory location and the second memory location may be secure memory locations of the one or more storage media. In some implementations, the secure memory locations are physically isolated from memory reading devices other than the memory reading devices communicatively connected to specified receivers and/or detectors for reconstruction corresponding data. In other implementations, the secure memory locations comprise encrypted memory for storing the private information. The third memory location may be an unsecured memory location that is physically accessible to multiple receivers, decoders, and/or other units for reconstructing the data vectors. The unsecured memory location may contain unencrypted information or may contain encrypted information with the encryption key available to multiple receivers and/or decoders.

The following provides examples and mathematical derivations pertaining to the foregoing discussion.

The following discussion focuses on the mathematical principals applied to source or data compression techniques. Source encoding refers to the conversion of data sequences, vectors, and/or sequences of vectors generated by sources, referred to as "data" into binary sequences, bit streams, and/or digital messages referred to as "messages" that are more efficiently represented than the data, and more suitable for transmission over a noiseless or noisy channel(s) to the decoder(s) that reproduce(s) the original data, either exactly or approximately subject, for example, to a distortion criterion. Such techniques may be used in transmission of data from an optical disk to a music player, in computer applications, such as, storing data, machine-to-machine interaction, etc., and general point-to-point and network applications. In communication applications it may be desirable to transmit compressed streams of data which, can be reconstructed at the decoder (at least approximately) to their original form, subject to the pre-specified distortion or fidelity criterion. In computer applications, data compression methods described herein may reduce storage requirements compared to uncompressed data.

Data compression techniques may be divided into lossy and lossless compression.

Lossless data compression techniques may be used when the bit streams or digital messages generated by an encoder are used by a decoder to reproduce the original data with arbitrary small average probability of error, asymptotically. Lossless data compression techniques ensure that the role of the encoder and decoder system is to remove redundancy, i.e., achieve efficient representation of the data, but not to remove information or distort the initial data.

Lossy data compression techniques allow a pre-specified distortion or fidelity between the original data and their reconstructions at the decoder. They may be used in signal processing application which can tolerate information loss, such as, transmission and storage of digital audio and video data, etc., and in the design of communication systems in which channels support limited rates. Lossy data compression system requirements for communication and storage applications may be more relaxed than those of lossless data compression.

Network lossy and lossless compression techniques, also sometimes called network source coding, are compression techniques for multiple sources that may generate multiple data vectors and/or sequences, and may be implemented with multiple encoders and or decoders. For a given a set of sources that generate data and a given communication network, an efficient technique to compress the data for reliable transmission over the network may take advantage of the correlations that exists in the data generated by multiple sources. One example technique may remove redundancy that exists in the data, and introduce collaboration between the encoders and decoders to improve performance, with respect to limited capacity requirements, compared to those techniques that treat data sequences and/or vectors independently and that do not introduce collaboration between encoders and decoders.

A code for network source coding may be set of functions that specify how data generated by sources are compressed, transmitted through the channels and reconstructed at the receivers. In lossy network source coding a code is called reliable if the data generated by the sources can be reconstructed, subject to satisfying an average distortion or fidelity at the intended receivers, asymptotically (in lossless compression the average error converges asymptotically to zero). The performance and efficiency of the code is quantified by the rates at which the network sends data over the channels to the intended receivers. Substantially optimal codes achieve the smallest possible rates and hence require the least channel capacity, when transported to the receivers. A collection of channel rates, one for each channel, is called achievable if there exists a reliable code which ensures operation at these rates. The collection of all achievable channel rates denoted by $\mathcal{R}$ is called an achievable rate region of the network. The lower boundary of $\mathcal{R}$ denoted by $\overline{\mathcal{R}}$, may give the fundamental limit to compare one code with another code, i.e., the performance of reliable codes. The achievable rate region $\mathcal{R}$ is only known for a small collection of networks. It is a standard practice to characterize the minimum lossless and lossy compression rates of data using Shannon's information theoretic measures of entropy, conditional entropy, mutual information, and the rate distortion function and conditional rate distortion function subject to a fidelity criterion.

The derivations and discussion herein generally relate to algorithms and methods for the lossy source coding network, known as the Gray-Wyner network, which has applications to network communication, computer storage, and cyber security. Present principles develop algorithms and methods to compute the (achievable) rate region denoted by $\mathcal{R}_{GW}(\Delta_1, \Delta_2)$ of the Gray-Wyner network, referred to as "Gray-Wyner lossy (achievable) rate region", and its "lower boundary" denoted by $\overline{\mathcal{R}}_{GW}(\Delta_1, \Delta_2)$, referred to as "Gray-Wyner lossy lower boundary of the rate region" for sources that may generate two vectors and/or two sequences of multivariate data. The algorithms may be substantially optimal for data that may be modeled by jointly Gaussian discrete-time processes. The data may comprise a sequence of pairs or tuples of data vectors:

$$(Y_1^N, Y_2^N) = (Y_{1,1}, \ldots, Y_{1,N}, Y_{2,1}, \ldots, Y_{2,N})$$

where $$Y_{1,j} \text{ is a } p_1\text{-dimensional vector}, j=1, \ldots, N, \qquad (2)$$

$$Y_{2,j} \text{ is a } p_2\text{-dimensional vector}, j=1, \ldots, N, \qquad (3)$$

$$(Y_{1,j}, Y_{2,j}) \text{ are independent of } (Y_{1,i}, Y_{2,i}) \text{ for } j \neq i, \qquad (4)$$

$$(Y_{1,j}, Y_{2,j}) \text{ are correlated with Gaussian distribution}$$
$$P_{Y_1, Y_2}(y_1, y_2), j=1, \ldots, N \qquad (5)$$

subject to square error distortion functions given by $$D_{Y_1}(y_1^N, \hat{y}_1^N) \triangleq \frac{1}{N} \sum_{i=1}^{N} |y_{1,i} - \hat{y}_{1,i}|^2, \qquad (6)$$

$$D_{Y_2}(y_2^N, \hat{y}_2^N) \triangleq \frac{1}{N} \sum_{i=1}^{N} |y_{2,i} - \hat{y}_{2,i}|^2.$$

Present principles develop methods and algorithms to compute Wyner's lossy common information denoted by $C_W(Y_1, Y_2; \Delta_1, \Delta_2)$ for sources that generate data that may be modeled as two sequences of multivariate jointly Gaussian discrete-time processes.

Embodiments of this invention present methods and algorithms to compute the Gray-Wyner lossy rate region $\mathcal{R}_{GW}(\Delta_1, \Delta_2)$, the Gray-Wyner lossy lower boundary of the rate region $\bar{\mathcal{R}}_{GW}(\Delta_1, \Delta_2)$, and Wyner's lossy common information $C_W(Y_1, Y_2; \Delta_1, \Delta_2)$, using rate distortion theory, and more specifically, the rate distortion function of a vector of data modeled by independent Gaussian random variables, subject to mean-square error (MSE) distortion functions, and which may be characterized by water-filling solutions.

In an embodiment, methods described herein may use Algorithm 1, given below in detail, to parametrize all triples of data vectors that may be modeled by Gaussian random variables of which the third makes the remaining two variables conditionally independent and of which the joint probability distribution of the first two variables agrees with a pre-specified joint probability distribution. Algorithm 1 may be a preliminary step to the computation of $\mathcal{R}_{GW}(\Delta_1, \Delta_2)$, $\bar{\mathcal{R}}_{GW}(\Delta_1, \Delta_2)$, and $C_W(Y_1, Y_2; \Delta_1, \Delta_2)$, and generation of messages with rates that belong to $\mathcal{R}_{GW}(\Delta_1, \Delta_2)$, $\bar{\mathcal{R}}_{GW}(\Delta_1, \Delta_2)$, and $C_W(Y_1,Y_2; \Delta_1, \Delta_2)$.

Embodiments of the methods described herein may also use Algorithms 2 and/or 3, given below in detail, to implement a pre-encoder that applies a basis transformation to a tuple of sequences of vectors defined by Eqs. (1)-(5) to transform them into the canonical variable form of the tuple, that is expressed in terms of canonical singular values of the tuple (pair of vectors). The basis transformation may be a nonsingular transformation that may be equivalent to a pre-encoder that maps sequences of data $(Y_1^N, Y_2^N)$, into their canonical variable form. The elements and principles of the algorithm that generates the canonical variable form of the tuple of vectors that may be modeled by Gaussian random variables and/or Gaussian random processes. The canonical variable form may be used in the computation of the Gray-Wyner lossy rate region $\mathcal{R}_{GW}(\Delta_1, \Delta_2)$, the Gray-Wyner lossy lower boundary of the rate region $\bar{\mathcal{R}}_{GW}(\Delta_1, \Delta_2)$, Wyner's lossy common information $C_W(Y_1, Y_2; \Delta_1, \Delta_2)$, and generation of messages with rates that belong to $\mathcal{R}_{GW}(\Delta_1, \Delta_2)$, $\bar{\mathcal{R}}GW(\Delta_1, \Delta_2)$, and $C_W(Y_1, Y_2; \Delta_1, \Delta_2)$.

Embodiments of methods presented herein may also use Algorithm 3, given below in detail, to employ the canonical variable form while computing the Gray-Wyner lossy rate region $\mathcal{R}_{GW}(\Delta_1, \Delta_2)$, the Gray-Wyner lossy lower boundary of the rate region $\mathcal{R}_{GW}(\Delta_1, \Delta_2)$, and the Wyner's lossy common information $C_W(Y_1, Y_2; \Delta_1, \Delta_2)$, of Eqs. (1)-(6), that is expressed in terms of the canonical singular values.

Algorithm 3 may include the computation of the rate triple $(R_0, R_1, R_2)$ that lies is the Pangloss plane of the Gray-Wyner lossy rate region $\mathcal{R}_{GW}(\Delta_1, \Delta_2)$, using two distortion functions of independent Gaussian random variables with zero mean and variance represented by the canonical singular values or canonical correlation coefficients, subject to a mean square error (MSE) distortion criteria, and Wyner's lossy common information. In another aspect, Algorithm 3 may represent a sequence vectors modeled by jointly independent multivariate Gaussian random variables $(Y_1^N, Y_2^N)$ by a sequence of multivariate triples modeled by independent Gaussian random variables $(Z_1^N, Z_2^N, X^N)$, such that $Y_1^N$ is expressed in terms of $(Z_1^N, X^N)$, and $Y_2^N$ is expressed in terms of $(Z_2^N, X^N)$.

In another aspect, Algorithm 3 represents the reproductions $(\hat{Y}_1^N, \hat{Y}_2^N)$ of $(Y_1^N, Y_2^N)$, that satisfy the MSE fidelity criterion, by a triple of independent random variables $(\hat{Z}_1^N, \hat{Z}_2^N, X^N)$, such that $\hat{Y}_1^N$ is expressed in terms of $(\hat{Z}_1^N, X^N)$, and $\hat{Y}_2^N$ is expressed in terms of $(\hat{Z}_2^N, X^N)$.

In another aspect, Algorithm 3 presents a method based on the above representations of $(Y_1^N, Y_2^N)$ and $(\hat{Y}_1^N, \hat{Y}_2^N)$ from which all rates that lie in the Gray-Wyner lossy rate region $(R_0, R_1, R_2) \in \mathcal{R}_{GW}(\Delta_1, \Delta_2)$, and the Gray-Wyner lossy lower boundary of the rate region. $\bar{\mathcal{R}}_{GW}(\Delta_1, \Delta_2)$, are computed by invoking rate distortion functions that correspond to the rate distortion function of a vector of independent Gaussian random variables, subject to MSE distortion, and variants of it.

The embodiments of the invention may also use Algorithm 4, given below in detail, to represent $\hat{Y}_1^N$ at the output of a first pre-decoder, and the representation of $\hat{Y}_2^N$ at the output of a second pre-decoder. Algorithm 4 may include two independent parts; the signal $D^{1/2}X^N$ that is common to both, and their private parts that are realized by parallel additive Gaussian noise channels. It is then clear to those familiar with the art of implementing compression or quantization techniques, such as, lattice codes, joint entropy coded dithered quantization (ECDQ), and existing codes and quantization methods, that the pre-decoder reproduction sequences $(\hat{Y}_1^N, \hat{Y}_2^N) = \{(\hat{Y}_{1,i}, \hat{Y}_{2,i})\}_{i=1}^N$, are such that $(\hat{Y}_{1,i}, \hat{Y}_{2,i})$ are jointly independent and identically distributed, and hence existing quantization techniques, such as, the ones described above, are readily applicable to produce the messages $(W_0, W_1, W_2)$.

The present disclosure also provides analogous algorithms to Algorithms 1-4 for time-invariant Gaussian processes, in which the two output processes $(Y_1^N, Y_2^N)$ are generated by the representation $$X(t+1) = AX(t) + MV(t), X(t_0) = X_0, \qquad (7)$$

$$Y(t) = \begin{pmatrix} Y_1(t) \\ Y_2(t) \end{pmatrix} = \begin{pmatrix} C_1 \\ C_2 \end{pmatrix} X(t) + \begin{pmatrix} N_1 \\ N_2 \end{pmatrix} V(t), \qquad (8)$$

$$C = \begin{pmatrix} C_1 \\ C_2 \end{pmatrix}, N = \begin{pmatrix} N_1 \\ N_2 \end{pmatrix},$$

$n, m_v, p_1, p_2$ are positive integers, $X_0: \Omega \to \mathbb{R}^n$, $X_0$ is zero mean Gaussian i.e., $X_0 \in G(0, G_{X_0})$, $V: \Omega \times T \to \mathbb{R}^{m_v}$, $V(t) \in G(0, Q_V)$, $Q_V = Q_V^T \geq 0$, $T = \{0, 1, 2, \ldots\}$, $A \in \mathbb{R}^{n \times n}$, $M \in \mathbb{R}^{n \times m_v}$, $C_1 \in \mathbb{R}^{p_1 \times n}$, $C_2 \in \mathbb{R}^{p_2 \times n}$, $N_1 \in \mathbb{R}^{p_1 \times m_v}$, $N_2 \in \mathbb{R}^{p_2 \times m_v}$, $X: \Omega \times T \to \mathbb{R}^n$, $Y_1: \Omega \times T \to \mathbb{R}^{p_1}$, $Y_2: \Omega \times T \to \mathbb{R}^{p_2}$.

The white noise process V may represent a sequence of independent random variables. It is assumed that the white noise process V and the initial state $X_0$ are independent objects. The assumptions of the algorithm below then imply the existence of an invariant distribution of the output process Y which is Gaussian with distribution $Y(t) \in G(0, Q_Y)$ for all $t \in T$.

The analogous algorithms to Algorithms 1-4 for representation (7) and (8) may be similar for the following two cases.

Case (1): Time-Invariant Stationary Gaussian Processes.

The assumptions included ensure that for the above Gaussian system there exist the Kalman filter system and its innovation process, defined by the realization:

$$\hat{X}(t+1) = A\hat{X}(t) + K\overline{V}(t), \qquad (9)$$

$$Y(t) = C\hat{X}(t) + \overline{V}(t), \overline{V}(t) \in G(0, Q_{\overline{V}}) \qquad (10)$$

where $\overline{V}$ denotes the innovation process. The innovation process is a sequence of independent random variables each of which has a Gaussian probability distribution with $\nabla(t) \in G(0, Q_V)$. From this point onwards analogous algorithms to Algorithms 1-4 of the previous section can be obtained for the stationary innovations process $V(t) \in G(0, Q_V)$.

Case (2): Time-Invariant Stationary Gaussian Processes.

The assumptions included ensure that for the above Gaussian system there exists an invariant probability distribution of the state process which is denoted by $X(t) \in G(0, Q_X)$ where the matrix $Q_X = Q_X^T > 0$ is the unique solution of the discrete Lyapunov equation, $$Q_X = AQ_X A^T + MQ_V M^T. \quad (11)$$

and an invariant probability distribution of the output process $Y(t) \in G(0, Q_Y)$ with $$Q_Y = CQ_X C^T + NQ_V N^T. \quad (12)$$

The tuple $(Y_1, Y_2)$ of stationary jointly-Gaussian processes may then have an invariant probability distribution $Y(t) \in G(0, Q_Y)$. From this point onwards analogous algorithms to Algorithms 1-4 of the previous section can be obtained for the stationary jointly-Gaussian processes $(Y_1, Y_2)$. One data source or two data sources may generate a pair of data sequences $(Y_1^N, Y_2^N) \triangleq \{\{\hat{Y}_{1,i}, \hat{Y}_{2,i}\}_{i=1}^N\}$, with jointly independent components, $Y_{1,i}, Y_{2,i}$ according to the joint probability distribution $P_{Y_{1,i},Y_{2,i}}(y_{1,i}, y_{2,i}) \triangleq P_{Y1,i,Y2,i}(y_{1,i}, y_{2,i})$, where the components take values $(Y_{1,i}, Y_{2,i}) = (y_{1,i}, y_{2,i}) \in Y_1 \times Y_2$. The alphabet spaces $Y_1$ and $Y_2$ can be finite sets, finite dimensional Euclidean spaces, or arbitrary spaces.

Lossy compression coding techniques may be consistent with the communication network 100 of FIG. 1, under the following requirements.

1. An encoder takes as is input the data sequences $(Y_1^N, Y_2^N)$ and produces at its output three messages $(W_0, W_1, W_2)$, there are three channels, Channel 0, Channel 1, Channel 2, with capacities $(C_0, C_1, C_2)$, respectively, to transmit the messages to two decoders: Channel 0 is a public channel and channel 1 and channel 2 are the private channels which connect the encoder to each of the two decoders. Of the three messages, message $W_0$ is a "common" or "public" message that is transmitted through the public channel 0 with capacity $C_0$, to decoder 1 and decoder 2, $W_1$ is a "private" message, which is transmitted though the "private" channel 1 with capacity $C_1$, to decoder 1, and $W_2$ is a "private" message, which is transmitted though the "private" channel 2 with capacity $C_2$, to decoder 2.

2. Decoder 1 reproduces $Y_1^N$ by $\hat{Y}_2^N$ subject to an average distortion and decoder 2 reproduces reproduce $Y_2^N$ by $\hat{Y}_2^N$ subject to an average distortion, where $(Y_{1,i}, Y_{2,i}) = (y_{1,i}, y_{2,i}) \in \hat{Y}_1 \times \hat{Y}_2, i = 1, \ldots, N$, and the alphabet spaces $\hat{Y}_1$ and $\hat{Y}_2$ are arbitrary spaces.

The code of the Gray-Wyner source coding network, is denoted by the parameters $(N, M_0, M_1, M_2, \Delta_{Y1}, \Delta_{Y2})$, and consists of the following elements:

1. An encoder mapping $f^{(E)}$ which generates messages $(W_0, W_1, W_2)$ that take values in message sets $W_j \in \mathcal{M}_j \triangleq \{1, \ldots, |M_j|\}, j=0, 1, 2,$ by $$f^{(E)}(Y_1^N, Y_2^N) = (W_0, W_1, W_2). \quad (13)$$

2. A pair of decoder mappings $(f_{Y_1}^{(D)}, f_{Y_2}^{(D)})$ which generates the reconstructions $(\hat{Y}_1^N, \hat{Y}_2^N)$ of $(Y_1^N, Y_2^N)$ by $$\hat{Y}_1^N = f_{Y_1}^{(D)}(W_0, W_1) \quad (14)$$

$$\hat{Y}_2^N = f_{Y_2}^{(D)}(W_0, W_2) \quad (15)$$

3. An encoder-decoder average fidelity or distortion $(\Delta_{Y_1}, \Delta_{Y_2})$, where $$\Delta_{Y_1} = E\{D_{Y_1}(Y_1^N, \hat{Y}_1^N)\}, \Delta_{Y_2} = E\{D_{Y_2}(Y_2^N, \hat{Y}_2^N)\} \quad (16)$$

and the non-negative distortion functions $D_{Y_1}(.,.), D_{Y_2}(.,.)$ are single-letter given by $$D_{Y_1}(y_1^N, \hat{y}_1^N) = \frac{1}{N} \sum_{i=1}^{N} d_{Y_1}(y_{1,i} - \hat{y}_{1,i})^2, \quad (17)$$

$$D_{Y_2}(y_2^N, \hat{y}_2^N) = \frac{1}{N} \sum_{i=1}^{N} d_{Y_2}(y_{2,i} - \hat{y}_{2,i})^2. \quad (18)$$

There are two operational definitions of the code $(N, M_0, M_1, M_2, \Delta_{Y_1}, \Delta_{Y_2})$, the lossy and the loss-less. These are defined below.

(a) The Gray-Wyner Lossy Rate Region. For any $\Delta_1 \geq 0$, $\Delta_2 \geq 0$, a rate-triple $(R_0, R_1, R_2)$ is said to be $(\Delta_1, \Delta_2)$—achievable if, for arbitrary $\varepsilon > 0$ and N sufficiently large, there exists a code $(N, \mathcal{M}_0, \mathcal{M}_1, \mathcal{M}_2, \Delta_{Y1}, \Delta_{Y2})$ such that $$M_i \leq 2^{N(R_i + \varepsilon)}, i = 0, 1, 2, \quad (19)$$

$$\Delta_{Y_1} \leq \Delta_1 + \varepsilon, \Delta_{Y_2} \leq \Delta_1 + \varepsilon. \quad (20)$$

The set of all $(\Delta_1, \Delta_2)$—achievable rate-triples $(R_0, R_1, R_2)$ is called the achievable Gray-Wyner lossy rate region and it is denoted by $\mathcal{R}_{GW}(\Delta_1, \Delta_2)$.

(b) Gray-Wyner Lossless Rate Region. Suppose $\hat{\gamma}_1 = \gamma_1$, $\hat{\gamma}_2 = \gamma_2$ are sets of finite cardinality, $D_{Y_1} = D_{Y_2}$, is the Hamming distance, and $\Delta_1 = \Delta_2 = 0$. Then $\mathcal{R}_{GW}(\Delta_1, \Delta_2)$ in (a) reduces to the achievable region of the Gray-Wyner lossless rate region, and it is denoted by $\mathcal{R}_{GW}$.

The convex closure of the rate triples may be completely defined by the lower boundary of the rate region:

$$\overline{\mathcal{R}}_{GW}(\Delta_1,\Delta_2) = \{(R_0,R_1,R_2) \in \mathcal{R}_{GW}(\Delta_1,\Delta_2) : (\hat{R}_0, \hat{R}_1, \hat{R}_2) \in \mathcal{R}_{GW}(\Delta_1,\Delta_2), \hat{R}_0 \leq R_i, (i=0,1,2) \rightarrow \hat{R}_i = R_i (i=0,1,2)\}. \quad (21)$$

A given a pair of jointly independent sequences $(Y_1^N, Y_2^N)$, generated from the joint probability distribution $(Y_{1,i}, Y_{2,i}) \sim P_{Y_1,Y_2}(y_1,y_2) \equiv p_{Y_1,Y_2}, i=1, \ldots, N$, and a network with capacity triple $(C_0, C_1, C_2)$, then the sequences $Y_1^N$ and $Y_2^N$ can be reliably reconstructed by $\hat{Y}_1^N$ and $\hat{Y}_2^N$, respectively, subject to an average distortion of less than or equal to $\Delta_1$ and $\Delta_2$ respectively, if and only if the capacity triple $(C_0, C_1, C_2)$ lies above $\overline{\mathcal{R}}_{GW}(\Delta_1, \Delta_2)$. Hence, $\overline{\mathcal{R}}_{GW}(\Delta_1, \Delta_2)$ defines those capacity triples $(C_0, C_1, C_2)$ which are necessary and sufficient for reliable communication over channel 0, channel 1, and channel 2.

To achieve any rate triple $(R_0, R_1, R_2)$ that lies on the Gray-Wyner lower boundary of the rate region $\overline{\mathcal{R}}_{GW}(\Delta_1, \Delta_2)$, the capacity of channel 0 $(C_0)$ should be prioritized and used as the information "common" to both $Y_1^N$ and $Y_1^N$. Accordingly, one may design a coding scheme based on the identification of a sequence of random variables $W^N$, called "auxiliary" random variables that represent the information transmitted over the common channel 0, and they showed that any rate triple $(R_0, R_1, R_2) \in \overline{\mathcal{R}}_{GW}(\Delta_1, \Delta_2)$ can be achieved by optimizing over the choice of random variables $W^N$, i.e., the choice of joint distributions $P_{Y_1^N,Y_2^N,W^N}(y_1^N, y_2^N, w^N)$ having marginal $P_{Y_1^N,Y_2^N}(y_1^N, y_2^N)$ The characterization of the (achievable) Gray-Wyner rate region $\mathcal{R}_{GW}(\Delta_1, \Delta_2)$ and the Gray-Wyner (achievable)

lower boundary of the rate region $\bar{\mathcal{R}}_{GW}(\Delta_1, \Delta_2)$ may be determined by invoking Shannon's information theoretic measures, and specifically, the rate distortion theory.

A pair of jointly independent sequences $(Y_1^N, Y_2^N)$, generated from the joint probability distribution $(Y_{1,i}, Y_{2,i})$ $\sim P_{Y_1,Y_2}(y_1, y_2) \equiv P_{Y_1,Y_2}$, $i=1, \ldots, N$ may be represented as a triple. Joint sequences $(Y_1^N, Y_2^N, W^N)$ generated from the joint probability distribution $(Y_{1,i}, Y_{2,i}, W_i) \sim P_{Y_1,Y_2,W}(y_1, y_2, w) \equiv P_{Y_1,Y_2,W}$, $i=1, \ldots, N$ that have marginal $(Y_{1,i}, Y_{2,i}) \sim P_{Y_1,Y_2,W}(Y_1, Y_2, \infty) \equiv P_{Y_1,Y_2}$, $i=1, \ldots, N$, are jointly independent random variables.

The characterization of the Gray-Wyner rate region $\mathcal{R}_{GW}(\Delta_1, \Delta_2)$ and the Gray-Wyner $\bar{\mathcal{R}}$ lower boundary of the rate region $\bar{\mathcal{R}}_{GW}(\Delta_1, \Delta_2)$ in terms of rate distortion theory is described below.

The joint rate distortion function may be defined by:

$$R_{Y_1,Y_2}(\Delta_1, \Delta_2) = \inf_{P_{\hat{Y}_1,\hat{Y}_2|Y_1,Y_2}: E\{d_{Y_1}(Y_1,\hat{Y}_1)\} \leq \Delta_1, E\{d_{Y_2}(Y_2,\hat{Y}_2)\} \leq \Delta_2} I(Y_1, Y_2; \hat{Y}_1, \hat{Y}_2) \quad (22)$$

where $I(Y_1, Y_2; \hat{Y}_1, \hat{Y}_2)$ is the mutual information between $(Y_1, Y_2)$ and $(\hat{Y}_1, \hat{Y}_2)$, and the expectation is taken with respect to the joint distribution $P_{Y_1,Y_2,\hat{Y}_1,\hat{Y}_2} = P_{\hat{Y}_1,\hat{Y}_2|Y_1,Y_2} P_{Y_1,Y_2}$. The interpretation is that $R_{Y_1,Y_2}(\Delta_1, \Delta_2)$ is the minimum rate of reconstructing $(Y_1^N, Y_2^N)$ by $(\hat{Y}_1^N, \hat{Y}_2^N)$ subject to an average distortion of less than or equal to $(\Delta_1, \Delta_2)$ for sufficiently large N.

Similarly, the marginal rate distortion functions may be defined by:

$$R_{Y_1}(\Delta_1) = \inf_{P_{\hat{Y}_1|Y_1}: E\{d_{Y_1}(Y_1,\hat{Y}_1)\} \leq \Delta_1} I(Y_1; \hat{Y}_1), \quad (23)$$

$$R_{Y_2}(\Delta_2) = \inf_{P_{\hat{Y}_2|Y_2}: E\{d_{Y_2}(Y_2,\hat{Y}_2)\} \leq \Delta_2} I(Y_2; \hat{Y}_2). \quad (24)$$

Another rate distortion function which may play a role in the formal description of $\mathcal{R}_{GW}(\Delta_1, \Delta_2)$, is the conditional rate distortion function. Assuming $P_{Y_1,Y_2,W}(y_1,y_2,w)$ is a joint probability distribution on $Y_1 \times Y_2 \times W$, where W is arbitrary, such that the $Y_1 \times Y_2$ marginal probability distribution satisfies $P_{Y_1,Y_2,W}(y_1,y_2,\infty) = P_{Y_1,Y_2}(y_1,y_2)$, the conditional rate distortion function of random variables $(Y_1, Y_2)$ conditioned on the random variable W is defined by:

$$R_{Y_1,Y_2|W}(\Delta_1, \Delta_2) = \inf_{P_{\hat{Y}_1,\hat{Y}_2|Y_1,Y_2,W}: E\{d_{Y_1}(Y_1,\hat{Y}_1)\} \leq \Delta_1, E\{d_{Y_2}(Y_2,\hat{Y}_2)\} \leq \Delta_2} I(Y_1, Y_2; \hat{Y}_1, \hat{Y}_2 | W) \quad (25)$$

where $I(Y_1, Y_2; \hat{Y}_1, \hat{Y}_2|W)$ is the conditional mutual information between $(Y_1, Y_2)$ and $(\hat{Y}_1, \hat{Y}_2)$ conditioned on W. Consequently, $R_{Y_1,Y_2|W}(\Delta_1, \Delta_2)$ is the minimum rate of reconstructing $(Y_1^N, Y_2^N)$ by $(\hat{Y}_1^N, \hat{Y}_2^N)$ subject to an average distortion of less than or equal to $(\Delta_1, \Delta_2)$ for sufficiently large N, when both encoders and decoders know $W^N$.

Similarly, the conditional marginal rate distortion functions may be defined by:

$$R_{Y_1|W}(\Delta_1) = \inf_{P_{\hat{Y}_1|Y_1,W}: E\{d_{Y_1}(Y_1,\hat{Y}_1)\} \leq \Delta_1} I(Y_1; \hat{Y}_1 | W), \quad (26)$$

$$R_{Y_2|W}(\Delta_2) = \inf_{P_{\hat{Y}_2|Y_2,W}: E\{d_{Y_2}(Y_2,\hat{Y}_2)\} \leq \Delta_2} I(Y_2; \hat{Y}_2 | W). \quad (27)$$

The following lower bound on the Gray-Wyner lossy rate $\mathcal{R}_{GW}(\Delta_1, \Delta_2)$ may be defined for the processes defined by Eqs. (1)-(6): $\mathcal{R}$ If $(R_0, R_1, R_2) \in \mathcal{R}_{GW}(\Delta_1, \Delta_2)$, then $$R_0 + R_1 + R_2 \geq R_{Y_1,Y_2}(\Delta_1, \Delta_2). \quad (28)$$

$$R_0 + R_1 \geq R_{Y_1}(\Delta_1), \quad (29)$$

$$R_0 + R_2 \geq R_{Y_2}(\Delta_2). \quad (30)$$

The inequality in Eq. 28 may be called the "Pangloss Bound" of the Gray-Wyner lossy rate region $\mathcal{R}_{GW}(\Delta_1, \Delta_2)$. The set of triples $(R_0, R_1, R_2) \in \mathcal{R}_{GW}(\Delta_1, \Delta_2)$ that satisfy the equality $R_0 + R_1 + R_2 = R_{Y_1,Y_2}(\Delta_1, \Delta_2)$ for some joint distribution for some joint distribution $P_{Y_1,Y_2,W}(Y_1, Y_2, w)$ may be called the "Pangloss Plane" of the Gray-Wyner lossy rate region $\mathcal{R}_{GW}(\Delta_1, \Delta_2)$, and corresponds to the case when the auxiliary RV W or common information is prioritized.

A coding scheme which uses the auxiliary RV W to represent the information transported over channel 0 may achieve any rate triple $(R_0, R_1, R_2) \in \bar{\mathcal{R}}_{GW}(\Delta_1, \Delta_2)$ by optimizing over the choice of W. Processes defined by Eqs. (1)-(6) define the family of probability distributions:

$$\mathcal{P} \triangleq \{P_{Y_1,Y_2,W}(y_1,y_2,w), y_1 \in \gamma_1, y_2 \in \gamma_2, w \in \mathcal{W}: P_{Y_1,Y_2,W}(y_1,y_2,\infty) = P_{Y_1,Y_2,W}(y_1,y_2)\} \quad (31)$$

for some RV W, i.e., such that the joint probability distribution $P_{Y_1,Y_2,W}(y_1,y_2,w)$ on $Y_1 \times Y_2 \times W$, has $(Y_1, Y_2)$—marginal probability distribution $P_{Y_1,Y_2}(y_1, y_2)$ on $Y_1 \times Y_2$ that coincides with the probability distribution of $(Y_1, Y_2)$.

Each $P_{Y_1,Y_2,W}$ in the set of Eq. 31 defines three RVs $(Y_1, Y_2, W)$ as described above.

Suppose there exists $\hat{y}_1 \in \gamma_1$ and $\hat{y}_2 \in \gamma_2$ such that $E\{d_{Y_i}(Y_i, \hat{y}_i)\} < \infty$, $i=1, 2$.

For each $P_{Y_1,Y_2,W} \in \mathcal{P}$ and $\Delta_1 \geq 0$, $\Delta_2 \geq 0$, define the subset of Euclidean 3-dimensional space $$\mathcal{R}_{GW}^{P_{Y_1,Y_2,W}}(\Delta_1, \Delta_2) = \{(R_0, R_1, R_2) : R_0 \geq I(Y_1, Y_2; W), \quad (32)$$
$$R_1 \geq R_{Y_1|W}(\Delta_1), R_2 \geq R_{Y_2|W}(\Delta_2)\}.$$

Let $$\mathcal{R}_{GW}^*(\Delta_1, \Delta_2) = \left(\bigcup_{P_{Y_1,Y_2,W} \in \mathcal{P}} \mathcal{R}_{GW}^{P_{Y_1,Y_2,W}}(\Delta_1, \Delta_2)\right)^c \quad (33)$$

where $(.)^c$ the closure of the set. Then the achievable Gray-Wyner lossy rate region is given by $$\mathcal{R}_{GW}(\Delta_1,\Delta_2) = \overline{\mathcal{R}}_{GW}(\Delta_1,\Delta_2).$$

It follows that $\mathcal{R}_{GW}(\Delta_1, \Delta_2)$ is completely described by a single coding scheme that uses the RV W. Moreover, the following statements hold:

(1) Since $\mathcal{R}_{GW}(\Delta_1, \Delta_2)$ is convex $\mathcal{R}_{GW}(\Delta_1, \Delta_2)$ is also convex.

(2) The family of distributions in the set of Eq. 31 corresponds the family of "test distributions" $P_T$ defined by:

$$\mathcal{P}_T \triangleq \{P_{W|Y_1,Y_2}(w|y_1,y_2), w \in \mathcal{W}, y_1 \in \mathcal{Y}_1, y_2 \in \mathcal{Y}_2 : \\ P_{W,Y_1,Y_2}(y_1,y_2,w) = P_{W|Y_1,Y_2}(y_1,y_2,w) P_{W|Y_1,Y_2} \\ (y_1,y_2,w) P_{Y_1,Y_2,W}(y_1,y_2,\infty) = P_{Y_1,Y_2}(y_1,y_2)\}. \quad (35)$$

(3) The Gray-Wyner lossy rate region $\mathcal{R}_{GW}(\Delta_1, \Delta_2)$ and its lower boundary $\overline{\mathcal{R}}_{GW}(\Delta_1, \Delta_2)$ may be determined from $$T(\alpha_1, \alpha_2) = \inf_{P_{Y_1,Y_2,W} \in \mathcal{P}} \{I(Y_1, Y_2; W) + \alpha_1 R_{Y_1|W}(\Delta_1) + \alpha_2 R_{Y_2|W}(\Delta_2)\} \quad (36)$$

where $(\alpha_1, \alpha_2)$ are arbitrary real numbers. If $S(\alpha_1, \alpha_2)$ is the set of $(R_0, R_1, R_2) \in \mathcal{R}_{GW}(\Delta_1, \Delta_2)$ that achieve $T(\alpha_1, \alpha_2) \equiv T(\alpha_1, \alpha_2, R_0, R_1, R_2)$ then $\overline{\mathcal{R}}_{GW}(\Delta_1, \Delta_2)$ is a subset of $\bigcup_{(\alpha_1,\alpha_2): 0 \leq \alpha_1, \alpha_2 \leq 1, \alpha_1 + \alpha_2 \geq 1} S(\alpha_1, \alpha_2)$.

An operational definition of the common information between two correlated random variables taking values in finite alphabet spaces may be used. Suppose the data source generates a pair of sequences $(Y_1^N, Y_2^N)$, with values $(Y_{1,i}, Y_{2,i}) = (Y_{1,i}, Y_{2,i}) \in Y_1 \times Y_2$, $i=1, \ldots, N$, where the alphabet spaces $Y_1$ and $Y_2$ are finite sets, and the sequences are jointly independent and identically distributed. The interpretation of Wyner's common information between sequences $Y_1^N$ and $Y_2^N$ may also described using the Gray-Wyner Network, and the operational definition given above. Wyner's common information between $Y_1^N$ and $Y_2^N$ is the smallest $R_0$ such that $(R_0, R_1, R_2) \in \mathcal{R}_{GW}$ and lies on the Pangloss Plane, for some $R_1, R_2$.

The characterization of Wyner's common information may be expressed in terms of Shannon's information theoretic measures. More particularly, the Wyner's common information between two sequences $Y_1^N$ and $Y_2^N$ which are jointly independent and identically distributed $(Y_{1,i}, Y_{2,i}) \sim P_{Y_1,Y_2}(y_1, y_2)$, $i=1, \ldots, N$, may be given by:

$$C_W(Y_1, Y_2) = \inf_{P_{Y_1,Y_2,W}: P_{Y_1,Y_2|W} P_{Y_2|W}} I(Y_1, Y_2; W) \quad (37)$$

where $P_{Y_1,Y_2,W}(y_1, y_2, w)$ is any joint probability distribution on $Y_1 \times Y_2 \times W$ with $(Y_1, Y_2)$—marginal $P_{Y_1,Y_2}(y_1, y_2)$. Equivalently, $C_W(Y_1, Y_2)$ the infimum (or greatest lower bound) of the mutual information $I(Y_1, Y_2; W)$ over all triple of random variable $(Y_1, Y_2, W)$ satisfying:

(W1)

$$\sum_{w \in W} P_{Y_1,Y_2,W}(y_1,y_2,w) = P_{Y_1,Y_2}(y_1,y_2). \quad (38)$$

(W2)

Randmom Variables $Y_1$ and $Y_2$ are (39)
Conditionally Independent Given Random Variable $W$.

Another operational definition of the Wyner's lossy common information between two correlated random variables taking values in arbitrary spaces may be used. For example, Wyner's lossy common information between $(Y_1^N, Y_2^N)$ may be the smallest $R_0$ such that $(R_0, R_1, R_2) \in \mathcal{R}_{GW}(\Delta_1, \Delta_2)$ and lies on the Pangloss Plane, for some $R_1, R_2$. The precise definition of this example is the following:

Consider a Gray-Wyner network. For any $\Delta_1 \geq 0$, $\Delta_2 \geq 0$, a number $R_0$ is said to be $(\Delta_1, \Delta_2)$—achievable if for arbitrary $\varepsilon > 0$ and N sufficiently large, there exists a code $(N, M_0, M_1, M_2, \Delta_{Y_1}, \Delta_{Y_2})$ such that $$M_0 \leq 2^{NR_0}, \quad (40)$$

$$\sum_{i=0}^{2} \frac{1}{N} \log M_i \leq R_{Y_1 Y_2}(\Delta_1, \Delta_2) + \varepsilon, \quad (41)$$

$$\Delta_{Y_1} \leq \Delta_1 + \varepsilon, \; \Delta_{Y_1} \leq \Delta_1 + \varepsilon. \quad (42)$$

The infimum of all $R_0$ that are $(\Delta_1, \Delta_2)$ achievable for some rates $R_1, R_2$, denoted by $C_W(Y_1, Y_2; \Delta_1, \Delta_2)$ may be called Wyner's lossy common information between $Y_1^N$ and $Y_2^N$.

The sum rate bound in Eq. (41) may be called the Pangloss Bound of the lossy Gray-Wyner network. That is, $C_W(Y_1, Y_2; \Delta_1, \Delta_2)$ is the minimum common message rate for the Gray-Wyner network with sum rate $R_{Y_1,Y_2}(\Delta_1, \Delta_2)$ while satisfying the average distortion constraints.

A characterization of Wyner's lossy common information that is expressed in terms of Shannon's information theoretic measures may be provided. For example, the Wyner's lossy common information between two sequences $Y_1^N$ and $Y_2^N$ which are jointly independent and identically distributed $(Y_{1,i}, Y_{2,i}) \sim P_{Y_1,Y_2}(y_1, y_2)$, $i=1, \ldots, N$, is given by:

$$C_W(Y_1, Y_2; \Delta_1, \Delta_2) = \inf\{I(Y_1, Y_2; W) : P_{Y_1,Y_2,\hat{Y}_1,\hat{Y}_2,W} \\ \text{satisfies } (W3)\text{-}(W7)\} \quad (43)$$

where:

$(W3)$. $P_{Y_1,Y_2,\hat{Y}_1,\hat{Y}_2,W}(y_1,y_2,\infty,\infty,\infty) = P_{Y_1,Y_2}(y_1,y_2),$ (44)

$(W4)$. random variables $\hat{Y}_1$ and $\hat{Y}_2$ are conditionlly independent given random variable $W$, (45)

$(W5)$. random variables $(Y_1, Y_2)$ and $W$ are conditionally independent given random variables $(\hat{Y}_1, \hat{Y}_2)$, (46)

$(W6)$. $P_{Y_1,Y_2,\hat{Y}_1,\hat{Y}_2,W}(y_1,y_2,\hat{y}_1,\hat{y}_2,w) = P^*_{Y_1,\hat{Y}_2|Y_1,Y_2,W} \\ (\hat{y}_1, \hat{y}_2|y_1, y_2, w) P_{Y_1,Y_2}(y_1,y_2),$ (47)

$(W7)$. $P^*_{Y_1,\hat{Y}_2|Y_1,Y_2}(\hat{y}_1,\hat{y}_2|y_1,y_2,w)$ is the distribution corresponding to rate distortion function $R_{Y_1,Y_2}(\Delta_1,\Delta_1)$. (48)

An alternative characterization of Wyner's lossy common information $C_W(Y_1, Y_2; \Delta_1, \Delta_2)$ is the following:

If there exists $\hat{y}_1 \in \hat{Y}_1$ and $\hat{y}_2 \in \hat{Y}_2$ such that $E\{d_{Y_i}(Y_i,\hat{y}_i)\} < \infty$, $i=1, 2$, then Wyner's common information $C_W(Y_1, Y_2; \Delta_1, \Delta_2)$ is given by $$\inf I(Y_1, Y_2; W) \quad (49)$$

such that the identity holds $$R_{Y_1}(\Delta_1) + R_{Y_2|W}(\Delta_2) + I(Y_1, |Y_2; W) = R_{Y_1,Y_2}(\Delta_1,\Delta_2). \quad (50)$$

Additional or alternative characterizations of Wyner's common information or Wyner's lossy common information are possible.

Generally, the present disclosure may be applied to methods and algorithms to compute the Gray-Wyner lossy rate region $\mathcal{R}_{GW}(\Delta_1, \Delta_2)$, its lower boundary $\bar{\mathcal{R}}_{GW}(\Delta_1, \Delta_2)$, and Wyner's lossy common information $C_W(Y_1, Y_2; \Delta_1, \Delta_2)$, for two sequences $\{(Y_{1,i}, Y_{2,i})\}_{i=1}^{N}$ of jointly independent, Gaussian distributed multivariate vectors with square error fidelity, as defined by (1)-(6), and analogous expressions for the representation (7) and (8). The methods and algorithms may also apply to multivariate vectors with other distributions. For the processes defined by (1)-(6), the methods and algorithms include computations of $\mathcal{R}_{GW}(\Delta_1, \Delta_2)$, $\bar{\mathcal{R}}_{GY}(\Delta_1, \Delta_2)$, and $C_W(Y_1, Y_2; \Delta_1, \Delta_2)$ using the various information measures discussed above. For the processes defined by representation (7) and (8) the methods and algorithms are analogous to those of processes (1)-(6), but the information measures are replaced by those of stationary processes.

Algorithms 1-4 discussed are now briefly discussed in relation to rate distortion theory. The disclosure describes a systematic network compression encoder and decoder system for data sources that generate two streams of correlated multivariate vectors that may be modeled as Gaussian sequences, that preserves the low complexity of standard non-network coding while operating near the Shannon performance limit as defined by the Gray-Wyner lossy rate region $\mathcal{R}_{GW}(\Delta_1, \Delta_2)$, its lower boundary $\bar{\mathcal{R}}_{GW}(\Delta_1, \Delta_2)$, and Wyner's lossy common information $C_W(Y_1, Y_2; \Delta_1, \Delta_2)$, and described above, and their generalizations to stationary processes.

Embodiments of the discussed algorithms, may be implemented in communication systems of transmitting correlated multivariate Gaussian sequences, in mass storage devices and in other systems that will be apparent to those of ordinary skill in the art.

Accordingly, a network compression encoding assembly may be implemented by an electrical circuit and/or by a processor with access to a computer readable storage medium storing instructions that are executable by the processor to implement a network coding method with a systematic encoder that efficiently compresses the data prior to transmission.

Some aspects of Algorithm 3 are presented below to compute the rate triple $(R_0, R_1, R_2)$ that lies is the Pangloss plane of the Gray-Wyner lossy rate region $\mathcal{R}_{GW}(\Delta_1, \Delta_2)$, using the canonical variable form of processes (1)-(6), and the rate distortion functions of independent Gaussian random variables with zero mean and variance represented by the canonical singular values, subject, for example, to a mean square error (MSE) distortion criteria.

First, a basis transformation may be applied to a tuple of vector sequences defined by (1)-(5) to transform them into the canonical variable form of the tuple, that is expressed in terms of canonical singular values of the tuple. The basis transformation is a nonsingular transformation that is equivalent to a pre-encoder that maps sequences of data $(Y_1^N, Y_2^N)$ into their canonical variable form.

The rate triple $(R_0, R_1, R_2)$ that lies in the Pangloss plane of the Gray-Wyner lossy rate region may be computed from two rate distortion functions of n independent Gaussian random variables with zero mean and variance $(1-d_i) \in (0,1)$, where $d_i$ are the canonical singular values or canonical correlation coefficients, subject to MSE distortion functions, for $i=1, \ldots, n$, for a specific pre-computed dimension $n \leq \min\{p_1, p_2\}$. These are given by:

$$R_1 \geq R_{Y_1|W}(\Delta_1) = R_{Z_1}(\Delta_1) = \frac{1}{2}\sum_{j=1}^{n} \log\left(\frac{(1-d_j)}{\Delta_{1,j}}\right) = \sum_{j=1}^{n} R_{Z_{1,j}}(\Delta_{1,j}), \quad (51)$$

where (52)

$$\Delta_{1,j} = \begin{cases} \lambda, & \lambda \leq 1 - d_j \\ 1 - d_j, & \lambda \geq 1 - d_j \end{cases}, \text{ and}$$

$$\sum_{j=1}^{n} \Delta_{1,j} = \Delta_1, \quad \Delta_1 \in (0, \infty)$$

$$R_2 \geq R_{Y_2|W}(\Delta_2) = R_{Z_2}(\Delta_2) = \frac{1}{2}\sum_{j=1}^{n} \log\left(\frac{(1-d_j)}{\Delta_{2,j}}\right) = \sum_{j=1}^{n} R_{Z_{2,j}}(\Delta_{2,j}), \quad (53)$$

where (54)

$$\Delta_{2,j} = \begin{cases} \lambda, & \lambda \leq 1 - d_j \\ 1 - d_j, & \lambda \geq 1 - d_j \end{cases}, \text{ and}$$

$$\sum_{j=1}^{n} \Delta_{2,j} = \Delta_2, \quad \Delta_2 \in (0, \infty).$$

If $R_0$ is such that $(R_0, R_1, R_2) \in \mathcal{R}_{GW}(\Delta_1, \Delta_2)$ and lies on the Pangloss Plane, then:

$$R_0 = I(Y_1, Y_2; W) = H^{cvf}(Y_1, Y_2) - H(Z_1) - H(Z_2) = \frac{1}{2}\sum_{i=1}^{n} \log\left(\frac{1+d_i}{1-d_i}\right) \quad (55)$$

where $H^{cvf}(Y_1, Y_2)$ us the differential entropy of $(Y_1, Y_2)$ expressed in canonical variable form, and $H(Z_i)$ is the differential entropy of $Z_i$, $i=1, 2$.

Moreover, $(R_1, R_2, R_0)$ may satisfy:

$$R_0 + R_1 + R_2 \geq R_{Y_1, Y_2}(\Delta_1, \Delta_2) = I(Y_1, Y_2; W) + R_{Y_1|W}(\Delta_1) + R_{Y_2|W}(\Delta_2). \quad (56)$$

and $(\Delta_1, \Delta_2)$ must lie in a region specified by the validity of Eq. 56.

The above techniques may be used to generate messages $(W_1, W_1, W_2)$, and to compute the achievable region for the lossy Gray-Wyner network, i.e., $\mathcal{R}_{GW}(\Delta_1, \Delta_2)$, the smallest $R_0$ such that $(R_0, R_1, R_2) \in \mathcal{R}_{GW}(\Delta_1, \Delta_2)$ and lies on the Pangloss Plane, for some $R_1$, $R_1$, and to compute Wyner's lossy common information $C_W(Y_1, Y_2; \Delta_1, \Delta_2)$.

Of the three messages $(W_0, W_1, W_2)$, the encoder may transmit message $W_0$ over a noiseless channel of capacity $R_0$, to two decoders. Additionally, the encoder may transmit the private message $W_1$ over n independent parallel noiseless channels each of rate $R_{z_{1,j}}(\Delta_{1,j})$ to one decoder, and the encoder transmits the private message $W_2$ over n independent parallel noiseless channels each of rate $R_{z_{2,j}}(\Delta_{2,j})$ to another decoder. The first decoder may reproduce $Y_2^N$ by $\hat{Y}_1^N$ and subject to a MSE distortion and the second decoder may reproduce $Y_2^N$ by $\hat{Y}_2^N$ subject to a MSE distortion.

The encoder and decoder units may include a paralleled hardware implementation to minimize computational complexity and to achieve the optimal rates that operate at the "Pangloss Plane." The rate triples $(R_0, R_1, R_2)$, may be computed using a so-called water-filling algorithm.

Some aspects of Algorithm 4 may involve a representation of $\hat{Y}_1^N$ at the output of one pre-decoder, and a representation of $\hat{Y}_2^N$ at the output of another pre-decoder, each consists of two independent parts; the signal $D^{1/2}X$ that is common to both, and their private parts that may be realized by parallel additive Gaussian noise channels, with the rates described above.

A variety of compression and quantization techniques such as, joint entropy coded dithered quantization (ECDQ) and lattice codes, etc., that the pre-decoder reproduction sequences $(\hat{Y}_1^N, \hat{Y}_2^N) = \{(\hat{Y}_{1,i}, \hat{Y}_{2,i})\}_{i=1}^N$, where $(\hat{Y}_{1,i}, \hat{Y}_{2,i})$ are jointly independent and distributed according to Algorithm 4, may be used to produce the messages $(W_1, W_2, W_0)$. For example, ECDQ, lattice codes techniques, may be used to construct the compressed messages $(W_1, W_2, W_0)$.

The following describes methods and algorithms that may be implemented to compute the Gray-Wyner lossy rate region $\mathcal{R}_{GW}(\Delta_1, \Delta_2)$, its lower boundary $\bar{\mathcal{R}}_{GW}(\Delta_1, \Delta_2)$, and Wyner's lossy common information $C_W(Y_1, Y_2; \Delta_1, \Delta_2)$, for two sequences $\{(Y_{1,i}, Y_{2,i})\}_{i=1}^N$ of jointly independent, Gaussian distributed multivariate vectors with square error fidelity, as defined by (1)-(6), and for two output processes $(Y_1^N, Y_2^N)$ that are generated by the representations as described above. The methods and algorithms include computations of $\mathcal{R}_{GW}(\Delta_1, \Delta_2)$, $\bar{\mathcal{R}}_{GW}(\Delta_1, \Delta_2)$, and information $C_W(Y_1, Y_2; \Delta_1, \Delta_2)$ using the information measures of described above.

In accordance with established convention in mathematics, and probability, the following definitions may be used:

$\mathbb{Z}_+ \triangleq (\{1, 2, \ldots,\}$: the set of the positive integers.

$\mathbb{N} \triangleq \{(0, 1, 2, \ldots,\}$: the set of natural integers.

$\mathbb{Z}_n \triangleq \{1, 2, \ldots, n\}$: finite subset of the above defined set for $n \in \mathbb{Z}_+$.

$\mathbb{N}_n \triangleq \{0, 1, 2, \ldots, n\}$: finite subset of the above defined set for $n \in \mathbb{Z}_+$.

$\mathbb{R} \triangleq (-\infty, \infty)$: the set of real numbers.

$\mathbb{R}_+ \triangleq [0, \infty)$: the set of real positive numbers.

$(0, \infty) \subset \mathbb{R}$: the set of strictly positive real numbers.

$\mathbb{R}^n$: the vector space of n-tuples of real numbers.

$\mathbb{R}^{n \times m}$: the set of n by m matrices with elements in the real numbers, for n, $m \in \mathbb{Z}_+$.

$Q \geq 0$: a symmetric positive semidefinite matrix $Q \in \mathbb{R}^{n \times n}$.

$Q > 0$: a symmetric positive definite matrix $Q \in \mathbb{R}^{n \times n}$.

$(\Omega, \mathcal{F}, \mathbb{P})$: a probability space consisting of a set $\Omega$, a $\sigma$-algebra $\mathcal{F}$ of the subsets of $\Omega$, and a probability measure $\mathbb{P} \to \mathcal{F}[0,1]$.

X: $\Omega \to \mathbb{R}$: a real-valued random variable defined on some probability space $(\Omega, \mathcal{F}, \mathbb{P})$.

$\mathcal{F}^X$: the $\sigma$-algebra (set of all possible events) generated by a random variable X: $\Omega \to \mathbb{X}$ with values in some arbitrary space $\mathbb{X}$ (i.e., finite set, $\mathbb{R}^n$, etc.).

$\mathbb{E}[X]$: the expectation of some random variable X defined on $(\Omega, \mathcal{F}, \mathbb{P})$.

Two random variables (RVs) $X_1$: $\Omega \to \mathbb{X}_1$ and $X_2$: $\Omega \to \mathbb{X}_2$ defined $(\Omega, \mathcal{F}, \mathbb{P})$, with joint probability distribution $P_{X_1 X_2}(x_1, x_2)$ and marginal probability distributions $P_{X_1}(x_1)$ $P_{X_2}(x_2)$ are called independent if $P_{X_1 X_2}(x_1, x_2) = p_{X_1}(x_1) P_{X_2}(x_2)$. A $\mathbb{R}^n$—valued Gaussian RV with parameters of the mean value $m_x \in \mathbb{R}^n$ and the covariance matrix $Q_X \in \mathbb{R}^{n \times n}$, $Q_X = Q_X^T \geq 0$, where Qx is a function X: $\Omega \to \mathbb{R}^n$ (which is a RV) and such that the probability distribution of this RV equals a Gaussian distribution described by its characteristic function:

$$E[\exp(iu^T X)] = \exp(iu^T m_X - \tfrac{1}{2} Q_X u), \forall u \in \mathbb{R}^n$$

The $\mathbb{R}^n$—valued Gaussian RV may be defined using the following notation:

$X \in G(m_X, Q_X)$: a Gaussian RV X with these parameters.

$\dim(X) = \text{rank}(Q_X)$: the effective dimension of the Gaussian RV X.

In accordance with standard definition, any tuple of RVs $X_1, \ldots, X_k$ is called jointly Gaussian if the vector $(X_1, X_2, \ldots, X_k)^T$ is a Gaussian RV.

A tuple of Gaussian random variables $Y_1: \Omega \to \mathbb{R}^{p_1}$ and $Y_2: \Omega \to \mathbb{R}^{p_2}$ may be denoted by $(Y_1, Y_2)$. The covariance matrix of this tuple may be denoted by, $$(Y_1, Y_2) \in G(0, Q_{(Y_1, Y_2)}), \tag{57}$$

$$Q_{(Y_1, Y_2)} = \begin{pmatrix} Q_{Y_1} & Q_{Y_1, Y_2} \\ Q_{Y_1, Y_2}^T & Q_{Y_2} \end{pmatrix} \in \mathbb{R}^{(p_1+p_2) \times (p_1+p_2)}. \tag{58}$$

The covariance matrices $Q_{(Y_1, Y_2)}$ and $Q_{Y_1, Y_2} \in \mathbb{R}^{p_1 \times p_2}$ are distinct from each other. Any such tuple of Gaussian RVs is independent if and only if $Q_{Y_1, Y_2} = 0$.

The following definitions and properties may apply for purposes of discussion herein. A conditional expectation of a Gaussian RV X: $\Omega \to \mathbb{R}^n$ conditioned on another Gaussian RV Y: $\Omega \to \mathbb{R}^p$ with $(X,Y) \in G(m, Q_{(X,Y)})$ and with $Q_Y > 0$ is, again a Gaussian RV with characteristic function, $$E[\exp(iu^T X) | Y] = \exp(iu^T E[X|Y] - \tfrac{1}{2} u^T Q(X|Y) u), \tag{59}$$

$\forall u \in \mathbb{R}^n$, where, $$Q_{(X,Y)} = \begin{pmatrix} Q_X & Q_{X,Y} \\ Q_{X,Y}^T & Q_Y \end{pmatrix},$$

$$E[X | Y] = Q_{X,Y} Q_Y^{-1} (Y - m_Y) + m_X, \tag{60}$$

$$Q(X | Y) = Q_X - Q_{X,Y} Q_Y^{-1} Q_{X,Y}^T. \tag{61}$$

Other definitions used in the discussion herein include conditional independence of two RVs given another RV, and minimally Gaussian conditionally-independence, in accordance to the definitions and properties given below:

Consider three RVs, $Y_i: \Omega \to \mathbb{R}^{p_i}$ for $i=1, 2$ and X: $\Omega \to \mathbb{R}^n$ with joint distribution $P_{Y_1, Y_2, X}(y_1, y_2, x)$.

(a) Call the RVs $Y_1$ and $Y_2$ conditionally-independent conditioned on or given X if $$P_{Y_1, Y_2 | X}(y_1, y_2 | x) = P_{Y_1 | X}(y_1 | x) P_{Y_2 | X}(y_2 | x) \tag{62}$$

equivalently $Y_1 \leftrightarrow X \leftrightarrow Y_2$ forms a Markov Chain. (63)

The notation $(Y_1, Y_2 | X) \in CI$ may be used to denote this property.

(b) Call the RVs $Y_1$ and $Y_2$ Gaussian conditionally-independent conditioned on X if (1) $(Y_1, Y_2 | X) \in CI$ and (2) $(Y_1, Y_2 | X)$ are jointly Gaussian RVs The notation $(Y_1, Y_2 | X) \in CIG$ may be used to denote this property.

(c) Call the RVs $(Y_1, Y_2 | X)$ minimally Gaussian conditionally-independent if (1) they are Gaussian conditionally-independent and $\mathbb{R}$
(2) there does not exist another tuple $(Y_1, Y_2, X_1)$ with $X_1$: $\Omega \to \mathbb{R}^{n_1}$ such that $(Y_1, Y_2|X_1) \in CIG$ and $n_1 < n$.
This property may be denoted by $(Y_1, Y_2|X_1) \in CIG_{min}$ The following simple equivalent condition for conditional independence of Gaussian RVs may be used:
Consider a triple of jointly Gaussian RVs denoted as $(Y_1, Y_2, X) \in G(0, Q)$ with $Q_X > 0$. This triple is Gaussian conditionally-independent if and only if $$Q_{Y_1,Y_2} = Q_{Y_1,X} Q_X^{-1} Q_{X,Y_2}. \tag{64}$$

It is minimally Gaussian conditionally-independent if and only if $n = \dim(X) = \text{rank}(Q_{Y_1,Y_2})$.

Another mathematical concept identified in the present disclosure is the weak stochastic realization problem of a Gaussian RV, that corresponds to the solution of the following problem:
Consider a Gaussian distribution $G(0, Q_0)$ on the space $\mathbb{R}^{p_1+p_2}$.
Determine the integer $n \in \mathbb{N}$ and construct all Gaussian distributions on the space $\mathbb{R}^{p_1+p_2+n}$ such that, if $G(0, Q_1)$ is such a distribution with $(Y_1, Y_2, X) \in G(0, Q_1)$, then
(1) $G(0, Q_1)|_{\mathbb{R}^{p_1+p_2}} = G(0, Q_0)$; and
(2) $(Y_1, Y_2|X) \in CIG_{min}$
Here (1) means the indicated RVs $(Y_1, Y_2, X)$ are constructed having the distribution $G(0, Q_1)$ with the dimensions $p_1, p_2, n \in \mathbb{Z}_+$ respectively, with $(Y_1, Y_2)$—marginal distribution $G(0, Q_0)$.

For weak stochastic realization problem a distribution may be constructed. To compute the Gray-Wyner lossy rate region $\mathcal{R}_{GW}(\Delta_1, \Delta_2)$, its lower boundary $\bar{\mathcal{R}}_{GY}(\Delta_1, \Delta_2)$, and Wyner's lossy common information $C_W(Y_1, Y_2; \Delta_1, \Delta_2)$ it may be sufficient (and often necessary) to construct from the two tuple of jointly Gaussian RVs $(Y_1, Y_2)$ a joint distribution $(Y_1, Y_2, W) \in G(Q_{(Y_1,Y_2,W)})$ parametrized by a Gaussian random variable W, such that $(Y_1, Y_2)$ are conditionally independent given W, as defined below:
Consider a tuple of Gaussian RVs specified by $Y = (Y_1, Y_2) \in G(0, Q_{(Y_1,Y_2)})$ with $Y_i: \Omega \to \mathbb{R}^n$ for $i = 1, 2$. Assume there exists a Gaussian RV W: $\Omega \to \mathbb{R}^n$, $W \in G(0, Q_W)$ such that $(Y_1, Y_2, W) \in G(0, Q_{(Y_1,Y_2,W)})$ with $$Q_{(Y_1,Y_2,W)} = \begin{pmatrix} Q_{Y_1,Y_1} & Q_{Y_1,Y_2} & Q_{Y_1,W} \\ Q_{Y_1,Y_2}^T & Q_{Y_2,Y_2} & Q_{Y_2,W} \\ Q_{Y_1,X}^T & Q_{Y_2,W}^T & Q_W \end{pmatrix}.$$

Assume that $Q_W > 0$.

It is shown below how to construct such a random variable W by using the canonical variable form of a tuple of Gaussian RVs.
It is recognized herein that if a Gaussian random variable $W: \Omega \to \mathbb{R}^n$ is constructed, as presented above, then Algorithm 1 can be used to parametrized the Gray-Wyner lossy rate region $\mathcal{R}_{GW}(\Delta_1, \Delta_2)$, its lower boundary $\bar{\mathcal{R}}_{GY}(\Delta_1, \Delta_2)$, and Wyner's lossy common information $C_W(Y_1, Y_2; \Delta_1, \Delta_2)$. Accordingly, Algorithm 1 may parameterize all triples of Gaussian RVs of which the third makes the remaining two variables conditionally independent as follows:
Algorithm 1: Parametrization of all Triples of Gaussian RVs of which the Third Makes the Remaining Two Variables Conditionally Independent.

Consider the above model of a tuple of Gaussian RVs. Assume that there exists a Gaussian RV W with W E G(0, $Q_W$) and $Q_W > 0$, such that $(Y_1, Y_2, W) \in CIG$.
1. Compute first the variables, $$Z_1 = Y_1 - E[Y_1|W] = Y_1 - Q_{Y_1,W} Q_W^{-1} W, \tag{65}$$

$$Z_2 = Y_2 - E[Y_2|W] = Y_2 - Q_{Y_2,W} Q_W^{-1} W, \tag{66}$$

then the triple $(Z_1, Z_2, W)$ of RVs are independent.
2. Represent the tuple of Gaussian RVs $Y = (Y_1, Y_2) \in G(0, Q_{(Y_1,Y_2)})$ by at the output of pre-encoder and prior to the conversion into messages $(W_0, W_1, W_2)$ by $$Y_1 = Q_{Y_1,W} Q_W^{-1} W + Z_1, \tag{67}$$

$$Y_2 = Q_{Y_2,W} Q_W^{-1} W + Z_2, \tag{68}$$

3. Define the reproduction of the tuple of Gaussian RVs $Y = (Y_1, Y_2) \in G(0, Q_{Y_1,Y_2})$ at the output of decoder 1 and decoder 2 by a tuple of Gaussian RVs $\hat{Y} = (\hat{Y}_1, \hat{Y}_2) \in G(0, Q_{(\hat{Y}_1,\hat{Y}_2)})$ given by $$\hat{Y}_1 = Q_{Y_1,W} Q_X^{-1} W + \hat{Z}_1; \tag{69}$$

$$\hat{Y}_2 = Q_{Y_2,W} Q_X^{-1} W + \hat{Z}_2; \tag{68}$$

such that the triple $(\hat{Z}_1, \hat{Z}_2, W)$ of RVs are independent. $\tag{71}$ 4. The square error distortions are invariant and satisfy $$D_{Y_1}(y_1, \hat{y}_1) \triangleq |y_1 - \hat{y}_1|^2 = D_{Z_1}(z_1, \hat{z}_1) \triangleq |z_1 - \hat{z}_1|^2,$$

$$D_{Y_2}(y_2, \hat{y}_2) \triangleq |y_2 - \hat{y}_2|^2 = D_{Z_2}(z_2, \hat{z}_2) \triangleq |z_2 - \hat{z}_2|^2,$$

5. The information rates satisfy the identities $$C_W(Y_1, Y_2; \Delta_1, \Delta_2) = I(Y_1, Y_2; W), \tag{74}$$

$$R_1 \geq R_{Y_1|W}(\Delta_1) = R_{Z_1}(\Delta_1), \tag{75}$$

$$R_2 \geq R_{Y_2|W}(\Delta_2) = R_{Z_2}(\Delta_2), \tag{76}$$

$$R_0 + R_1 + R_2 \geq R_{Y_1,Y_2}(\Delta_1, \Delta_2), \tag{77}$$

$$I(Y_1, Y_2; W) = H(Y_1, Y_2) - H(Z_1) - H(Z_2) \tag{78}$$

$H(Y_1, Y_2)$ is the differential entropy of $(Y_1, Y_2)$, $\tag{79}$ $H(Z_1)$ is the differential entropy of $Z_1$, and $\tag{80}$ $H(Z_2)$ is the differential entropy of $Z_2$, $\tag{81}$ $$R_{Y_1,Y_2}(\Delta_1, \Delta_2) = I(Y_1, Y_2; W) + R_{Z_1}(\Delta_1) + R_{Z_1}(\Delta_2). \tag{82}$$

6. Encode the variables $(W, Z_1, Z_2)$ into corresponding bit rates $(R_0, R_1, R_2)$ with corresponding binary messages $(W_0, W_1, W_2)$ of lengths $(NR_0, NR_1, NR_2)$.
7. Communicate the three bit rates $(R_0, R_1, R_2)$ with corresponding binary messages $(W_0, W_1, W_2)$ via three noiseless channels from the encoder to the two decoders, such that binary sequence $W_0$ is public available to the two decoders with the binary sequence $W_1$ is private available to decoder 1 and the binary sequence $W_2$ is private available to decoder 2.
8. At the decoder side, let decoder 1 convert the bit rates sequences $(W_0, W_1)$ into the reproduction $\hat{Y}_1$ of $Y_1$, and let decoder 2 covert to the bit rates sequences $(W_0, W_2)$ into the reproduction $\hat{Y}_2$ of $Y_2$.

A nonsingular basis transformation. As recognized herein, to identify the random variables $(W, \hat{Z}_1, \hat{Z}_2)$ that are needed in Algorithm 1, the geometric approach for Gaussian random variables and the canonical variable form for a tuple of RV $(Y_1, Y_2)$ may be used. The transformation of the tuple of RV $(Y_1, Y_2)$ into the canonical variable form may be done by applying a basis transformation to such a tuple of RV. Such a basis transformation is equivalent to a pre-encoder that maps sequences of data $(Y_1^N, Y_2^N)$ into its canonical variable form.

The systematic procedure may be implemented using Algorithm 2, as described in more detail below.

A Gaussian RV $Y: \Omega \to \mathbb{R}^p$ may be defined with respect to a particular basis of the linear space. The underlying geometric object of a Gaussian RV $Y: \Omega \to \mathbb{R}^p$ is: the σ-algebra $\mathcal{F}^Y$. A basis transformation of such a RV is then the transformation defined by a nonsingular matrix $S \in \mathbb{R}^{p \times p}$ such that $\mathcal{F}^Y = \mathcal{F}^{SY}$ and the RV SY is Gaussian.

Next consider a tuple of jointly Gaussian RV $(Y_1, Y_2)$. A basis transformation of this tuple consists of a matrix S=Blockdiag $(S_1, S_2)$ with $S_1, S_2$ square and nonsingular matrices such that spaces satisfy $\mathcal{F}^{Y_1} = \mathcal{F}^{S_1 Y_1}$ and $\mathcal{F}^{Y_2} = \mathcal{F}^{S_2 Y_2}$. This transformation introduces an equivalence relation on the representation of the tuple of RVs $(Y_1, Y_2)$. Then one can analyze a canonical form for these spaces.

Below the following problem is considered and the solution provided:

Consider the tuple of jointly Gaussian RVs $Y_1: \Omega \to \mathbb{R}^{P_1}$ and $Y_2: \Omega \to \mathbb{R}^{P_2}$, with $(Y_1, Y_2) \in G(0, Q)$. Determine a canonical form for the spaces $\mathcal{F}^{Y_1}, \mathcal{F}^{Y_2}$ up to linear basis transformations. This problem is further defined and described below.

Consider the tuple of jointly Gaussian RVs $Y_i: \Omega \to \mathbb{R}^{P_i}$, with $Q_{Y_i} > 0$ for i=1, 2. Define the canonical variable form of these RVs if a basis has been chosen and a transformation of the RVs to this basis has been carried out such that with respect to the new basis one has the representation, $$(Y_1, Y_2) \in G(0, Q_{cvf}), \quad (84)$$

$$Q_{cvf} = \begin{pmatrix} I_{p_{11}} & 0 & 0 & I_{p_{21}} & 0 & 0 \\ 0 & I_{p_{12}} & 0 & 0 & D & 0 \\ 0 & 0 & I_{p_{13}} & 0 & 0 & 0 \\ \hline I_{p_{21}} & 0 & 0 & I_{p_{21}} & 0 & 0 \\ 0 & D & 0 & 0 & I_{p_{22}} & 0 \\ 0 & 0 & 0 & 0 & 0 & I_{p_{23}} \end{pmatrix} \in \mathbb{R}^{p \times p},$$

$p, p_1, p_2, p_{11}, p_{12}, p_{13}, p_{21}, p_{22}, p_{23} \in \mathbb{N}$,
$p = p_1 + p_2, p_1 = p_{11} + p_{12} + p_{13}$,
$p_2 = p_{21} + p_{22} + p_{23}, p_{11} = p_{21}, p_{12} = p_{22}$, $$D = \text{Diag}(d_1, \ldots, d_{p_{12}}), 1 > d_1 \geq d_2 \geq \ldots \geq d_{p_{12}} > 0, \quad (85)$$

$$Y = \begin{pmatrix} Y_1 \\ Y_2 \end{pmatrix} = \begin{pmatrix} Y_{11} \\ Y_{12} \\ Y_{13} \\ Y_{21} \\ Y_{22} \\ Y_{23} \end{pmatrix}, Y_{ij}: \Omega \to \mathbb{R}^{p_{ij}}, i = 1, 2, j = 1, 2, 3.$$

Then $$(Y_{11}, \ldots, Y_{1k_1}), (Y_{21}, \ldots, Y_{2k_2})$$

may be called the canonical variables and $(d_1, \ldots, d_{k_{12}})$ the canonical correlation coefficients.

Given $Y_1: \Omega \to \mathbb{R}^{p_1}$ and $Y_2: \Omega \to \mathbb{R}^{p_2}$ that are jointly Gaussian RVs with $(Y_1, Y_2) \in G(Q_{(Y_1, Y_2)})$ and $Q_{Y_i} > 0$, for i=1, 2, then the existence of a nonsingular basis transformation $$S = \text{Block-diag}(S_1, S_2) \in \mathbb{R}^{(p_1+p_2) \times (p_1+p_2)} \quad (86)$$

such that with respect to the new basis $(S_1 Y_1, S_2 Y_2) \in G(0, Q_{cvf})$ has the canonical variable form. Algorithm 2 may be used to transform the covariance matrix of a tuple $Y_1, Y_2 \in G(0, Q)$ into its canonical variable form as discussed in more detail below.

Algorithm 2: Canonical Variable Form.

Transformation of a variance matrix to its canonical variable form.

Data: $p_1, p_2 \in \mathbb{Z}_+$, $Q \in \mathbb{R}^{(p_1+p_2) \times (p_1+p_2)}$, satisfying $Q = Q^T > 0$, with decomposition $$Q = \begin{pmatrix} Q_{11} & Q_{12} \\ Q_{12}^T & Q_{22} \end{pmatrix}, Q_{11} \in \mathbb{R}^{p_1 \times p_1}, Q_{22} \in \mathbb{R}^{p_2 \times p_2}, Q_{12} \in \mathbb{R}^{p_1 \times p_2}.$$

1. Perform singular-value decompositions:

$$Q_{11} = U_1 D_1 U_1^T, Q_{22} = U_2 D_2 U_2^T.$$

with $U_1 \in \mathbb{R}^{p_1 \times p_1}$ orthogonal $(U_1 U_1^T = I = U_1^T U_1)$ and $D_1 = \text{Diag}(d_{1,1}, \ldots, d_{1,p_1}) \in \mathbb{R}^{p_1 \times p_1}$,
$d_{1,1} \geq d_{1,2} \geq \ldots \geq d_{1,p_1} > 0$, and $U_2, D_2$ satisfying corresponding conditions.

2. Perform a singular-value decomposition of $$D_1^{-1/2} U_1^T Q_{12} U_2 D_2^{-1/2} = U_3 D_3 U_4^T,$$

with $U_3 \in \mathbb{R}^{p_1 \times p_1}, U_4 \in \mathbb{R}^{p_2 \times p_2}$ orthogonal and $$D_3 = \begin{pmatrix} I_{p_{11}} & 0 & 0 \\ 0 & D_4 & 0 \\ 0 & 0 & 0 \end{pmatrix} \in \mathbb{R}^{p_1 \times p_2},$$

$D_4 = \text{Diag}(d_{4,1}, \ldots, d_{4,p_{12}}) \in \mathbb{R}^{p_{12} \times p_{12}}$, $1 > d_{4,1} \geq d_{4,2} \geq \ldots \geq d_{4,p_{12}} > 0.$ 3. Compute the new variance matrix according to, $$Q_{cvf} = \begin{pmatrix} I_{p_1} & D_3 \\ D_3^T & I_{p_2} \end{pmatrix}.$$

4. The transformation to the canonical variable representation $(Y_1 \mapsto S_1 Y_1, Y_2 \mapsto S_2 Y_2)$ is then $$S_1 = (U_3^T D_1^{-1/2} U_1^T, S_2 = U_4^T D_2^{-1/2} U_2^T.$$

The patent application discloses the following decomposition of a tuple $(Y_1, Y_2) \in G(0, Q_{cvf})$ into identical, correlated, and independent components.

Consider a tuple $(Y_1, Y_2) \in G(0, Q_{cvf})$ of Gaussian RVs in the canonical variable form.

(a) The three components $Y_{11}, Y_{12}, Y_{13}$ of $Y_1$ are independent RVs. Similarly, the three components $Y_{21}, Y_{22}, Y_{23}$ of $Y_2$ are independent RVs.

(b) The equality $Y_{11} = Y_{21}$ of these RVs holds almost surely.

(c) The tuple of RVs $(Y_{12}, Y_{22})$ is correlated as shown by the formula $$E[Y_{12} Y_{22}^T] = D = \text{Diag}(d_1, \ldots, d_{12}). \quad (87)$$

Note that the different components of $Y_{12}$ and of $Y_{22}$ are independent RVs: thus $Y_{12,i}$ and $Y_{12,j}$ are independent, and $Y_{22,i}$ and $Y_{22,j}$ are independent, and $Y_{12,i}$ and $Y_{22,j}$ are independent, for all $i \neq j$; and that $Y_{12,j}$ and $Y_{22,j}$ for $j=1, \ldots, p_{12}=p_{22}$ are correlated.

(d) The RV $Y_{13}$ is independent of $Y_2$. Similarly, the RV $Y_{23}$ is independent of $Y_1$.

Next the interpretation of the various components of the canonical variable form is defined.

Consider a tuple of jointly-Gaussian RVs $(Y_1, Y_2) \in G(0, Q_{cvf})$ in the canonical variable form defined above. Call the various components as defined in the next table.

| | |
|---|---|
| $Y_{11} = Y_{21}$ | identical component of $Y_1$ with respect to $Y_2$ |
| $Y_{12}$ | correlated component of $Y_1$ with respect to $Y_2$ |
| $Y_{13}$ | independent component of $Y_1$ with respect to $Y_2$ |
| $Y_{21} = Y_{11}$ | identical component of $Y_1$ with respect to $Y_2$ |
| $Y_{22}$ | correlated component of $Y_2$ with respect to $Y_1$ |
| $Y_{23}$ | independent component of $Y_2$ with respect to $Y_1$ |

Next, it is illustrated to a skilled person in the art that a tuple of Gaussian RVs can be brought into a convenient form for implementation by applying the rules stated above to construct a systematic encoder. It is illustrated to a skilled person in the art that all elements of Gray-Wyner lossy rate region $\mathcal{R}_{GW}(\Delta_1, \Delta_2)$, its lower boundary $\bar{\mathcal{R}}_{GW}(\Delta_1, \Delta_2)$, and Wyner's lossy common information $C_W(Y_1, Y_2; \Delta_1, \Delta_2)$, can be computed with the aid of Algorithm 1 and Algorithm 2, by computing entropy, conditional entropy, mutual information, and rate distortion function, joint rate distortion function, and conditional rate distortion function subject to a MSE fidelity, of Gaussian vector RVs.

A method of Calculating Gray-Wyner lossy rate region $\mathcal{R}_{GW}(\Delta_1, \Delta_2)$, $\bar{\mathcal{R}}_{GW}(\Delta_1, \Delta_2)$, and Wyner's lossy common information $C_W(Y_1, Y_2; \Delta_1, \Delta_2)$ is described herein. The discussion uses concepts of a Gaussian RV, of the canonical variable form of a tuple of jointly-Gaussian random variables, of identical, correlated, and private information, and of conditionally-independent Gaussian RVs, as introduced above.

The discussion herein discloses an algorithm called Algorithm 3 broken into Algorithm 3(a) and Algorithm 3(b); Algorithm 3(a) may be used to compute Wyner's lossy common information $C_W(Y_1, Y_2; \Delta_1, \Delta_2)$.

Algorithm 3(a): Wyner's lossy common information $C_W(Y_1, Y_2; \Delta_1, \Delta_2)$.

Consider a tuple of finite-dimensional Gaussian RVs $(y_1, y_2) \in G(0, Q_{(y_1,y_2)})$ as defined in (57), (58).

1. Compute the canonical variable form of the tuple of Gaussian RVs according to Algorithm 2. This yields the indices $p_{11}=p_{21}$, $p_{12}=p_{22}$, $p_{13}$, $p_{23}$, and $n=p_{11}+p_{12}=p_{21}+p_{22}$ and the diagonal matrix D with canonical singular values $d_i \in (0,1)$ for $i=1 \ldots, n$.

2. Compute and output Wyner's lossy common information according to the formula, $$C_W(Y_1, Y_2; \Delta_1, \Delta_2) \qquad (88)$$

$$\begin{cases} 0, & \text{if } 0 = p_{11} = p_{12} = p_{21} = p_{22}, \\ & p_{13} > 0, p_{23} > 0, \\ \frac{1}{2}\sum_{i=1}^{n} \ln\left(\frac{1+d_i}{1-d_i}\right), & \text{if } 0 = p_{11} = p_{12}, p_{12} = p_{22} > | 0, \\ & p_{13} \geq 0, p_{23} \geq 0, \\ \infty, & \text{if } p_{11} = p_{21} > 0, p_{12} = p_{22} \geq 0, \\ & p_{23} \geq 0, p_{23} \geq 0. \end{cases}$$

for $(\Delta_1, \Delta_2)$ that lie in a region specified by the validity of Eq. 56

Algorithm 3(a) produces Wyner's lossy common information of the tuple. This may also be derived from the calculation of the Gray-Wyner lossy rate region presented below.

The computation of the common information may be structured by the concepts of identical, correlated, and private components or information of the two vectors considered. Wyner's lossy common information:

(i) in the first case of equation (88) covers the case in which the RVs $(Y_1, Y_2)$ are independent RVs and there are neither identical nor correlated components, (ii) in the second case of equation (88) covers the case in which there is no identical component, but there are nontrivial correlated components, and there may be independent components, and (iii) in the last case of equation (88) covers the case when there is a nontrivial identical component and, possibly, correlated and independent components.

The discussion herein discloses Algorithm 3(b) that is used to compute the Gray-Wyner lossy rate region $\mathcal{R}_{GW}(\Delta_1, \Delta_2)$, and includes all necessary elements for the implementation of compression or quantization techniques. Some of these elements are summarized below.

Algorithm 3(b): Gray-Wyner Lossy Rate Region $\mathcal{R}_{GW}(\Delta_1, \Delta_2)$.

Consider a tuple of finite-dimensional Gaussian RVs $(Y_1, Y_2) \in G(0, Q_{(Y_1,Y_2)})$ as defined in (57), (58).

1. Compute the representation of the tuple of RVs $(Y_1, Y_2)$ in the canonical variable form, as defined above, by $$(Y_1, Y_2) \in G(0, Q_{(Y_1,Y_2)}), \qquad (89)$$

$$Y_1, Y_2 : \Omega \to \mathbb{R}^n, n \in \mathbb{Z}_+, Q_{y_1,y_2} = \begin{pmatrix} I & D \\ D & I \end{pmatrix}$$

at the output of the pre-encoder into three independent Gaussian RVs $(X, Z_1, Z_2)$ where the individual components of each of these vectors are independent RVs, and $$Z_1 \in G(0,(I-D)), Z_2 \in G(0,(I-D)), X \in G(0,I). \qquad (90)$$

2. Compute the rate triple $(R_0, R_1, R_2)$ that lies is the Pangloss plane of the Gray-Wyner lossy rate region $\mathcal{R}_{GW}(\Delta_1, \Delta_2)$ from two rate distortion functions, and the Wyner's common information, with the first rate distortion function corresponding to (i) the n-dimensional vector of independent Gaussian random variables $Z_1 \in G(0, (I-D))$ subject to square error distortion $D_{Z_1}(z_1, \hat{z}_1) = |z_1 - \hat{z}_1|^2$, given by $$R_1 \geq R_{Z_1}(\Delta_1) = \inf_{P_{\hat{Z}_1|Z_1}: E\{|Z_1-\hat{Z}_1|^2\} \leq \Delta_1} I(Z_1; \hat{Z}_1) = \sum_{j=1}^{n} R_{Z_i,j}(\Delta_{1,j}) \qquad (91)$$

and the second rate distortion function corresponding to (ii) n-dimensional vector of independent Gaussian RVs $Z_2 \in G(0,(I-D))$ subject to square error distortion $D_{Z_2}(z_2, \hat{z}_2) \triangleq |z_2, -\hat{z}_2|^2$, given by $$R_2 \geq R_{Z_2}(\Delta_2) = \inf_{P_{\hat{Z}_2|Z_2}: E\{|Z_2-\hat{Z}_2|^2\} \leq \Delta_2} I(Z_2; \hat{Z}_2) = \sum_{j=1}^{n} R_{Z_2,j}(\Delta_{2,j}) \qquad (92)$$

and Wyner's common information corresponding to (iii) the tuple $(Y_1, Y_2)$ of Gaussian RVs in the canonical variable form, $(Y_1, Y_2) \in G(0, Q_{(Y_1,Y_2)})$, $(Y_1, Y_2)$:

$$\Omega \rightarrow \mathbb{R}^n, n \in \mathbb{Z}_+, Q_{Y_1,Y_2} = \begin{pmatrix} I & D \\ D & I \end{pmatrix}$$

as defined above, given by $$R_0 = I(Y_1, Y_2; X) = H(Y_1, Y_2) - H(Z_i) - H(Z_2). \tag{93}$$

3. The Pangloss plane may be defined by $$R_0 + R_1 + R_2 = R_{Y_1,Y_2}(\Delta_1, \Delta_2), \tag{94}$$

$$= I(Y_1, Y_2; X) + R_{Z_1}(\Delta_1) + R_{Z_2}(\Delta_2). \tag{95}$$

for $(\Delta_1, \Delta_2)$ that lie in a region specified by the validity of Eq. 56

4. Compute the rate triple $(R_0, R_1, R_2)$ that lies the Gray-Wyner lossy rate region $\mathcal{R}_{GW}(\Delta_1, \Delta_2)$ from the two rate distortion functions, (91) and (92) and the additional sum rate $$R_0 + R_1 + R_2 \geq R_{Y_1,Y_2}(\Delta_1, \Delta_2), \tag{96}$$

$$R_{Y_1,Y_2}(\Delta_1, \Delta_2) = I(Y_1, Y_2; X) + R_{Z_1}(\Delta_1) + R_{Z_2}(\Delta_2). \tag{97}$$

5. Compute the representation of the tuple of RVs $(\hat{Y}_1, \hat{Y}_2)$ at the output of the pre-decoder 1 and pre-decoder 2 into three independent random variables $(X, \hat{Z}_1, \hat{Z}_2)$, where the individual components of each of these vectors are independent RVs (the details are shown in Algorithm 4).

The proof that Algorithm 3(b) is correct and produces Wyner's lossy common information of the rate triple $(R_0, R_1, R_2)$ that lies in the Gray-Wyner Lossy Rate Region $\mathcal{R}_{GW}(\Delta_1, \Delta_2)$ and its lower boundary $\overline{\mathcal{R}}_{GW}(\Delta_1, \Delta_2)$ follows directly from the material herein.

As described above, Algorithm 4 may be used to represent $\hat{Y}_1^N$ at the output of pre-decoder 1, and the representation of $\hat{Y}_2^N$ at the output of pre-decoder 2, that consists of two independent parts; the signal $D^{1/2}X$ that is common to both, and their private parts that may be realized by parallel additive Gaussian noise channels. Algorithm 4 includes the realization of $(Y_1^N, Y_2^N)$ at the output of the pre-endcoder.

Algorithm 4: Realizations of processes that operate at Gray-Wyner lossy rate region $\mathcal{R}_{GW}(\Delta_1, \Delta_2)$, $\overline{\mathcal{R}}_{GW}(\Delta_1, \Delta_2)$, and Wyner's lossy common information $C_W(Y_1, Y_2; \Delta_1, \Delta_2)$. Consider two sequences of multivariate jointly Gaussian discrete-time processes $(Y_1^N, Y_2^N)$ with square error distortion as defined by (1)-(6).

Apply Algorithm 2 to obtain a tuple of RVs $(Y_1, Y_2)$ in the canonical variable form as defined above. Restrict attention to the correlated parts of these RVs. Thus, the RVs $(Y_1, Y_2)$ have the same dimension $n = p_1 = p_2$, and their covariance matrix $D \in \mathbb{R}^{n \times n}$ is a nonsingular diagonal matrix with on the diagonal ordered real-numbers in the interval $(0,1)$, and specified by $$(Y_1, Y_2) \in G(0, Q_{(Y_1,Y_2)}) = P_0, Y_1, Y_2: \Omega \rightarrow \mathbb{R}^n, n \in \mathbb{Z}_+, \tag{98}$$

$$Q_{y_1,y_2} = \begin{pmatrix} I & D \\ D & I \end{pmatrix},$$

$$D = \text{Diag}(d_1, d_2, \ldots, d_n) \in \mathbb{R}^{n \times n}, 1 > d_1 \geq d_2 \geq \ldots \geq d_n > 0. \tag{99}$$

1. The representations of the n-dimensional jointly independent sequence of RVs $(Y_1^N, Y_2^N) = \{(Y_{1,i}, Y_{2,i})\}_{i=1}^N$ at the output of the pre-encoder into three independent sequences of RVs $(Z_1^N, Z_2^N, X^N)$, each of which is jointly independent sequence, to generate of the corresponding binary messages $(W_1, W_2, W_0)$, are given by $$V: \Omega \rightarrow \mathbb{R}^n, V \in G(0,I),$$

$\mathcal{F}^V, \mathcal{F}^{Y_1} \vee \mathcal{F}^{Y_2}$, are independent $\sigma$-algebras, $$L_1 = L_2 = D^{1/2}(I+D)^{-1} \in \mathbb{R}^{n \times n}, \tag{100}$$

$$L_3 = (I-D)^{1/2}(I+D)^{-1/2} \in \mathbb{R}^{n \times n}, L_1, L_2, L_3, \text{ are diagonal matrices}, \tag{101}$$

$$X = L_1 Y_1 + L_2 Y_2 + L_3 V, X: \Omega \rightarrow \mathbb{R}^n, \tag{102}$$

$$Z_1 = Y_1 - D^{1/2} X, Z_1: \Omega \rightarrow \mathbb{R}^n, \tag{103}$$

$$Z_2 = Y_2 - D^{1/2} X, Z_2: \Omega \rightarrow \mathbb{R}^n. \tag{104}$$

$$Z_1 \in G(0, (I-D)), Z_2 \in G(0, (I-D)), X \in G(0, I); \tag{105}$$

$$(Z_1, Z_2, X), \text{ are independent.} \tag{106}$$

The representation of canonical vectors is:

$$Y_1 = D^{1/2} X + Z_1, Y_2 = D^{1/2} X + Z_2. \tag{107}$$

Note that, in addition, each of the RVs $Z_1, Z_2, X$ has independent components.

2. The computation of the rate triple $(R_1, R_2, R_0)$ that lies is the Pangloss plane of the Gray-Wyner lossy rate region $\mathcal{R}_{GW}(\Delta_X, \Delta_2)$ may be computed from the two rate distortion functions and Wyner's lossy common information given by $$R_1 \geq R_{Z_1}(\Delta_1) = \frac{1}{2}\sum_{j=1}^n \log\left(\frac{(1-d_j)}{\Delta_{1,j}}\right) = \sum_{j=1}^n R_{Z_{1,j}}(\Delta_{1,j}), \tag{108}$$

$$\text{where } \Delta_{1,j} = \begin{cases} \lambda, & \lambda \leq 1-d_j \\ 1-d_j, & \lambda \geq 1-d_j \end{cases}, \tag{109}$$

$$\text{and } \sum_{j=1}^n \Delta_{1,j} = \Delta_1, \Delta_1 \in (0, \infty)$$

$$R_2 \geq R_{Z_2}(\Delta_2) = \frac{1}{2}\sum_{j=1}^n \log\left(\frac{(1-d_j)}{\Delta_{2,j}}\right) = \sum_{j=1}^n R_{Z_{2,j}}(\Delta_{2,j}), \tag{110}$$

$$\text{where } \Delta_{2,j} = \begin{cases} \lambda, & \lambda \leq 1-d_j \\ 1-d_j, & \lambda \geq 1-d_j \end{cases}, \tag{111}$$

$$\text{and } \sum_{j=1}^n \Delta_{2,j} = \Delta_2, \Delta_2 \in (0, \infty)$$

$$R_0 = I(Y_1, Y_2; X) = H(Y_1, Y_2) - H(Z_1) - H(Z_2) = \frac{1}{2}\sum_{i=1}^n \log\left(\frac{1+d_i}{1-d_i}\right) \tag{112}$$

$$R_0 + R_1 + R_2 = R_{Y_1,Y_2}(\Delta_1, \Delta_2) = I(Y_1, Y_2; X) + R_{Z_1}(\Delta_2) + R_{Z_2}(\Delta_2). \tag{113}$$

$R_{Z_1}(\Delta_1)$ is the rate distortion functions of Gaussian vector $Z_1$ with independent components, subject to a square error distortion function $$D_{Y_1}(y_1, \hat{y}_1) \triangleq |y_1 - \hat{y}_1|^2 = D_{Z_1}(z_1, \hat{z}_1) \triangleq |z_1 - \hat{z}_1|^2,$$

$R_{Z_2}(\Delta_2)$ is the rate distortion functions of Gaussian vector $Z_2$ with independent components, subject to a square error distortion function $$D_{Y_2}(y_2,\hat{y}_2) \triangleq |y_2-\hat{y}_2|^2 = D_{Z_2}(z_2,\hat{z}_2) \triangleq |z_2-\hat{z}_2|^2,$$

3. The computation of rate triple $(R_1, R_2, R_0)$ that lies in the Gray-Wyner lossy rate region $\mathcal{R}_{GW}(\Delta_1, \Delta_2)$ corresponds to $$R_0+R_1+R_2 \geq R_{Y_1,Y_2}(\Delta_1,\Delta_2)=I(Y_1,Y_2;X)+R_{Z_1}(\Delta_2)+R_{Z_2}(\Delta_2). \quad (116)$$

such that Eq. 108 and Eq. 110 are satisfied.

4. The reproductions $(\hat{Y}_1^N, \hat{Y}_2^N) = \{(\hat{Y}_{i,1}, \hat{Y}_{2,i})\}_{i=1}^N$ of the n-dimensional RVs $(Y_1^N, Y_2^N)$, at the output of the pre-decoder 1 and pre-decoder 2, that ensure the MSEs are satisfied, are jointly independent, and are given by $$\hat{Y}_1 = D^{1/2}X + \hat{Z}_1, \hat{Y}_2 = D^{1/2}X + \hat{Z}_2,$$

$$\hat{Z}_1 = A_1Z_1 + V_1, \hat{Z}_2 = A_2Z_2 + V_2,$$

$$A_1 = I - \Lambda_1(I-D)^{-1}, A_2 = I - \Lambda_2(I-D)^{-1},$$

$$\Lambda_1 = \text{Diag}(\Delta_{1,1}, \Delta_{1,2}, \ldots, \Delta_{1,n}) \in \mathbb{R}^{n \times n}, \Lambda_2 = \text{Diag}(\Delta_{2,1}, \ldots, \Delta_{2,n}) \in \mathbb{R}^{n \times n} \quad (117)$$

$$0 \leq \Delta_{1,1} \leq 1-d_1 \leq \Delta_{1,2} \leq 1-d_2 \leq \ldots \leq \Delta_{1,n} \leq 1-d_n < 1, \quad (118)$$

$$0 \leq \Delta_{2,1} \leq 1-d_2 \leq \Delta_{2,2} \leq 1-d_2 \leq \ldots \leq \Delta_{2,n} \leq 1-d_n < 1, \quad (119)$$

$$V_1 \in G(0, A_1\Lambda_1), V_2 \in G(0, A_2\Lambda_2), \quad (120)$$

$$(V_1, V_2, X), \text{ are independent.} \quad (121)$$

Note that the components of $V_1$ are independent, the components of $V_2$ are independent, and hence the components of $Z_1$ are independent, and the components of $Z_2$ are independent.

5. The rate triple $(R_0, R_1, R_2)$ satisfies the equations $$R_0 = I(Y_1,Y_2;X) = H(Y_1,Y_2) - H(Y_1,Y_2|X) = H(Y_1,Y_2) - H(Z_1) - H(Z_2). \quad (122)$$

$$R_1 \geq R_{Y_1|X}(\Delta_1) = R_{Z_1}(\Delta_1), \quad (123)$$

$$R_2 \geq R_{Y_2|X}(\Delta_2) = R_{Z_2}(\Delta_2), \quad (124)$$

$$C_X(Y_1,Y_2;\Delta_1,\Delta_2) = I(Y_1,Y_2;X), \quad (125)$$

$H(Y_1,Y_2)$, is the differential entropy of $(Y_1,Y_2)$ at the output of the pre-encoder defined by (107), $\quad$ (126)

$H(Z_1)$ is the differential entropy of $Z_1$, and $\quad$ (127)

$H(Z_2)$ is the differential entropy of $Z_2$. $\quad$ (128)

The conditional rate distortion function satisfies $$R_{Y_1,Y_2}(\Delta_1,\Delta_2) = R_{Y_1|X}(\Delta_1) + R_{Y_2|X}(\Delta_2) = R_{Z_1}(\Delta_1) + R_{Z_2}(\Delta_2). \quad (129)$$

The joint rate distortion function satisfies $$R_{Y_1,Y_2}(\Delta_1, \Delta_2) = R_{Y_1|X}(\Delta_1) + R_{Y_2|X}(\Delta_2) + I(Y_1, Y_2; X) \quad (130)$$

$$= R_{Z_1}(\Delta_1) + R_{Z_2}(\Delta_2) + I(Y_1, Y_2; X). \quad (131)$$

The sum rate satisfies $$R_0+R_1+R_2 = R_{Y_1,Y_2}(\Delta_1,\Delta_2) = I(Y_1,Y_2;X) + R_{Z_1}(\Delta_1) + R_{Z_2}(\Delta_2). \quad (132)$$

6. Wyner's lossy common information is attained for the RV X defined in item 2, $$C_W(Y_1,Y_2;\Delta_1,\Delta_2) = C_X(Y_1,Y_2;\Delta_1,\Delta_2) = I(Y_1,Y_2;X). \quad (133)$$

and the Wyner's lossy common information of these two random variables equals, $$C_W(Y_1, Y_2; \Delta_1, \Delta_2) = C_X(Y_1, Y_2; \Delta_1, \Delta_2) \quad (134)$$

$$= \frac{1}{2} \sum_{i=1}^n \ln\left(\frac{1+d_i}{1-d_i}\right), \text{ for } 0 \leq \Delta_1 \leq \sum_{j=1}^n (1-d_j), 0 \leq \Delta_2 \leq \sum_{j=1}^n (1-d_j). \quad (135)$$

Wyner's lossy common information is specified by Eqs. 133-135 for $(\Delta_1, \Delta_2)$ that lie in a region specified by the validity of Eq. 56

7. The realizations or representations, given in item 1 of pre-encoder signals $(Y_1, Y_2)$, and item 4 of the presentation $\hat{Y}_1$ at the output of pre-decoder 1, and the representation of $\hat{Y}_2$ at the output of pre-decoder 2, consists of two independent parts, the signal $D^{1/2}X$ that is common to both, and their private channels that are realized by parallel additive Gaussian noise channels, given by $$\hat{Y}_1^P = Z_1 = A_1Z_1 + V_1, \hat{Y}_2^P = \hat{Z}_2 = A_2Z_2 + V_2. \quad (136)$$

Current compression or quantization techniques are readily applicable, i.e., the pre-decoder reproduction sequences $(\hat{Y}_1^N, \hat{Y}_2^N) = \{(\hat{Y}_{i,1}, \hat{Y}_{2,i})\}_{i=1}^N$, are such that $(\hat{Y}_{i,1}, \hat{Y}_{2,i})$ are jointly independent and identically distributed, to produce the messages $(W_0, W_1, W_2)$.

That is, in Algorithm 4, the representation of $\hat{Y}_1^N$ at the output of pre-decoder 1, and the representation of $\hat{Y}_2^N$ at the output of pre-decoder 2, consists of two independent parts; the signal $D^{1/2}X$ that is common to both, and their private parts that are realized by parallel additive Gaussian noise channels. It is then clear to those familiar with the art of implementing compression or quantization techniques, such as, lattice codes, joint entropy coded dithered quantization (ECDQ), etc., that the messages $(W_1, W_2, W_0)$ can be produced.

The present application discloses that Algorithms 1-4 may also be generalized to time-invariant Gaussian processes, in which the two output processes $(Y_1^N, Y_2^N)$ are generated by the representation as described above.

The starting point of the analysis is the probability distribution of a tuple of stationary jointly-Gaussian stochastic processes. To be able to compute with these processes it may be assumed that the tuple is the output of a weak Gaussian stochastic realization of these processes in the form of a time-invariant Gaussian system of which the state influences both components of the output process.

Define a Gaussian white noise process as a sequence of independent Gaussian RVs with distribution as $V(t) \in G(0, Q_V)$ for all $t \in T$ and with $Q_V \in \mathbb{R}^{m_v \times m_v}$ and $Q_V = Q_V^T \geq 0$.

Define a time-invariant Gaussian (stochastic) system representation with two output processes as the following stochastic dynamic system with representation (7) and (8). Needed is also the backward representation of this Gaussian stochastic system of the form, $$X(t-1) = A_bX(t) + MV_b(t), X(t_1) = X_1, \quad (137)$$

$$Y(t-1) = C_bX(t) + NV_b(t), \quad (138)$$

$V_b : \Omega \times T \to \mathbb{R}^{m_v}$, a Gaussian white noise process, $V_b(t) \in G(0, Q_V), Q_V \in \mathbb{R}^{m_v \times m_v}, Q_V = Q_V^T \geq 0,$ $F^{X_0}, F_{t_1}^{V_b}$, are independent σ-algebras, $A_b \in \mathbb{R}^{n \times n}, M \in \mathbb{R}^{n \times m_v}, C_b \in \mathbb{R}^{p \times n}, N \in \mathbb{R}^{p \times m_v}.$ Presented below are the relations of the system matrices of the forward and the backward system representation.

Below concepts of stochastic realization theory of stationary Gaussian processes are used. The weak Gaussian stochastic realization theory need not be identified with strong Gaussian stochastic realization theory. The strong realization problem is not needed for the problem herein.

It is a result of weak stochastic realization theory of Gaussian processes that a tuple of stationary jointly-Gaussian stochastic process admits a realization as the outputs of a time-invariant Gaussian system as defined above if and only if the covariance function of the output process satisfies a rank condition on the Hankel matrix of the covariance function. In addition, the Gaussian system may be called a minimal weak Gaussian realization of the output processes if and only if particular conditions hold which are defined below.

Consider the time-invariant Gaussian system, $$X(t+1)=AX(t)+MV(t), X(t_0)=X_0. \quad (139)$$

Call the matrix tuple $(A, MQ_V^{1/2}) \in \mathbb{R}^{n \times n} \times \mathbb{R}^{n \times m_v}$ a supportable pair if $$\text{rank}(MQ_V^{1/2} \, AMQ_V^{1/2} \, \ldots \, A^{n-1}MQ_V^{1/2}) = n, \quad (140)$$

and call the Gaussian system supportable if $(A, MQ_V^{1/2})$ is a supportable pair.

Call the matrix tuple $(A, C) \in \mathbb{R}^{n \times n} \times \mathbb{R}^{p \times n}$ an observable pair if $$\text{rank} \begin{pmatrix} C \\ CA \\ \vdots \\ CA^{n-1} \end{pmatrix} = n, \quad (141)$$

and call the Gaussian system stochastically observable if $(A, C)$ is an observable pair, Call the matrix tuple $(A_b, C_b) \in \mathbb{R}^{n \times n} \times \mathbb{R}^{p \times n}$ a co-observable pair if $$\text{rank} \begin{pmatrix} C_b \\ C_b A_b \\ \vdots \\ C_b A_b^{n-1} \end{pmatrix} = n, \quad (142)$$

and call the Gaussian system stochastically co-observable if $(A_b, C_b)$ is an observable pair. Note that the matrix tuple $(A_b, C_b)$ relates to the backward representation of the Gaussian system, see the equations (137,138).

The equation (140) may be called a controllability condition of an associated linear system. For stochastic systems the expression supportable pair is used rather than controllable pair because the use of the first term refers to the support of the state process rather than to a controllability condition. In a Gaussian control system representation both the matrix B and the matrix M appear, and then both the concepts of a supportable pair and of a controllable pair are needed.

The weak stochastic realization of the output process is called a minimal realization if the dimension n of the state space of the above system is minimal over all realizations. The Gaussian system defined above may be called a minimal weak realization of its output process if and only if the following conditions hold:

(1) $(A, MQ_v^{1/2})$ is a supportable pair;
(2) the system is stochastically observable which is equivalent with $(A; C)$ being an observable pair; and
(3) the system is stochastically co-observable which is equivalent with $(A_b, C_b)$ being a co-observable pair, where $(A_b, C_b)$ are the system matrices of the corresponding backward system representation. Condition (1) is equivalent to the condition that the support of the state process equals the state space $X = \mathbb{R}^n$ which again is equivalent to $x(t) \in G(0, Q_X)$ with $Q_X > 0$. A consequence of the stationarity of the output process and of the minimality of the weak stochastic realization is that the system matrix A has all its eigenvalues strictly inside the unit disc, denoted as spec $(A) \subset \mathbb{D}_o$. Needed is the probability measure of the tuple of output processes of the Gaussian system defined above. Because of the conditions mentioned above, in particular spec$(A) \subset \mathbb{D}_o$, there exists an invariant measure of the state process which is denoted by $X(t) \in G(0, Q_X)$ where the matrix $Q_X = Q_X^T \geq 0$ is the unique solution of the discrete Lyapunov equation, $$Q_X = AQ_X A^T + MQ_V M^T. \quad (143)$$

Because in addition $(A, MQ_v^{1/2})$ is a supportable pair, $Q_X > 0$. The probability distribution of the output is then $Y(t) \in G(0, Q_Y)$ with $$Q^Y = CQ_X C^T + NQ_V N^T. \quad (144)$$

The situation now obtained is that the tuple $(Y_1, Y_2)$ of stationary jointly-Gaussian processes has an invariant probability distribution $Y(t) \in G(0, Q_Y)$.

The relations between the forward and the backward Gaussian system representations are next discussed. It may be assumed that a representation is considered satisfying $Q_X > 0$ which is equivalent to $(A, MQ_v^{1/2})$ being a supportable pair if exponential stability is assumed. Below use is made of the fact that the dimension of the noise process equals $m_v = n+p$. From a forward system representation one obtains the matrices of the backward system representation by the formulas, $$A_b = Q_X A^T Q_X^{-1}, C_b = CQ_X A^T Q_X^{-1} + NQ_V M^T Q_X, \\ M = (I_n \; 0), N = (0 \; I_p) \quad (145)$$

The variance of the noise of the forward and the backward representations is the same, $V(t) \in G(0, Q_V)$ and $V_b(t) \in G(0, Q_V)$, but the noise processes are different.

The system matrices of the forward system representation in terms of those of the backward system representation are, $$A = Q_X A_b^T Q_X^{-1}, C = C_b Q_X A_b^T Q_X^{-1} + NQ_V M^T Q_X^{-1}. \quad (146)$$

Case (1): Time-Invariant Stationary Gaussian Processes.

The time-invariant Kalman filter system is needed which is described next. Consider a time-invariant Gaussian system as defined above and assume that the properties of Def. 4.9 hold. Then there exists an unique solution $Q_f$ of the algebraic Riccati equation (147) with the side conditions (148), (149), $$Q_f = AQ_f A^T + MM^T - [AQ_f C^T + MQ_V N^T][CQ_f C^T + NQ_V N^T]^{-1}[AQ_f C^T + MQ_V N^T]^T, \quad (147)$$

$$Q_f = Q_f^T \geq 0, Q_f \in \mathbb{R}^{n \times n}, \quad (148)$$

$$\text{spec}(A - KC) \subset \mathbb{D}_o, \text{ where,} \quad (149)$$

$$K = [AQ_f C^T + MQ_V N^T][CQ_f C^T + NQ_V N^T]^{-1}. \quad (150)$$

The time-invariant Kalman filter system is then, $$\hat{X}(t) = E[X(t)|F_{t-1}^Y], \hat{X}: \Omega \times T \to \mathbb{R}^n, \quad (151)$$

$$\hat{X}(t+1) = A\hat{X}(t) + K[Y(t) - C\hat{X}(t)]. \quad (152)$$

Define then the innovation process as the process, $$\overline{V}(t)=Y(t)-C\hat{X}(t), \overline{V}:\Omega\times T\to\mathbb{R}^p, \quad (153)$$

$$Q_{\overline{V}}=CQ_fC^T+NQ_VN^T. \quad (154)$$

It can then be proven that, in the case of stationary considerations, the innovation process is a sequence of independent Gaussian random variables with $\overline{V}(t)\in G(0, Q_{\overline{V}})$. The filter system can thus be written as driven by the innovations process of the form, $$\hat{X}(t+1)=A\hat{X}(t)+K\overline{V}(t). \quad (155)$$

Another view point is to compare the original Gaussian system to its Kalman realization defined by, $$\hat{X}(t+1)=A\hat{X}(t)+K\overline{V}(t), \quad (156)$$

$$Y(t)=C\hat{X}(t)+\overline{V}(t). \quad (157)$$

The Kalman realization of the output process is a Gaussian system of which the state process is such that any time its state $\hat{X}(t)=E[X(t)|F_{t-1}^Y]$ is measurable with respect to the past outputs up to time t−1. A Kalman realization is unique up to a state-space transformation by a nonsingular matrix $S\in\mathbb{R}^{n\times n}$ as in $\overline{X}(t)=S\hat{X}(t)$.

Algorithms analogous to Algorithms 1-4 may be developed in terms of the innovation process. The support for this statement is that this process is a sequence of independent random variables each of which has a Gaussian probability distribution with $\overline{V}(t)\in G(0, Q_{\overline{V}})$. From this point onwards Algorithms 1-4 can be developed as detailed above.

It is now demonstrated how to compute Wyner's lossy common information in terms of the innovation process.

$$Q_f = AQ_fA^T + MQ_VM^T + -[AQ_fC^T + \quad (158)$$
$$MQ_VN^T][CQ_fC^T + NQ_VN^T]^{-1}[AQ_fC^T + MQ_VN^T]^T,$$

$$Q_f = Q_f^T \geq 0, Q_f \in \mathbb{R}^{n\times n}, \quad (159)$$

$$\text{spec}(A - KC) \subset \mathbb{D}_o, \text{ where} \quad (160)$$

$$K = [AQ_fC^T + MQ_VN^T][CQ_fC^T + NQ_VN^T]^{-1}. \quad (161)$$

Because of the conditions of Step 1, the equation (158), with the side conditions (159,160), has an unique solution.

3. Compute the variance of the innovations process according to, $$Q_{\overline{V}}=CQ_fC^T+NQ_VN^T. \quad (162)$$

Then $$Q_{\overline{V}} = Q_{\overline{V}}^T > 0$$

because of the assumptions.

4. Compute the canonical variable decomposition of the invariant measure of the innovations process based on the partition of the output in the $(p_1, p_2)$ components according to Algorithm 2. From this obtain the indices $(p_{11}, p_{12}, p_{23})\in\mathbb{N}^4$ and the diagonal matrix $D\in\mathbb{R}^{(p_{12}\times p_{12})}$ if $p_{12}>0$.

5. Compute Wyner's lossy common information $C_W(Y_1, Y_2; \Delta_1, \Delta_2)$ according to the formula $$C_W(Y_1, Y_2; \Delta_1, \Delta_2) = \quad (163)$$
$$\begin{cases} 0, & \text{if } 0 = p_{11} = p_{12} = p_{21} = p_{22}, p_{13} > 0, p_{23} > 0, \\ \frac{1}{2}\sum_{i=1}^n \ln\left(1 + \frac{2d_i}{1-d_i}\right) \in (0, \infty), & \text{if } 0 = p_{11} = p_{12}, p_{12} = p_{22} > 0, p_{13} \geq 0, p_{23} \geq 0, \\ \infty, & \text{if } p_{11} = p_{21} > 0, p_{12} = p_{22} \geq 0, p_{23} \geq 0 \end{cases}$$

$$0 \leq \Delta_1 \leq \sum_{j=1}^n (1-d_j), 0 \leq \Delta_2 \leq \sum_{j=1}^n (1-d_j).$$

Algorithm 3(a):

Wyner's lossy common information $C_W(Y_1, Y_2; \Delta_1, \Delta_2)$ for random processes. Consider the time-invariant Gaussian system as defined above.

Input: The integers n, $m_v$, $p_1$, $p_2=p_1+p_2$ and matrices $A\in\mathbb{R}^{n\times n}$, $C\in\mathbb{R}^{p\times n}$, $M\in\mathbb{R}^{n\times m}$, $N\in\mathbb{R}^{p\times m_v}$, and $Q_V\in\mathbb{R}^{m_v\times m_v}$ with $Q_V=Q_V^T\geq 0$ and $NQ_VN^T>0$.

1. Check whether the Gaussian system is a minimal weak Gaussian stochastic realization of its output processes by checking the following conditions:

(1) spec (A)$\subset\mathbb{D}_o$;

(2) $(A, MQ_v^{1/2})$ is a controllable pair;

(3) (A,C) is an observable pair which is equivalent with the realization being stochastically observable; and (4) $(A_b, C_b)$ being an observable pair which is equivalent with the realization being stochastically co-observable.

See equation (145) for the formulas of $(A_b, C_b)$ in terms of the matrices defined above. Check also if rank (C)=p. Continue if all the conditions hold and stop otherwise.

2. Solve the discrete-time algebraic Riccati equation with side conditions for the matrix $Q_f$ according to, Case (2): Time-Invariant Stationary Gaussian Processes.

This corresponds to Case (2) described above. As recognized herein, Algorithms 1-4 can be derived for time-invariant stationary Gaussian processes as described above. It should be clear to those familiar with the art of rate distortion theory of stationary processes that all information measures in Algorithms 1-4 should be replaced by those of stationary Gaussian processes.

The following describes example implementations of computing Wyner's lossy common information through the application of some of the aspects of Algorithms 1-4.

Special Cases:

Consider the case of a tuple of Gaussian vectors with only private components. Hence the Gaussian distribution is $$(Y_{13}, Y_{23}) \in G(0, Q_{(Y_{13}, Y_{23})}), \quad (164)$$

$$Q_{(Y_{13}, Y_{23})} = \begin{pmatrix} I & 0 \\ 0 & I \end{pmatrix}, Y_{13}: \Omega \to \mathbb{R}^{p_{13}}, Y_{23}: \Omega \to \mathbb{R}^{p_{23}}$$

(a) The minimal σ-algebra which makes $Y_{13}, Y_{23}$ conditionally independent is the trivial σ-algebra denoted by $\mathcal{F}_0=\{\emptyset,$ $\Omega\}$. Thus, $(\mathcal{F}^{Y_{13}}, \mathcal{F}^{Y_{23}} | \mathcal{F}_0) \in CI$. The random variable X in this case is constant $X_3 = 0 \in \mathbb{R}$, hence $\mathcal{F}^{X_3} = \mathcal{F}_0$.
(b) then $$C_W(Y_{13}, Y_{23}; \Delta_1, \Delta_2) = I(Y_{13}, Y_{23}; X_3) = 0. \tag{165}$$

(c) The signal representations for the generation of the binary sequences $(W_1, W_2)$, i.e. $W_0$ is not present because lossy common information is zero, are $$Z_1 = Y_{13}, Z_2 = Y_2, X = 0, \tag{166}$$

The reproductions $(Z_1, Z_2)$ of $(\hat{Z}_1, \hat{Z}_2)$ at the two decoders are, $$\hat{Z}_1 = \hat{Y}_{13} = A_1 Z_1 + V_1, \hat{Z}_2 = \hat{Y}_{23} = A_2 Z_2 + V_2. \tag{167}$$

given in Algorithm 4, with D the zero matrix, and $n = p_{13} = p_{23}$.

(The Case of Identical Gaussian Vectors) Consider the case of a tuple of Gaussian vectors with only the identical part. Hence the Gaussian distribution is $$Y_{11}: \Omega \to \mathbb{R}^{p_{11}}, Y_{21}: \Omega \to \mathbb{R}^{p_{21}}, p_{11} = p_{21}, \tag{168}$$

$$(Y_{11}, Y_{21}) \in G(0, Q_{(Y_{11}, Y_{21})}), Q_{(Y_{11}, Y_{21})} = \begin{pmatrix} I & I \\ I & I \end{pmatrix},$$

$Y_{11} = Y_{21}$ almost surely.

(a) The only minimal σ-algebra which makes $Y_{11}$ and $Y_{21}$ Gaussian conditional-independent is $\mathcal{F}^{Y_{11}} = \mathcal{F}^{Y_{21}}$. The state variable is thus, $X_1 = Y_{11} = Y_{21}$ and $\mathcal{F}^X = \mathcal{F}^{Y_{11}} = \mathcal{F}^{Y_{21}}$.
(b) Wyner's lossy common information equals $C_W(Y_{11}, Y_{21}; X) = +\infty$. This expected because one needs infinite number of bits to represent any sample generated by the common part which is Gaussian distributed.

General Cases.

Consider a tuple of arbitrary Gaussian random variables. Then the common information is computed by a decomposition and by the use of the formulas obtained earlier.

Assume that the tuple is already transformed to the canonical variable representation. Note that then the following three tuples of random variables are independent, $(Y_{11}, Y_{21}), (Y_{12}, Y_{22}), (Y_{13}, Y_{23})$.

Consider a tuple of Gaussian random variables $(Y_1, Y_2) \in G(0, Q_{cv})$ as described and decomposed according to Algorithm 2.
(a) Then:

$$C_W(Y_1, Y_2; \Delta_1, \Delta_2) = \tag{169}$$

$C_W(Y_{11}, Y_{21}; \Delta_1, \Delta_2) + C_W(Y_{12}, Y_{22}; \Delta_1, \Delta_2) + C_W(Y_{13}, Y_{23}; \Delta_1, \Delta_2) =$ $$\begin{cases} 0, & \text{if, } p_{13} > 0, p_{23} > 0, p_{11} = p_{12} = p_{21} = p_{22} = 0, \\ \frac{1}{2} \sum_{i=1}^{n} \ln\left(\frac{1+d_i}{1-d_i}\right), & \text{if } p_{12} = p_{22} > 0, p_{11} = p_{21} = 0, p_{13} \geq 0, p_{23} \geq 0, \\ +\infty, & \text{if } p_{11} = p_{21} > 0 \end{cases}$$

$$0 \leq \Delta_1 \leq \sum_{j=1}^{n}(1-d_j), 0 \leq \Delta_2 \leq \sum_{j=1}^{n}(1-d_j).$$

In particular cases one computes the canonical variable decomposition of the tuple $(Y_1, Y_2)$ and obtains the indices, $(p_{11}, p_{12}, p_{13})$ and $(p_{21}, p_{22}, p_{23})$. Then:

$$C_W(Y_{11}, Y_{21}; \Delta_1, \Delta_2) = +\infty, \text{ if } p_{11} = p_{12} > 0; \tag{170}$$

$$C_W(Y_{31}, Y_{32}; \Delta_1, \Delta_2) = 0, \text{ if } p_{31} > 0 \text{ and } p_{23} > 0; \tag{171}$$

$$C_W(Y_{12}, Y_{22}; \Delta_1, \Delta_2) = \frac{1}{2} \sum_{i=1}^{n} \ln\left(\frac{1+d_i}{1-d_i}\right), \text{ if } p_{12} = p_{22} > 0. \tag{172}$$

Thus $C_W(Y_{12}, Y_{22}; \Delta_1, \Delta_2)$ given by (172) is the most interesting value if defined.
(b) The random variable X defined below, is such that Wyner's lossy common information is attained by the mutual information for this random variable.

$$X: \Omega \to \mathbb{R}^n, n \in \mathbb{Z}_+,$$

$$n_1 = p_{11} = p_{21}, n_2 = p_{12} = p_{22}, n_1 + n_2 = n,$$

$$X = \begin{pmatrix} X_1 \\ X_2 \end{pmatrix}, X_1: \Omega \to \mathbb{R}^{n_1}, X_2: \Omega \to \mathbb{R}^{n_2},$$

$$X_1 = Y_{11} = Y_{21}, \tag{173}$$

$$X_2 = L_1 Y_{12} + L_2 Y_{22} + L_3 V, \text{ see Algorithm 4, (102); then,} \tag{174}$$

$(Y_1, Y_2, X) \in G(0, Q_s(I)), (\mathcal{F}^{Y_{11}, Y_{12}, Y_{13}} \mathcal{F}^{Y_{21}, Y_{22}, Y_{23}} | \mathcal{F}^{X_1, X_2}) \in CI,$ $\mathcal{F}^{X_1} \subseteq (\mathcal{F}^{Y_{11}} \vee \mathcal{F}^{Y_{21}}), \mathcal{F}^{X_2} \subseteq (\mathcal{F}^{Y_{12}} \vee \mathcal{F}^{Y_{22}})$; then also, $$C_W(Y_1, Y_2; \Delta_1, \Delta_2) = I(Y_1, Y_2; X). \tag{175}$$

(c) At the encoder side the following operations are made, using (a):

$$X = \begin{pmatrix} X_1 \\ X_2 \end{pmatrix}, \tag{176}$$

$$X_1 = Y_{11} = Y_{21}, \tag{177}$$

$$X_2 = L_1 Y_{12} + L_2 Y_{22} + L_3 V, \tag{178}$$

see (100, 101) for the formulas of $L_1, L_2, L_3$;

$$Z_{12} = Y_{12} - E[Y_{12} | \mathcal{F}^{X_2}] = Y_{12} - Q_{Y_{12}, X_2} Q_{X_2}^{-1} X_2, \tag{179}$$

$$Z_{22} = Y_{22} - E[Y_{22} | \mathcal{F}^{X_2}] = Y_{22} - Q_{Y_{22}, X_2} Q_{X_2}^{-1} X_2, \tag{180}$$

-continued $$Z_{13} = Y_{13}, Z_{23} = Y_{23}, \text{ (the components } Z_{11} \text{ and } Z_{21} \text{ do not exist)}, \quad (181)$$

$$Z_1 = \begin{pmatrix} Z_{12} \\ Z_{13} \end{pmatrix}, Z_2 = \begin{pmatrix} Z_{22} \\ Z_{23} \end{pmatrix}. \quad (182)$$

At the encoder side:

$$Y_{11}=X_1=Y_{21}, \quad (183)$$

$$Y_{12}=Z_{12}+Q_{Y_{12},X_2}Q_{X_2}^{-1}X_2, Y_{22}=Z_{22}+Q_{Y_{22},X_2}Q_{X_2}^{-1}X_2, \quad (184)$$

$$Y_{13}=Z_{13}, Y_{23}=Z_{23}. \quad (185)$$

(d) The relative gain in complexity in terms of dimensions of vectors transmitted is then:

$$g_d = \frac{p_{11} + p_{12}}{p_1 + p_2} = \frac{p_{11} + p_{12}}{2(p_{11} + p_{12}) + p_{13} + p_{23}} \in [0, 0.5]. \quad (186)$$

In terms of entropy, the same relative gain can be obtained.

As another example, consider the tuple of Gaussian random variables:

$$(Y_1, Y_2) \in G(0, Q_{(Y_1,Y_2)}), p_1 = 3, p_2 = 3,$$

$$Q_{(Y_1,Y_2)} = \begin{pmatrix} I_{p_1} & Q_{Y_1,Y_2} \\ Q_{Y_1,Y_2} & I_{p_2} \end{pmatrix},$$

$$Q_{Y_1,Y_2} = \begin{pmatrix} 0.8 & 0 & 0 \\ 0 & 0.5 & 0 \\ 0 & 0 & 0.1 \end{pmatrix} \in \mathbb{R}^{p_1 \times p_2}.$$

A computation then yields:

$$(p_{11}, p_{12}, p_{13}) = (0, 3, 0), (p_{21}, p_{22}, p_{23}) = (0, 3, 0),$$

$$D = \begin{pmatrix} 0.8 & 0 & 0 \\ 0 & 0.5 & 0 \\ 0 & 0 & 0.1 \end{pmatrix} \in \mathbb{R}^{p_{12} \times p_{22}},$$

$$C_W(Y_1, Y_2; \Delta_1, \Delta_2) = 5.0444, \text{ bits.}$$

The gain in complexity is then $$g_d = \frac{0+4}{6+5} = 4/11 \approx 0.36.$$

As another example, consider the tuple of Gaussian random variables:

$$(Y_1, Y_2) \in G(0, Q_{(Y_1,Y_2)}), p_1 = 6, p_2 = 5,$$

$$Q_{(Y_1,Y_2)} = \begin{pmatrix} I_{p_1} & Q_{Y_1,Y_2} \\ Q_{Y_1,Y_2} & I_{p_2} \end{pmatrix},$$

-continued $$Q_{Y_1,Y_2} = \begin{pmatrix} 0.999998 & 0 & 0 & 0 & 0 \\ 0 & 0.999992 & 0 & 0 & 0 \\ 0 & 0 & 0.8 & 0 & 0 \\ 0 & 0 & 0 & 0.3 & 0 \\ 0 & 0 & 0 & 0 & 0.000004 \\ 0 & 0 & 0 & 0 & 0 \end{pmatrix} \in \mathbb{R}^{p_1 \times p_2}.$$

A computation then yields:

$$(p_{11}, p_{12}, p_{13}) = (2, 2, 2), \quad (187)$$

$$(p_{21}, p_{22}, p_{23}) = (2, 2, 1),$$

$$D = \begin{pmatrix} 0.8 & 0 \\ 0 & 0.3 \end{pmatrix} \in \mathbb{R}^{p_{12} \times p_{22}}, \quad (188)$$

$$C_W(Y_1, Y_2; \Delta_1, \Delta_2) = +\infty, \text{ bits}, \quad (189)$$

$$C_W(Y_{12}, Y_{22}; \Delta_1, \Delta_2) = 4.0630, \text{ bits}. \quad (190)$$

The gain in complexity in terms of dimension is then $$g_d = \frac{2+2}{6+5} = 4/11 \approx 0.36.$$

As yet another example, consider a tuple of Gaussian random variables for which the covariance matrix is generated by a random number generator. Generate the matrix $L \in \mathbb{R}^{p \times p}$ such that every element has a normal distribution with parameters $G(0,1)$ and such that all elements of the matrix are independent. Then define $Q=LL^T$ to guarantee that the matrix Q is semi-positive-definite. Then:

$$(Y_1,Y_2) \in G(0,Q_{(Y_1,Y_2)}), p_1=5, p_2=4, p=p_1+p_2=9;$$

$Q_{(Y_1,Y_2)}$, randomly generated as described above, values not displayed.

The outcome of a computation is then that:

$$(p_{11},p_{12},p_{13})=(0,4,1);(p_{21},p_{22},p_{23})=(0,4,0); \quad (191)$$

$$C_W(Y_{12},Y_{22};\Delta_1,\Delta_2)=13.1597 \text{ bits}. \quad (192)$$

The gain in complexity in terms of dimensions is then $$g_d = \frac{0+4}{5+4} = 4/9 \approx 0.44.$$

As still another example, consider a tuple of Gaussian random variables of which the covariance is generated as in the previous example.

$$(Y_1,Y_2) \in G(0,Q_{(Y_1,Y_2)}), p_1=5, p_2=4, p=p_1+p_2=9;$$

$Q_{(Y_1,Y_2)}$, randomly generated as described above. Then:

$$(p_{11},p_{12},p_{13})=(0,4,1);(p_{21},p_{22},p_{23})=(0,4,0); \quad (193)$$

$$C_W(Y_{12},Y_{21};\Delta_1,\Delta_2)=13.9962 \text{ bits}. \quad (194)$$

The gain in complexity is then $$g_d = \frac{0+4}{5+4} = 4/9 \approx 0.44.$$

As another example, consider the following time-invariant Gaussian system with the indicated partitions. The system is highly structured to make explicit the various components of the common, correlated, and private parts of the system. See also the discussion below the example.

$$X(t+1) = \begin{pmatrix} A_{11} & 0 & 0 & 0 \\ 0 & A_{22} & 0 & 0 \\ 0 & 0 & A_{33} & 0 \\ 0 & 0 & 0 & A_{44} \end{pmatrix} X(t) + \begin{pmatrix} I & 0 & 0 & 0 & 0 & 0 & 0 & 0 \\ 0 & I & 0 & 0 & 0 & 0 & 0 & 0 \\ 0 & 0 & I & 0 & 0 & 0 & 0 & 0 \\ 0 & 0 & 0 & I & 0 & 0 & 0 & 0 \end{pmatrix} V(t), \quad (195)$$

$$Y(t) = \begin{pmatrix} C_{11} & 0 & 0 & 0 \\ 0 & C_{12} & 0 & 0 \\ 0 & 0 & C_{13} & 0 \\ C_{11} & 0 & 0 & 0 \\ 0 & C_{22} & 0 & 0 \\ 0 & 0 & 0 & C_{23} \end{pmatrix} X(t) + \quad (196)$$

$$\begin{pmatrix} 0 & \ldots & 0 & N_{11} & 0 & 0 & 0 \\ 0 & \ldots & 0 & 0 & N_{12} & 0 & 0 \\ 0 & \ldots & 0 & 0 & 0 & N_{13} & 0 \\ 0 & \ldots & 0 & N_{11} & 0 & 0 & 0 \\ 0 & \ldots & 0 & 0 & N_{22} & 0 & 0 \\ 0 & \ldots & 0 & 0 & 0 & 0 & N_{23} \end{pmatrix} V(t),$$

$$n = 8, m_v = 12, p = 6, p_1 = 3, p_2 = 3, \quad (197)$$

$$(p_{11}, p_{12}, p_{13}) = (1, 1, 1), (p_{21}, p_{22}, p_{23}) = (1, 1, 1), \quad (198)$$

$$A_{11} = \begin{pmatrix} 0 & 1 & 0 \\ 0 & 0 & 1 \\ -0.432 & 0.66 & 0.70 \end{pmatrix},$$

$$A_{22} = \begin{pmatrix} 0 & 1 & 0 \\ 0 & 0 & 1 \\ -0.28 & 0.51 & 0.60 \end{pmatrix}, A_{33} = 0.80, A_{44} = 0.80,$$

$$C_{11} = (1 \ 0 \ 0), C_{12} = (0 \ 0 \ 0.8), \quad (199)$$
$$C_{22} = (0.6 \ 0 \ 0), C_{13} = 1, C_{23} = 1,$$

$$N_{11} = 1, N_{12} = 1, N_{13} = 1, N_{22} = 1, N_{23} = 1. \quad (200)$$

A computation with a Matlab computer program yields the results that:

$$(p_{11}, p_{12}, p_{13}) = (0, 2, 1), (p_{21}, p_{22}, p_{23}) = (0, 2, 1), \quad (201)$$

$$D = \begin{pmatrix} 0.7229 & 0 \\ 0 & 0.6564 \end{pmatrix}, \quad (202)$$

$$C(Y_1, Y_2; \Delta_1, \Delta_2) = 4.9055 \text{ bits}; \quad (203)$$

$$g_d = \frac{0+2}{3+3} \approx 33\%. \quad (204)$$

As still another example, consider again a time-invariant Gaussian system with the following parameters:

$$n = 9 = n_1 + n_2 + n_3, n_1 = 6, n_1 = 6, n_2 = 1, n_3 = 2, m_v = 20,$$

$$p = 11 = p_1 + p_2, p_1 = 5, p_2 = 6,$$

$$A = \begin{pmatrix} A_{11} & 0 & 0 \\ 0 & A_{22} & 0 \\ 0 & 0 & A_{33} \end{pmatrix} \in \mathbb{R}^{9 \times 9},$$

$$A_{11} = \begin{pmatrix} 0.9 & 0 & 0 & 0 & 0 & 0 \\ 0 & 0.8 & 0 & 0 & 0 & 0 \\ 0 & 0 & 0.7 & 0 & 0 & 0 \\ 0 & 0 & 0 & 0.6 & 0 & 0 \\ 0 & 0 & 0 & 0 & 0.5 & 0 \\ 0 & 0 & 0 & 0 & 0 & 0.4 \end{pmatrix} \in \mathbb{R}^{6 \times 6},$$

$$A_{22} = 0.8 \in \mathbb{R}, A_{33} = \begin{pmatrix} 0.9 & 0 \\ 0 & 0.7 \end{pmatrix} \in \mathbb{R}^{2 \times 2},$$

$$C = \begin{pmatrix} C_{12} & 0 & 0 \\ 0 & C_{13} & 0 \\ C_{22} & 0 & 0 \\ 0 & 0 & C_{23} \end{pmatrix} \in \mathbb{R}^{11 \times 9},$$

$$C_{12} = \begin{pmatrix} 1/4 & 0 & 1/4 & 0 & 1/4 & 1/4 \\ 1/4 & 1/4 & 0 & 1/4 & 0 & 1/4 \\ 1/4 & 1/4 & 1/4 & 0 & 1/4 & 0 \\ 1/4 & 1/4 & 1/4 & 1/4 & 0 & 0 \end{pmatrix} \in \mathbb{R}^{4 \times 6},$$

$$C_{22} = \begin{pmatrix} 1/4 & 0 & 1/4 & 1/4 & 1/4 & 0 \\ 1/4 & 1/4 & 0 & 0 & 1/4 & 1/4 \\ 1/4 & 1/4 & 0 & 1/4 & 1/4 & 0 \\ 1/4 & 1/4 & 1/4 & 0 & 0 & 1/4 \end{pmatrix} \in \mathbb{R}^{4 \times 6},$$

$$C_{13} = 1 \in \mathbb{R}, C_{23} = I_2 \in \mathbb{R}^{2 \times 2},$$
$$M = (I_9 \ 0) \in \mathbb{R}^{9 \times 20}, N = (0 \ I_{11}) \in \mathbb{R}^{11 \times 20}.$$

A computation yields that:

$$(p_{11}, p_{12}, p_{13})(0, 4, 1), (p_{21} p_{22}, p_{23}) = (0, 4, 2), \quad (205)$$

$$Q_{(S_1 y_1, S_2 y_2)} = \begin{pmatrix} D & 0 \\ 0 & 0 \end{pmatrix}, D = \text{Diag}(d), d = \begin{pmatrix} 0.4781 \\ 0.0980 \\ 0.0682 \\ 0.0039 \end{pmatrix}, \quad (206)$$

$$C(Y_1, Y_2; \Delta_1, \Delta_2) = 1.9940 \text{ bits}, \quad (207)$$

$$g_d = \frac{0+4}{11} \approx 36\%. \quad (208)$$

Moreover, although the foregoing text sets forth a detailed description of numerous different embodiments, it should be understood that the scope of the patent is defined by the words of the claims set forth at the end of this patent. The detailed description is to be construed as exemplary only and does not describe every possible embodiment because describing every possible embodiment would be impractical, if not impossible. Numerous alternative embodiments could be implemented, using either current technology or technology developed after the filing date of this patent, which would still fall within the scope of the claims. By way of example, and not limitation, the disclosure herein contemplates at least the following aspects:

1. A computer-implemented method of compressively encoding two correlated data vectors, the method comprising: obtaining a first data vector and a second data vector; transforming the first data vector into a first canonical vector, wherein the first canonical vector includes: a first component indicative of information in the first data vector and information in the second data vector, and a second component indicative of information in the first data vector and substantially exclusive of information in the second data vector, transforming the second data vector into a second canonical vector, wherein the second canonical vector includes: a first component indicative of information in the first data vector and information in the second data vector, and a second component indicative of information in the second data vector and substantially exclusive of information in the first data vector, generating: (i) a common information vector based on the first component of the first canonical vector and the first component of the second canonical vector, (ii) a first private vector based on the first canonical vector and the common information vector, and (iii) a second private vector based on the second canonical vector and the common information vector; compressing the first private vector at a first private rate to generate a first digital message; compressing the second private vector at a second private rate to generate a second digital message; computing an amount of common information included in the common information vector; based on the amount of common information, computing a third rate; compressing the common information vector at the third rate to generate a third digital message; routing the first digital message via a first channel, the second digital message via a second channel and the third digital message via a third channel.

2. The method of the previous aspect, further comprising obtaining a transmission quality requirement, and computing a rate region based at least in part on the obtained transmission quality requirement.

3. The method of any combination of the preceding aspects, wherein the transmission quality requirement includes a first distortion level, a first distortion function, a second distortion level, and a second distortion function, and computing the rate region includes: computing a lower bound for the first private rate by evaluating a first rate distortion function for a first average distortion not exceeding the first distortion level, and computing a lower bound for the second private rate by evaluating a second rate distortion function for a second average distortion not exceeding the second distortion level.

4. The method of any combination of the preceding aspects, wherein the transmission quality requirement further includes a Gray-Wyner lossy rate region.

5. The method of any combination of the preceding aspects, wherein computing the rate region further includes computing a lower bound for the sum of the first private rate, the second provide rate, and the common rate by evaluating a joint rate distortion function for a first average distortion not exceeding the first distortion level, and a second average distortion not exceeding the second distortion level.

6. The method of any combination of the preceding aspects, further comprising computing a lower bound for the first private rate, a lower bound for the second private rate, or a lower bound for a sum of the first private rate, the second private rate, and the third rate by evaluating one or more rate distortion functions using water filling techniques based on the canonical correlation coefficients of the two canonical vectors or the two data vectors, wherein computing the first private rate, the second private rate, or the third rate is at least in part based on the lower bound for the first private rate, the lower bound for the second private rate, or the lower bound for the sum.

7. The method of any combination of the preceding aspects, wherein: the rate region is a Gray-Wyner lossy rate region; the first private rate, the second private rate, and the third rate are in the Pangloss plane of the Gray-Wyner lossy rate region; and the third rate is a substantially prioritized minimum third rate such that a sum of the first private rate, the second private rate, and the third rate are equal to a joint rate distortion function for the first data vector and the second data vector.

8. The method of any combination of the preceding aspects, further comprising obtaining a covariance matrix for the first data vector and the second data vector, and generating, using the covariance matrix, a first nonsingular transformation matrix for the first data vector and a second nonsingular transformation matrix for the second data vector, wherein transforming the first data vector into the first canonical vector comprises multiplying the first data vector by the first transformation matrix, and transforming the second data vector into the second canonical vector comprises multiplying the second data vector by the second transformation matrix.

9. The method of any combination of the preceding aspects, wherein obtaining the covariance matrix comprises analyzing a difference between the first data vector and the second data vector to modify the covariance matrix.

10. The method of any combination of the preceding aspects, wherein computing the amount of common information comprises computing an amount of Wyner's common information and Wyner's lossy common information, and computing the third rate comprises prioritizing the third rate, and assigning to the third rate the computed amount of Wyner's common information, the computed amount of Wyner's lossy common information, or a minimum common rate on the Gray-Wyner rate region such that the sum of the first private rate, the second private rate, and the third rate are equal to a joint rate distortion function for the first data vector and the second data vector or for the first canonical vector and the second canonical vector.

11. The method of any combination of the preceding aspects, further comprising implementing one or more test channels, wherein compressing the first private vector, the second private vector, or the common information vector includes using at least one of the one or more test channels.

12. The method of any combination of the preceding aspects, wherein the one or more test channels are used to model the rate distortion function of the first private rate, the rate distortion of the second private rate, or the joint rate distortion function of the sum of the first private rate, the second private rate, and the third rate.

13. The method of any combination of the preceding aspects, wherein: the first canonical vector further comprises a third component; the second canonical vector further comprises a third component; the third component of the first canonical vector is substantially identical to the third component of the second canonical vector; and wherein generating the first private vector excludes the third component of the first canonical vector, and generating the second private vector excludes the third component of the second canonical vector.

14. The method of any combination of the preceding aspects, wherein generating the common information vector comprises generating the common information vector such that the common information vector includes the third component of the first canonical vector or the third component of the second canonical vector.

15. The method of any combination of the preceding aspects, wherein the first data vector and the second data vector have a different number of elements.

16. The method of any combination of the preceding aspects, wherein the first channel and the second channel are private channels and the third channel is a public channel.

17. The method of any combination of the preceding aspects, wherein routing the first digital message, routing the second digital message, and routing the third digital message comprises storing the first digital message at a first memory location, the second digital message at a second memory location, and the third digital message at a third memory location of one or more storage media.

18. The method of any combination of the preceding aspects, wherein the first memory location and the second memory location are secure memory locations of the one or more storage media and the third memory location is an unsecured memory location of the one or more storage media.

19. The method of any combination of the preceding aspects, further comprising obtaining a channel capacity of at least one of: i) the first channel, ii) the second channel, or iii) the third channel, and computing the first private rate, the second private rate, and the third rate based at least in part on the obtained channel capacity.

20. The method of any combination of the preceding aspects, further comprising determining that the first data vector and the second data vector are substantially representative of correlated Gaussian random variables, and generating the first private vector, the second private vector, and the common information vector in response to determining that the first data vector and the second data vector are substantially representative of correlated Gaussian random variables.

21. The method of any combination of the preceding aspects, wherein at least one of (i) the first channel, (ii) the second channel, or (iii) the third channel is a noisy channel comprising a multiple access channel, a broadcast channel, or an interference channel.

22. A non-transitory computer-readable medium storing instructions for compressively encoding two correlated data vectors, wherein the instructions, when executed by one or more processors of a computing system, cause the one or more processors to: obtain a first data vector and a second data vector; transform the first data vector into a first canonical vector, wherein the first canonical vector includes a first component indicative of information in the first data vector and information in the second data vector, and a second component indicative of information in the first data vector and substantially exclusive of information in the second data vector; transform the second data vector into a second canonical vector, wherein the second canonical vector includes a first component indicative of information in the first data vector and information in the second data vector, and a second component indicative of information in the second data vector and substantially exclusive of information in the first data vector; generate: (i) a common information vector based on the first component of the first canonical vector and the first component of the second canonical vector, (ii) a first private vector based on the first canonical vector and the common information vector, and (iii) a second private vector based on the second canonical vector and the common information vector; compress the first private vector at a first private rate to generate a first digital message; compress the second private vector at a second private rate to generate a second digital message; compute an amount of common information included in the common information vector; based on the amount of common information, compute a third rate; compress the common information vector at the third rate to generate a third digital message; route the first digital message via a first channel, the second digital message via a second channel and the third digital message via a third channel.

23. The non-transitory computer-readable medium of the previous aspect, wherein the instructions further cause the one or more processors to: obtain a transmission quality requirement, and compute a rate region based at least in part on the obtained transmission quality requirement.

24. The non-transitory computer-readable medium of any combination of the preceding aspects, wherein: the transmission quality requirement includes a first distortion level, a first distortion function, a second distortion level, and a second distortion function, and to compute the rate region, the instructions further cause the one or more processors to: compute a lower bound for the first private rate by evaluating a first rate distortion function for a first average distortion not exceeding the first distortion level, and compute a lower bound for the second private rate by evaluating a second rate distortion function for a second average distortion not exceeding the second distortion level.

25. The non-transitory computer-readable medium of any combination of the preceding aspects, wherein to compute the rate region, the instructions further cause the one or more processors to compute a lower bound for the sum of the first private rate, the second provide rate, and the common rate by evaluating a joint rate distortion function for the first average distortion not exceeding the first distortion level, and the second average distortion not exceeding the second distortion level.

26. The non-transitory computer-readable medium of any combination of the preceding aspects, wherein the instructions further cause the one or more processors to: compute a lower bound for a sum of the first private rate, the second private rate, and the third rate by evaluating one or more rate distortion functions using water filling techniques based on covariance or canonical correlation coefficients of the two canonical vectors or the two data vectors, and to compute the first private rate, the second private rate, or the third rate; wherein the instructions further cause the one or more processors to compute the first private rate, the second private rate, or the third rate at least in part based on the lower bound for the sum.

27. The non-transitory computer-readable medium of any combination of the preceding aspects, wherein the instructions further cause the one or more processors to obtain a covariance matrix for the first data vector and the second data vector, and generate, using the covariance matrix, a first nonsingular transformation matrix for the first data vector and a second nonsingular transformation matrix for the second data vector, wherein to transform the first data vector into the first canonical vector, the instructions further cause the one or more processors to multiply the first data vector by the first transformation matrix, and to transform the second data vector into the second canonical vector, the instructions further cause the one or more processors to multiply the second data vector by the second transformation matrix.

28. The non-transitory computer-readable medium of any combination of the preceding aspects, wherein to compute the amount of common information, the instructions further cause the one or more processors to compute an amount of Wyner's common information or Wyner's lossy common information, and to compute the third rate, the instructions further cause the one or more processors to compute the third rate based at least in part on the computed amount of Wyner's common information and Wyner's lossy common information.

What is claimed is:

1. A computer-implemented method of compressively encoding two correlated data vectors, the method comprising
obtaining a first data vector and a second data vector;
transforming the first data vector into a first canonical vector, wherein the first canonical vector includes:
 a first component indicative of information in the first data vector and information in the second data vector, and
 a second component indicative of information in the first data vector and substantially exclusive of information in the second data vector,
transforming the second data vector into a second canonical vector, wherein the second canonical vector includes:
 a first component indicative of information in the first data vector and information in the second data vector, and
 a second component indicative of information in the second data vector and substantially exclusive of information in the first data vector,
generating:
 (i) a common information vector based on the first component of the first canonical vector and the first component of the second canonical vector,
 (ii) a first private vector based on the first canonical vector and the common information vector, and
 (iii) a second private vector based on the second canonical vector and the common information vector;
compressing the first private vector at a first private rate to generate a first digital message;
compressing the second private vector at a second private rate to generate a second digital message;
computing an amount of common information included in the common information vector;
based on the amount of common information, computing a third rate;
compressing the common information vector at the third rate to generate a third digital message;
routing the first digital message via a first channel, the second digital message via a second channel and the third digital message via a third channel.

2. The method of claim 1, further comprising:
obtaining a transmission quality requirement, and
computing a rate region based at least in part on the obtained transmission quality requirement.

3. The method of claim 2, wherein:
the transmission quality requirement includes a first distortion level, a first distortion function, a second distortion level, and a second distortion function, and
computing the rate region includes:
 computing a lower bound for the first private rate by evaluating a first rate distortion function for a first average distortion not exceeding the first distortion level, and
 computing a lower bound for the second private rate by evaluating a second rate distortion function for a second average distortion not exceeding the second distortion level.

4. The method of claim 3, wherein the transmission quality requirement further includes a Gray-Wyner lossy rate region.

5. The method of claim 3, wherein:
computing the rate region further includes computing a lower bound for the sum of the first private rate, the second provide rate, and the common rate by evaluating a joint rate distortion function for a first average distortion not exceeding the first distortion level, and a second average distortion not exceeding the second distortion level.

6. The method of claim 3, further comprising:
computing a lower bound for the first private rate, a lower bound for the second private rate, or a lower bound for a sum of the first private rate, the second private rate, and the third rate by evaluating one or more rate distortion functions using water filling techniques based on the canonical correlation coefficients of the two canonical vectors or the two data vectors,
wherein:
computing the first private rate, the second private rate, or the third rate is at least in part based on the lower bound for the first private rate, the lower bound for the second private rate, or the lower bound for the sum.

7. The method of claim 2, wherein:
the rate region is a Gray-Wyner lossy rate region,
the first private rate, the second private rate, and the third rate are in the Pangloss plane of the Gray-Wyner lossy rate region, and
the third rate is a substantially prioritized minimum third rate such that a sum of the first private rate, the second private rate, and the third rate are equal to a joint rate distortion function for the first data vector and the second data vector.

8. The method of claim 1, further comprising:
obtaining a covariance matrix for the first data vector and the second data vector, and
generating, using the covariance matrix, a first nonsingular transformation matrix for the first data vector and a second nonsingular transformation matrix for the second data vector,
wherein:
transforming the first data vector into the first canonical vector comprises multiplying the first data vector by the first transformation matrix, and
transforming the second data vector into the second canonical vector comprises multiplying the second data vector by the second transformation matrix.

9. The method of claim 8, wherein obtaining the covariance matrix comprises:
analyzing a difference between the first data vector and the second data vector to modify the covariance matrix.

10. The method of claim 1, wherein:
computing the amount of common information comprises computing an amount of Wyner's common information and Wyner's lossy common information, and
computing the third rate comprises assigning to the third rate the computed amount of Wyner's common information, the computed amount of Wyner's lossy common information, or a minimum common rate on the Gray-Wyner rate region such that the sum of the first private rate, the second private rate, and the third rate are equal to a joint rate distortion function for the first data vector and the second data vector or for the first canonical vector and the second canonical vector.

11. The method of claim 1, further comprising:
implementing one or more test channels,
wherein:
compressing the first private vector, the second private vector, or the common information vector includes using at least one of the one or more test channels.

12. The method of claim 11, wherein:
the one or more test channels are used to model the rate distortion function of the first private rate, the rate distortion of the second private rate, or the joint rate distortion function of the sum of the first private rate, the second private rate, and the third rate.

13. The method of claim 1, wherein:
the first canonical vector further comprises a third component;
the second canonical vector further comprises a third component;
the third component of the first canonical vector is substantially identical to the third component of the second canonical vector; and
wherein:
generating the first private vector excludes the third component of the first canonical vector, and
generating the second private vector excludes the third component of the second canonical vector.

14. The method of claim 13, wherein generating the common information vector comprises:
generating the common information vector such that the common information vector includes the third component of the first canonical vector or the third component of the second canonical vector.

15. The method of claim 1, wherein the first data vector and the second data vector have a different number of elements.

16. The method of claim 1, wherein the first channel and the second channel are private channels and the third channel is a public channel.

17. The method of claim 1, wherein routing the first digital message, routing the second digital message and routing the third digital message comprises:
storing the first digital message at a first memory location, the second digital message at a second memory location, and the third digital message at a third memory location of one or more storage media.

18. The method of claim 17, wherein:
the first memory location and the second memory location are secure memory locations of the one or more storage media and the third memory location is an unsecured memory location of the one or more storage media.

19. The method of claim 1, further comprising:
obtaining a channel capacity of at least one of: i) the first channel, ii) the second channel, or iii) the third channel, and
computing the first private rate, the second private rate, and the third rate based at least in part on the obtained channel capacity.

20. The method of claim 1, further comprising
determining that the first data vector and the second data vector are substantially representative of correlated Gaussian random variables, and
generating the first private vector, the second private vector, and the common information vector in response to determining that the first data vector and the second data vector are substantially representative of correlated Gaussian random variables.

21. The method of claim 1, wherein:
at least one of (i) the first channel (ii) the second channel, or (iii) the third channel is a noisy channel comprising a multiple access channel, a broadcast channel, or an interference channel.

22. A non-transitory computer-readable medium storing instructions for compressively encoding two correlated data vectors, wherein the instructions, when executed by one or more processors of a computing system, cause the one or more processors to:
obtain a first data vector and a second data vector;
transform the first data vector into a first canonical vector, wherein the first canonical vector includes:
a first component indicative of information in the first data vector and information in the second data vector, and
a second component indicative of information in the first data vector and substantially exclusive of information in the second data vector,
transform the second data vector into a second canonical vector, wherein the second canonical vector includes:
a first component indicative of information in the first data vector and information in the second data vector, and
a second component indicative of information in the second data vector and substantially exclusive of information in the first data vector,
generate:
(i) a common information vector based on the first component of the first canonical vector and the first component of the second canonical vector,
(ii) a first private vector based on the first canonical vector and the common information vector, and
(iii) a second private vector based on the second canonical vector and the common information vector;
compress the first private vector at a first private rate to generate a first digital message;
compress the second private vector at a second private rate to generate a second digital message;
compute an amount of common information included in the common information vector;
based on the amount of common information, compute a third rate;
compress the common information vector at the third rate to generate a third digital message;
route the first digital message via a first channel, the second digital message via a second channel and the third digital message via a third channel.

23. The non-transitory computer-readable medium of claim 22, wherein the instructions further cause the one or more processors to:
obtain a transmission quality requirement, and
compute a rate region based at least in part on the obtained transmission quality requirement.

24. The non-transitory computer-readable medium of claim 23, wherein:
the transmission quality requirement includes a first distortion level, a first distortion function, a second distortion level, and a second distortion function, and
to compute the rate region, the instructions further cause the one or more processors to:
compute a lower bound for the first private rate by evaluating a first rate distortion function for a first average distortion not exceeding the first distortion level, and compute a lower bound for the second private rate by evaluating a second rate distortion function for a second average distortion not exceeding the second distortion level.

25. The non-transitory computer-readable medium of claim 24, wherein to compute the rate region, the instructions further cause the one or more processors to:
compute a lower bound for a sum of the first private rate, the second provide rate, and the common rate by evaluating a joint rate distortion function for the first average distortion not exceeding the first distortion level, and the second average distortion not exceeding the second distortion level.

26. The non-transitory computer-readable medium of claim 24, wherein the instructions further cause the one or more processors to:
compute a lower bound for a sum of the first private rate, the second private rate, and the third rate by evaluating one or more rate distortion functions using water filling techniques based on covariance or canonical correlation coefficients of the two canonical vectors or the two data vectors, and
to compute the first private rate, the second private rate, or the third rate, the instructions further cause the one or more processors to compute the first private rate, the second private rate, or the third rate at least in part based on the lower bound for the sum.

27. The non-transitory computer-readable medium of claim 22, wherein the instructions further cause the one or more processors to:
obtain a covariance matrix for the first data vector and the second data vector, and
generate, using the covariance matrix, a first nonsingular transformation matrix for the first data vector and a second nonsingular transformation matrix for the second data vector,
wherein:
to transform the first data vector into the first canonical vector, the instructions further cause the one or more processors to multiply the first data vector by the first nonsingular transformation matrix, and
to transform the second data vector into the second canonical vector, the instructions further cause the one or more processors to multiply the second data vector by the second nonsingular transformation matrix.

28. The non-transitory computer-readable medium of claim 22, wherein:
to compute the amount of common information, the instructions further cause the one or more processors to compute an amount of Wyner's common information or Wyner's lossy common information, and
to compute the third rate, the instructions further cause the one or more processors to compute the third rate based at least in part on the computed amount of Wyner's common information and Wyner's lossy common information.

* * * * *